(12) United States Patent
Kusunoki et al.

(10) Patent No.: US 12,288,799 B2
(45) Date of Patent: Apr. 29, 2025

(54) DISPLAY DEVICE, DISPLAY MODULE, ELECTRONIC DEVICE, AND MANUFACTURING METHOD OF DISPLAY DEVICE

(71) Applicant: Semiconductor Energy Laboratory Co., Ltd., Atsugi (JP)

(72) Inventors: Koji Kusunoki, Isehara (JP); Shingo Eguchi, Atsugi (JP); Takayuki Ikeda, Atsugi (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 18/224,152

(22) Filed: Jul. 20, 2023

(65) Prior Publication Data

US 2023/0369381 A1 Nov. 16, 2023

Related U.S. Application Data

(63) Continuation of application No. 16/896,521, filed on Jun. 9, 2020, now Pat. No. 11,710,760.

(30) Foreign Application Priority Data

Jun. 21, 2019 (JP) .................................. 2019-115298

(51) Int. Cl.
*H01L 27/15* (2006.01)
*H01L 29/66* (2006.01)
(Continued)

(52) U.S. Cl.
CPC ...... *H01L 27/153* (2013.01); *H01L 29/66969* (2013.01); *H01L 29/7869* (2013.01);
(Continued)

(58) Field of Classification Search
None
See application file for complete search history.

(56) References Cited

U.S. PATENT DOCUMENTS 6,252,248 B1 * 6/2001 Sano ................. H01L 29/78648
257/350
9,280,931 B2  3/2016 Kimura
(Continued)

FOREIGN PATENT DOCUMENTS

CN   109273436 A   1/2019
EP     3328162 A   5/2018
(Continued)

OTHER PUBLICATIONS

Kundu.S et al., "Modeling Manufacturing Process Variation for Design and Test", 2011 Design, Automation & Test in Europe, Mar. 14-18, 2011.

*Primary Examiner* — Vincent Wall
(74) *Attorney, Agent, or Firm* — Eric J. Robinson; Robinson Intellectual Property Law Office, P.C.

(57) ABSTRACT

One embodiment of the present invention is a display device including a first insulating layer, a second insulating layer, a first transistor, a second transistor, a first light-emitting diode, a second light-emitting diode, and a color conversion layer. The first insulating layer is over the first transistor and the second transistor. The first light-emitting diode and the second light-emitting diode are over the first insulating layer. The color conversion layer is over the second light-emitting diode. The color conversion layer is configured to convert light emitted from the second light-emitting diode into a light having a longer wavelength. The first transistor and the second transistor each include a metal oxide layer and a gate electrode. The metal oxide layer includes a channel formation region. A top surface of the gate electrode
(Continued)

is level or substantially level with a top surface of the second insulating layer.

11 Claims, 18 Drawing Sheets

(51) Int. Cl.
*H01L 29/786* (2006.01)
*H01L 33/50* (2010.01)
*H01L 33/62* (2010.01)

(52) U.S. Cl.
CPC ............ *H01L 33/505* (2013.01); *H01L 33/62* (2013.01); *H01L 2933/0041* (2013.01); *H01L 2933/0066* (2013.01)

(56) References Cited

U.S. PATENT DOCUMENTS

| | | | |
|---|---|---|---|
| 9,865,712 B2 | 1/2018 | Okamoto et al. | |
| 9,887,184 B2 | 2/2018 | Takeya et al. | |
| 9,954,112 B2 | 4/2018 | Asami et al. | |
| 10,056,413 B2 | 8/2018 | Kimura | |
| 10,062,675 B2 | 8/2018 | Chang et al. | |
| 10,090,335 B2* | 10/2018 | Kang | H01L 33/486 |
| 10,193,042 B1 | 1/2019 | Tsai et al. | |
| 10,312,225 B2 | 6/2019 | Takeya et al. | |
| 10,446,671 B2 | 10/2019 | Okamoto et al. | |
| 10,468,394 B1 | 11/2019 | Xi et al. | |
| 10,607,973 B2 | 3/2020 | Chang et al. | |
| 10,615,189 B2 | 4/2020 | Kimura | |
| 10,784,241 B2 | 9/2020 | Chang et al. | |
| 10,833,057 B2 | 11/2020 | Takeya et al. | |
| 10,879,381 B2 | 12/2020 | Okamoto et al. | |
| 10,984,703 B2 | 4/2021 | Iwaki et al. | |
| 11,217,624 B2* | 1/2022 | Kim | H01L 33/44 |
| 11,222,583 B2 | 1/2022 | Takahashi et al. | |
| 11,245,039 B2 | 2/2022 | Asami et al. | |
| 11,417,640 B2 | 8/2022 | Takeya et al. | |
| 11,489,065 B2 | 11/2022 | Okamoto et al. | |
| 11,508,708 B2 | 11/2022 | Onuma et al. | |
| 11,587,957 B2 | 2/2023 | Kimura | |
| 11,817,440 B2 | 11/2023 | Takeya et al. | |
| 11,848,316 B2 | 12/2023 | Takeya et al. | |
| 12,007,647 B2* | 6/2024 | Jang | G02F 1/133553 |
| 2006/0163683 A1 | 7/2006 | Roth et al. | |
| 2010/0038641 A1* | 2/2010 | Imai | H01L 29/7869 257/E29.29 |
| 2013/0092930 A1 | 4/2013 | Kimura | |
| 2014/0306260 A1* | 10/2014 | Yamazaki | H10K 59/40 257/99 |
| 2014/0367705 A1* | 12/2014 | Bibl | H01L 33/44 438/27 |
| 2015/0014716 A1 | 1/2015 | von Malm | |
| 2015/0349285 A1 | 12/2015 | Seo et al. | |
| 2016/0218219 A1* | 7/2016 | Asami | C23C 16/40 |
| 2016/0260822 A1 | 9/2016 | Okamoto | H01L 29/24 |
| 2016/0372514 A1* | 12/2016 | Chang | H01L 27/1259 |
| 2017/0062749 A1 | 3/2017 | Seo et al. | |
| 2017/0090246 A1 | 3/2017 | Seo et al. | |
| 2018/0019233 A1 | 1/2018 | Chang et al. | |
| 2018/0059485 A1* | 3/2018 | Nam | G02F 1/133602 |
| 2018/0095559 A1* | 4/2018 | Yamazaki | G02F 1/133553 |
| 2018/0122836 A1* | 5/2018 | Kang | H01L 27/1248 |
| 2018/0248043 A1 | 8/2018 | Asami et al. | |
| 2019/0058092 A1* | 2/2019 | Oyamada | H01L 33/504 |
| 2019/0181301 A1 | 6/2019 | Kim | H01L 33/44 |
| 2019/0194537 A1 | 6/2019 | Sekiguchi et al. | |
| 2019/0214376 A1 | 7/2019 | Kim | |
| 2019/0302917 A1* | 10/2019 | Pan | H01L 27/1266 |
| 2019/0371779 A1* | 12/2019 | Yeon | H01L 25/18 |
| 2020/0006688 A1 | 1/2020 | Seo et al. | |
| 2020/0075814 A1* | 3/2020 | Park | H01L 25/0753 |
| 2020/0235084 A1* | 7/2020 | Wu | H01L 25/0753 |
| 2020/0411490 A1* | 12/2020 | Ahmed | H01L 33/44 |
| 2021/0050500 A1 | 2/2021 | Kusunoki et al. | |
| 2021/0091275 A1* | 3/2021 | Chen | H01L 33/50 |
| 2021/0118855 A1 | 4/2021 | Kusunoki et al. | |
| 2021/0126045 A1* | 4/2021 | Yeon | H01L 33/505 |
| 2021/0217805 A1* | 7/2021 | Kusunoki | H01L 33/005 |
| 2021/0296543 A1 | 9/2021 | Aoyama et al. | |
| 2021/0327865 A1* | 10/2021 | Yamazaki | G09F 9/00 |
| 2022/0005790 A1 | 1/2022 | Watanabe et al. | |
| 2022/0045039 A1 | 2/2022 | Tsukamoto et al. | |
| 2022/0199831 A1 | 6/2022 | Asami et al. | |
| 2023/0014711 A1 | 1/2023 | Okamoto et al. | |
| 2023/0317741 A1 | 10/2023 | Kimura | |
| 2023/0387098 A1 | 11/2023 | Takeya et al. | |

FOREIGN PATENT DOCUMENTS

| | | |
|---|---|---|
| EP | 3487266 A | 5/2019 |
| EP | 3790361 A | 3/2021 |
| EP | 4178317 A | 5/2023 |
| JP | 2013-137509 A | 7/2013 |
| JP | 2016-167584 A | 9/2016 |
| JP | 2016-174143 A | 9/2016 |
| JP | 2018-014475 A | 1/2018 |
| JP | 2018-523848 | 8/2018 |
| WO | WO-2013/058199 | 4/2013 |
| WO | WO-2016/120741 | 8/2016 |
| WO | WO-2016/139548 | 9/2016 |
| WO | WO-2019/031183 | 2/2019 |

* cited by examiner

FIG. 13A
| Amorphous | Intermediate state<br>New crystalline phase<br>Crystalline | Crystal |
|---|---|---|
| •completely amorphous | •CAAC<br>•nc<br>•CAC<br>excluding single crystal and poly crystal | •single crystal<br>•poly crystal |
FIG. 13B
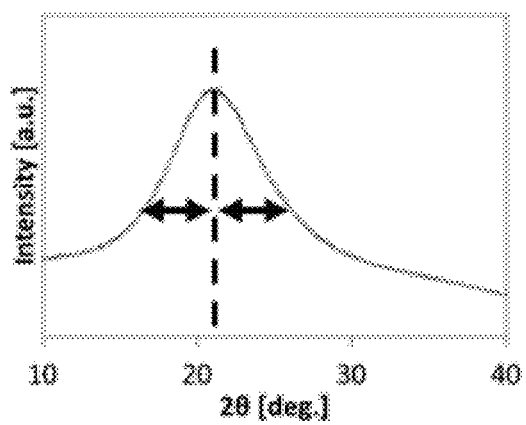
FIG. 13C
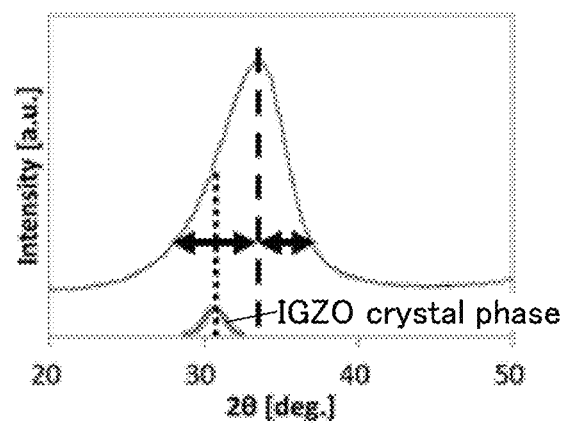
FIG. 13D
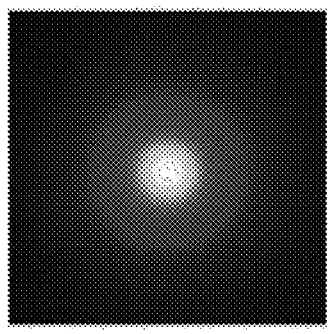
FIG. 13E
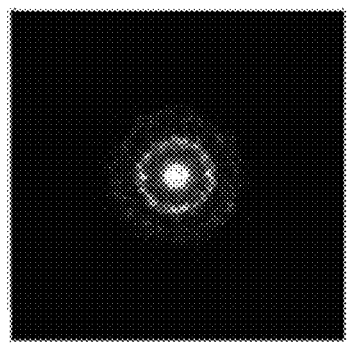

DISPLAY DEVICE, DISPLAY MODULE, ELECTRONIC DEVICE, AND MANUFACTURING METHOD OF DISPLAY DEVICE

BACKGROUND OF THE INVENTION

1. Field of the Invention

One embodiment of the present invention relates to a display device, a display module, an electronic device, and a manufacturing method thereof.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

2. Description of the Related Art

In recent years, a display device including a micro light-emitting diode (micro LED) as a display element has been proposed (e.g., Patent Document 1). The display device including micro LEDs as display elements has advantages of high luminance, high contrast, a long lifetime, and the like, and has been actively developed as a next-generation display device.

REFERENCE

Patent Document

[Patent Document 1] United States Patent Application Publication No. 2014/0367705

SUMMARY OF THE INVENTION

The time taken to mount LED chips on a display device including micro LEDs as display elements is extremely long, so that manufacturing cost reduction is needed.

In a pick-and-place method, for example, red (R), green (G), and blue (B) LEDs are formed on respective wafers, and the LEDs are cut out one by one and mounted on a circuit board. Therefore, as the number of pixels of the display device increases, the number of LEDs to be mounted increases and thus the time taken for mounting becomes longer. Moreover, as the resolution of the display device becomes higher, it becomes more difficult to mount LEDs.

An object of one embodiment of the present invention is to provide a display device with high resolution. Another object of one embodiment of the present invention is to provide a display device with high display quality. Another object of one embodiment of the present invention is to provide a display device with low power consumption. Another object of one embodiment of the present invention is to provide a highly reliable display device.

Another object of one embodiment of the present invention is to reduce manufacturing cost of a display device including micro LEDs as display elements. Another object of one embodiment of the present invention is to manufacture a display device including micro LEDs as display elements with a high yield.

Note that the description of these objects does not preclude the existence of other objects. One embodiment of the present invention does not need to achieve all the objects. Other objects can be derived from the descriptions of the specification, the drawings, and the claims.

One embodiment of the present invention is a display device including a first insulating layer, a second insulating layer, a first transistor, a second transistor, a first light-emitting diode, a second light-emitting diode, and a color conversion layer. The first transistor is electrically connected to the first light-emitting diode. The second transistor is electrically connected to the second light-emitting diode. The first insulating layer is over the first transistor and the second transistor. The first light-emitting diode and the second light-emitting diode are over the first insulating layer. The color conversion layer is over the second light-emitting diode. The color conversion layer is configured to convert light emitted from the second light-emitting diode into a light having a longer wavelength. The first transistor and the second transistor each include a metal oxide layer and a gate electrode. The metal oxide layer includes a channel formation region. A top surface of the gate electrode is level or substantially level with a top surface of the second insulating layer.

The first transistor preferably further includes a gate insulating layer, a first conductive layer, and a second conductive layer. The metal oxide layer includes a first region overlapping with the first conductive layer, a second region overlapping with the second conductive layer, and a third region between the first region and the second region. The first conductive layer and the second conductive layer are apart from each other over the metal oxide layer. The second insulating layer is over the first conductive layer and the second conductive layer. The second insulating layer includes an opening overlapping with the third region. The gate insulating layer is inside the opening and overlaps with a side surface of the second insulating layer and a top surface of the third region. The gate electrode is inside the opening and overlaps with the side surface of the second insulating layer and the top surface of the third region with the gate insulating layer therebetween.

A display device including a first insulating layer, a second insulating layer, a first conductive layer, a second conductive layer, a first transistor, a second transistor, a first light-emitting diode, a second light-emitting diode, and a color conversion layer. The first transistor is electrically connected to the first light-emitting diode through the first conductive layer. The second transistor is electrically connected to the second light-emitting diode through the second conductive layer. The first insulating layer is over the first transistor and the second transistor. The first light-emitting diode and the second light-emitting diode are over the first insulating layer. The first light-emitting diode includes a first electrode in contact with the first conductive layer. The second light-emitting diode includes a second electrode in contact with the second conductive layer. A top surface of the first electrode and a top surface of the second electrode are level or substantially level with a top surface of the second insulating layer. The color conversion layer is over the second light-emitting diode. The color conversion layer is configured to convert light emitted from the second light-emitting diode into a light having a longer wavelength. The first transistor and the second transistor each include a metal oxide layer, and the metal oxide layer includes a channel formation region.

The color conversion layer is preferably in contact with the second light-emitting diode. The display device of one embodiment of the present invention preferably further including a third insulating layer between the second light-emitting diode and the color conversion layer, and the color conversion layer is preferably in contact with the third insulating layer.

The first light-emitting diode and the second light-emitting diode are preferably each a micro light-emitting diode.

The first light-emitting diode and the second light-emitting diode each preferably emit blue light.

The first transistor and the second transistor are preferably different from each other in one or both of a channel length and a channel width.

The display device of one embodiment of the present invention preferably further includes a driver circuit and a fourth insulating layer. It is preferable that the driver circuit include a circuit transistor, the circuit transistor include a channel formation region in a semiconductor substrate, and the semiconductor substrate overlap with the first transistor, the second transistor, the first light-emitting diode, and the second light-emitting diode with the fourth insulating layer therebetween.

The display device of one embodiment of the present invention preferably further includes a coloring layer over the color conversion layer. In this case, the light emitted from the second light-emitting diode is preferably extracted to the outside of the display device through the color conversion layer and the coloring layer.

One embodiment of the present invention is a module including a display device having any of the above structures. The module is provided with a connector such as a flexible printed circuit (hereinafter referred to as an FPC) or a tape carrier package (TCP) or is mounted with an integrated circuit (IC) by a chip on glass (COG) method, a chip on film (COF) method, or the like.

One embodiment of the present invention is an electronic device including the above-described display module and at least one of an antenna, a battery, a housing, a camera, a speaker, a microphone, and an operation button.

One embodiment of the present invention is a manufacturing method of a display device, including steps of forming a plurality of transistors in a matrix over a first substrate, forming a plurality of light-emitting diodes in a matrix over a second substrate, forming a first conductor electrically connected to at least one of the plurality of transistors or at least one of the plurality of light-emitting diodes over the first substrate or the second substrate, bonding the first substrate and the second substrate with the first conductor therebetween so that at least one of the plurality of transistors and at least one of the plurality of light-emitting diodes are electrically connected to each other, exposing a first surface by separating the second substrate, and forming a color conversion layer over the first surface. The color conversion layer overlaps with at least one of the plurality of light-emitting diodes, and planarization treatment is performed at least once in formation process of the plurality of transistors. At least one of the plurality of light-emitting diodes is preferably a micro light-emitting diode. At least one of the plurality of transistors preferably includes a metal oxide in a channel formation region.

According to one embodiment of the present invention, a display device with high resolution can be provided. According to one embodiment of the present invention, a display device with high display quality can be provided. According to one embodiment of the present invention, a display device with low power consumption can be provided. According to one embodiment of the present invention is to provide a highly reliable display device can be provided.

According to one embodiment of the present invention, manufacturing cost of a display device including micro LEDs as display elements can be reduced. According to another embodiment of the present invention, a display device including micro LEDs as display elements with a high yield can be manufactured.

Note that the description of these effects does not preclude the existence of other effects. One embodiment of the present invention does not need to achieve all the effects. Other effects can be derived from the descriptions of the specification, the drawings, and the claims.

BRIEF DESCRIPTION OF THE DRAWINGS

In the accompanying drawings:

FIGS. 13A, 13B, 13C, 13D, and 13E illustrate the classification of the crystal structures of IGZO, an XRD spectrum of a quartz glass substrate, an XRD spectrum of a crystalline IGZO film, a nanobeam electron diffraction pattern of the quartz glass substrate, and a nanobeam electron diffraction pattern of the crystalline IGZO film, respectively;

DETAILED DESCRIPTION OF THE INVENTION

Figure 1:
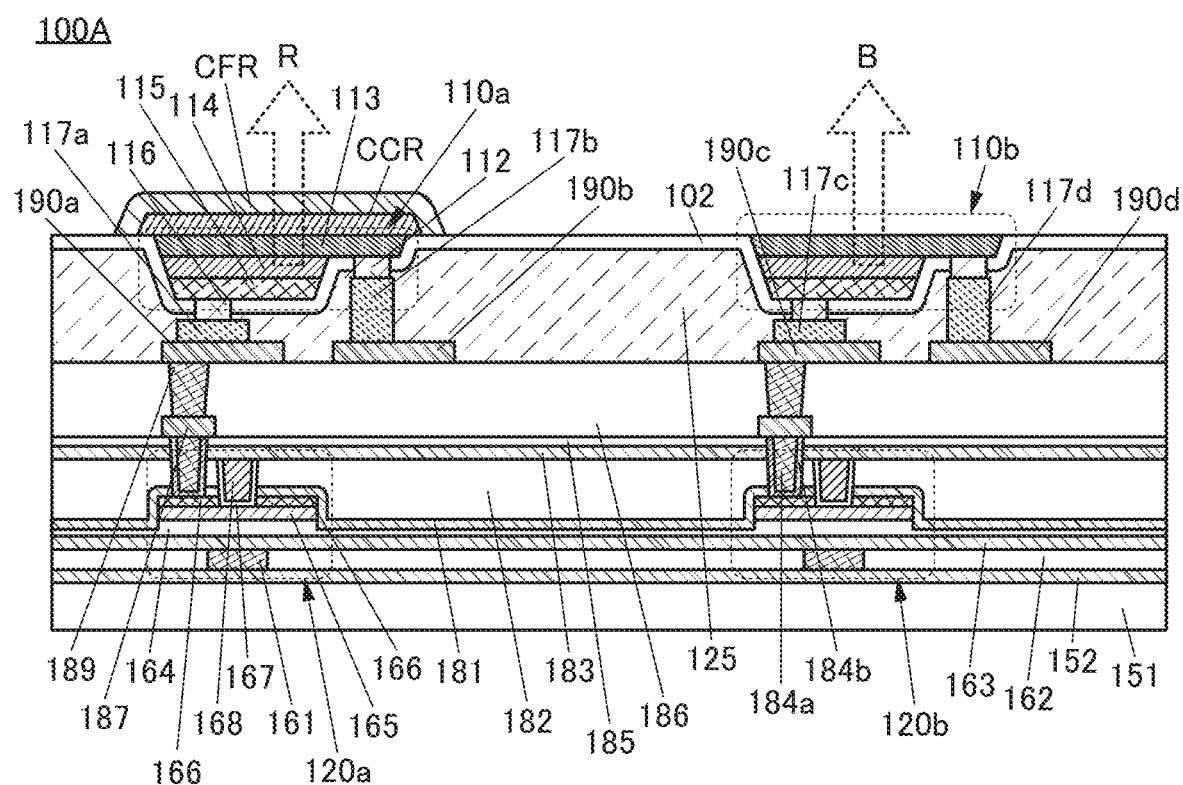
FIG. 1 shows an example of a display device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention.

Therefore, the present invention should not be construed as being limited to the description in the following embodiments.

Note that in the structures of the invention described below, the same portions or portions having similar functions are denoted by the same reference numerals in different drawings, and description of such portions is not repeated. The same hatching pattern is used for portions having similar functions, and the portions are not denoted by specific reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the terms "film" and "layer" can be used interchangeably depending on the case or the circumstances. For example, the term "conductive layer" can be changed into the term "conductive film". As another example, the term "insulating film" can be changed into the term "insulating layer".

Embodiment 1

In this embodiment, a display device of one embodiment of the present invention will be described with reference to FIG. 1, FIGS. 2A to 2C, FIGS. 3A and 3B, FIGS. 4A and 4B, FIGS. 5A and 5B, FIG. 6, FIGS. 7A and 7B, FIGS. 8A and 8B, and FIGS. 9A and 9B.

Summary of Display Device

The display device of this embodiment includes a plurality of light-emitting diodes that are display elements, and a plurality of transistors for driving the display elements.

In the display device of this embodiment, pixels for different colors include light-emitting diodes that emit light of the same color. In the case of using blue light-emitting diodes, for example, blue light emitted from the light-emitting diode in a blue pixel is extracted to the outside of the display device. Blue light emitted from the light-emitting diode in a pixel of a color other than blue, such as red or green, is converted by a color conversion layer into light having a longer wavelength than the blue light, and the light is extracted to the outside of the display device.

In manufacturing a display device in which pixels for different colors include light-emitting diodes that emit light of the same color, only one kind of a light-emitting diode is formed over a substrate; thus, a manufacturing apparatus and manufacturing process can be simplified compared to the case where a plurality of kinds of light-emitting diodes are formed. Accordingly, the difficulty in mounting a light-emitting diode on a circuit board can be lowered. In addition, the difficulty in mounting a transistor and a light-emitting diode on one substrate can be lowered.

The display device of one embodiment of the present invention is manufactured in such a manner that a plurality of transistors and a plurality of light-emitting diodes, which are formed over different substrates, are bonded to each other, the substrate over which the plurality of light-emitting diodes are formed is separated, and a color conversion layer is provided over a surface exposed by the separation so as to overlap with the light-emitting diodes.

In a manufacturing method of the display device of one embodiment of the present invention, a plurality of light-emitting diodes and a plurality of transistors are bonded to each other at a time, so that the manufacturing time of the display device can be shortened compared to the case of employing a method in which light-emitting diodes are mounted on a circuit board one by one. Moreover, even in the case of manufacturing a display device with a large number of pixels or a high-resolution display device, manufacturing difficulty can be lowered.

The display device of this embodiment has a function of displaying an image with the use of a light-emitting diode. In the case where a light-emitting diode, which is a self-luminous element, is used as a display element, a backlight is unnecessary and a polarizing plate is not necessarily provided in the display device. Therefore, the display device can have reduced power consumption and can be thin and lightweight. The display device including a light-emitting diode as a display element has high contrast and a wide viewing angle; thus, high display quality can be obtained. Furthermore, with the use of an inorganic material as a light-emitting material, the display device can have a long lifetime and improved reliability.

In this embodiment, in particular, an example in which a micro LED is used as a light-emitting diode is described. A micro LED having a double heterojunction is described in this embodiment. Note that there is no particular limitation on the light-emitting diode, and for example, a micro LED having a quantum well junction or a nanocolumn LED may be used.

The area of a light-emitting region of the light-emitting diode is preferably less than or equal to 1 $mm^2$, further preferably less than or equal to 10000 $\mu m^2$, still further preferably less than or equal to 3000 $\mu m^2$, even further preferably less than or equal to 700 $\mu m^2$. Note that in this specification and the like, a light-emitting diode including a light-emitting region whose area is less than or equal to 10000 $\mu m^2$ is referred to as a micro LED in some cases.

The transistor included in the display device preferably includes a metal oxide in a channel formation region. A transistor including a metal oxide consumes less power. Thus, a combination with a micro LED can achieve a display device with extremely reduced power consumption.

In particular, the display device of this embodiment preferably includes a transistor in which the top surfaces of a gate electrode and an insulating layer are level or substantially level with each other. By planarization treatment employing a chemical mechanical polishing (CMP) method or the like, for example, the top surfaces of the gate electrode and the insulating layer are planarized, whereby the top surfaces become level with each other.

A transistor with such a structure can be easily reduced in size. When the size of a transistor is reduced, the size of a pixel can be reduced, so that the resolution of a display device can be increased.

The display device of this embodiment can be manufactured with a high resolution, and thus can be favorably used for an electronic device having a relatively small display portion. Examples of such an electronic device include a watch-type or bracelet-type information terminal device (wearable device) and a wearable device capable of being worn on a head, such as a virtual reality (VR) device such as a head mounted display, a glasses-type augmented reality (AR) device, and a mixed reality (MR) device.

Structure Example 1 of Display Device

FIG. 1 is a cross-sectional view of a display device 100A. FIGS. 2A to 2C, FIGS. 3A and 3B, and FIGS. 4A and 4B are cross-sectional views illustrating a method for manufacturing the display device 100A.

In this embodiment, an example is described in which a light-emitting diode 110a and a light-emitting diode 110b are provided in a red pixel and a blue pixel, respectively.

The light-emitting diodes 110a and 110b have the same structure and emit light of the same color. In this embodiment, the case where the light-emitting diodes 110a and 110b emit blue light will be described as an example.

As illustrated in FIG. 1, light emitted from the light-emitting diode 110a in the red pixel is converted from blue light into red light by a color conversion layer CCR, the purity of the red light is improved by a coloring layer CFR, and the red light is emitted to the outside of the display device 100A.

Similarly, although not illustrated, light emitted from a light-emitting diode in a green pixel is converted from blue light into green light by a color conversion layer, the purity of the green light is improved by a green coloring layer, and the green light is emitted to the outside of the display device 100A.

In contrast, light emitted from the light-emitting diode 110b in the blue pixel is emitted to the outside of the display device 100A without passing through a color conversion layer.

Figure 2A:
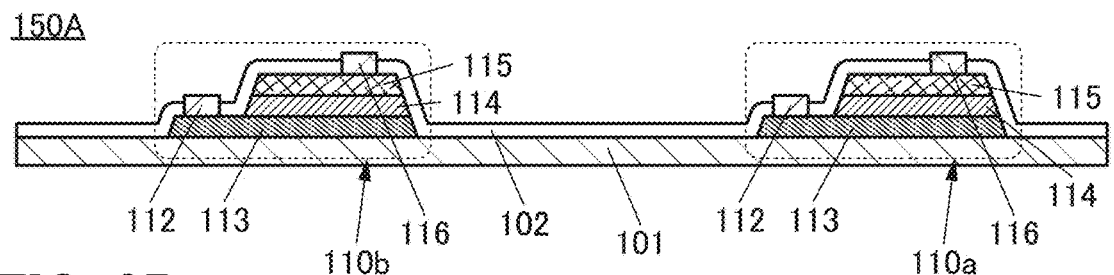
FIGS. 2A to 2C show an example of a method for manufacturing a display device.
Figure 2B:
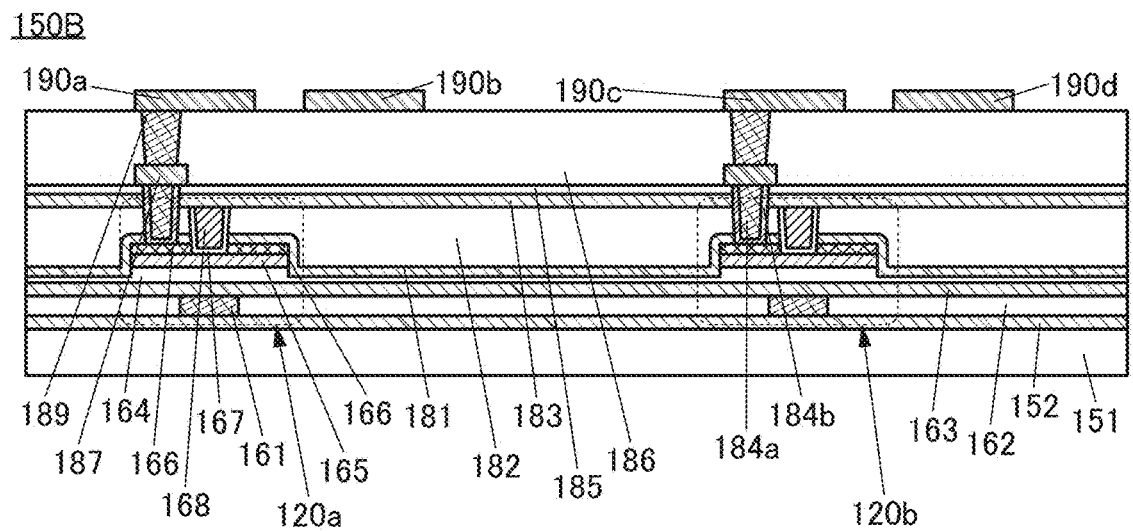
Figure 3A:
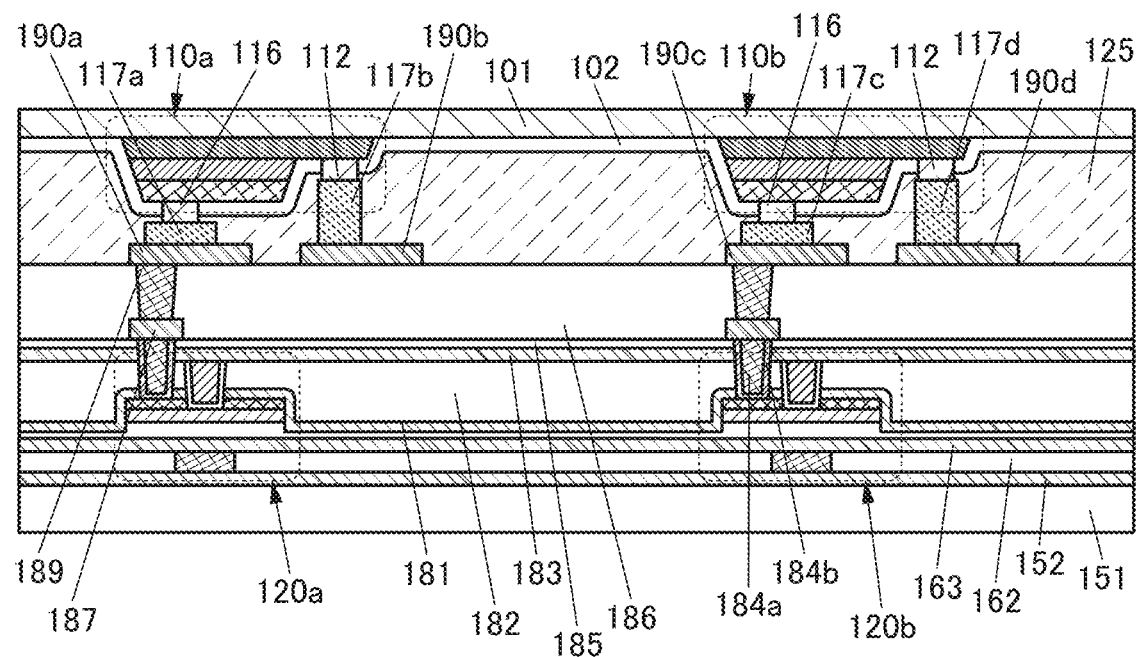
FIGS. 3A and 3B show an example of a method for manufacturing a display device.
Figure 3B:
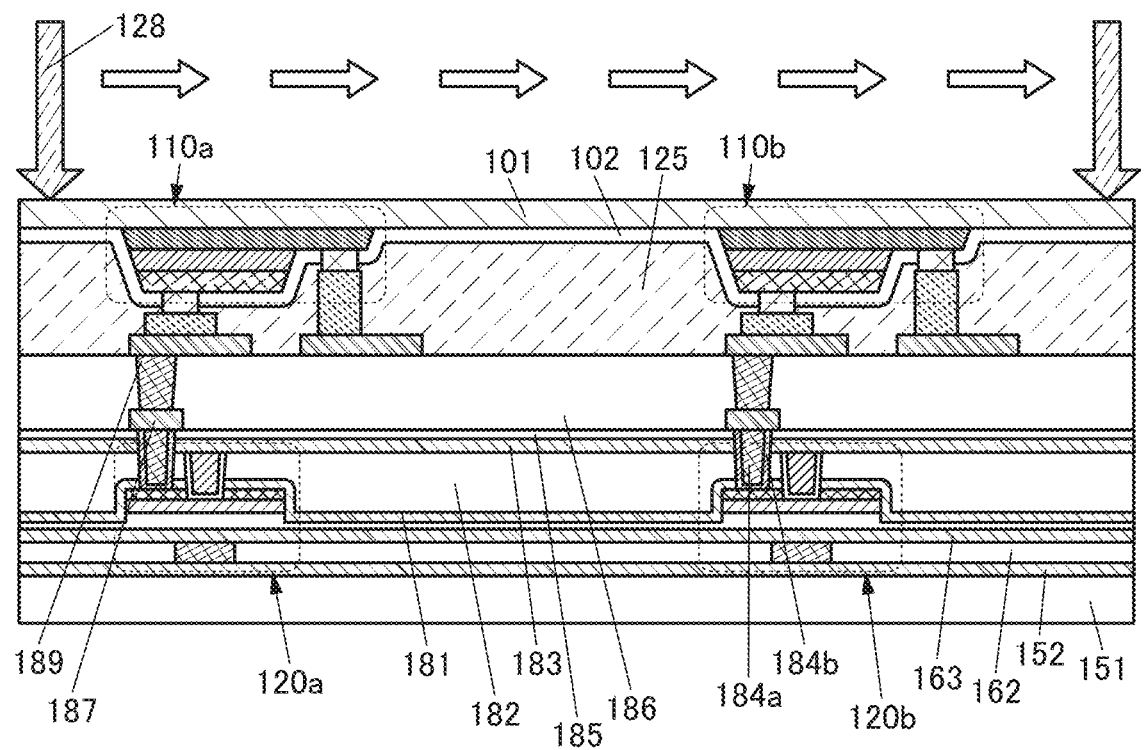
Figure 4A:
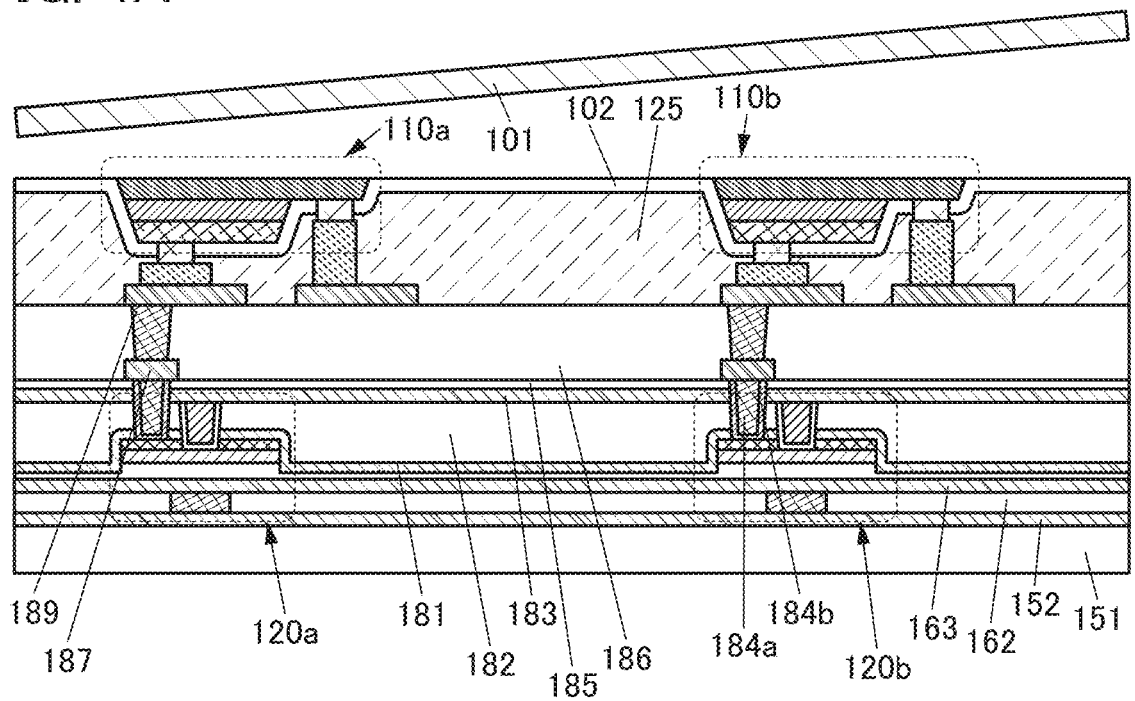
FIGS. 4A and 4B show an example of a method for manufacturing a display device.
Figure 4B:
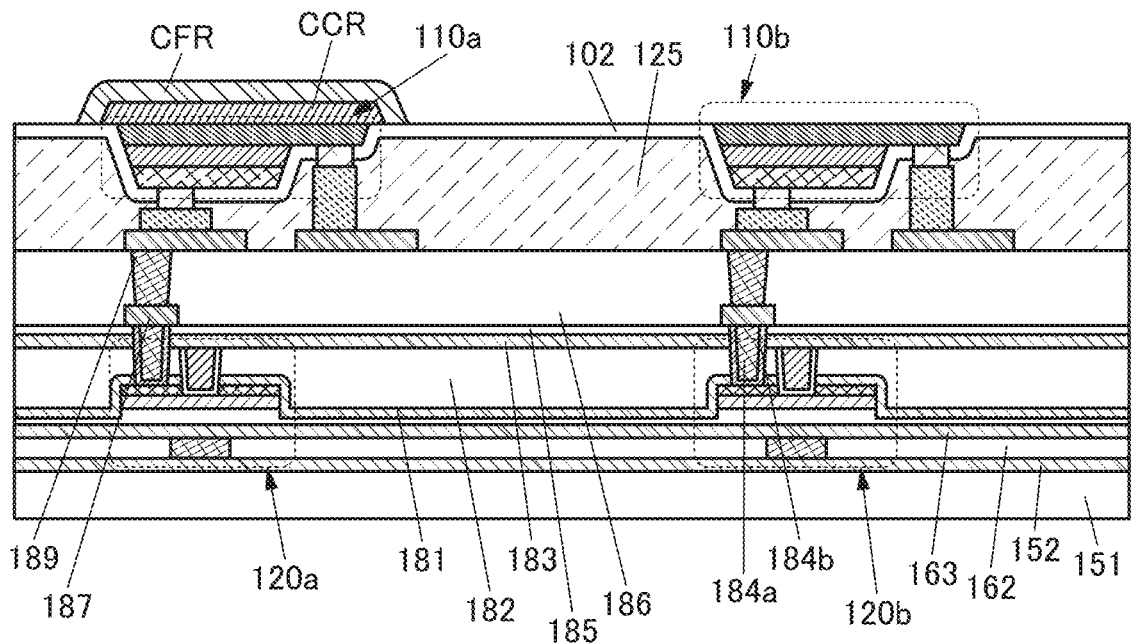

The display device 100A illustrated in FIG. 1 is manufactured in such a manner that an LED substrate 150A illustrated in FIG. 2A and a circuit board 150B illustrated in FIG. 2B are bonded to each other (FIG. 2C and FIG. 3A), a substrate 101 over which the light-emitting diodes 110a and 110b are formed is separated (FIG. 3B and FIG. 4A), and the color conversion layer CCR, the coloring layer CFR, and the like are provided over a surface exposed by the separation (FIG. 4B).

Hereinafter, a structure and a manufacturing method of the display device 100A will be described with reference to FIGS. 2A to 2C, FIGS. 3A and 3B, and FIGS. 4A and 4B.

FIG. 2A is a cross-sectional view of the LED substrate 150A.

The LED substrate 150A includes the substrate 101, the light-emitting diode 110a, the light-emitting diode 110b, and a protective layer 102.

The light-emitting diode 110a and the light-emitting diode 110b each include an electrode 112, a semiconductor layer 113, a light-emitting layer 114, a semiconductor layer 115, and an electrode 116.

The electrode 112 is electrically connected to the semiconductor layer 113. The electrode 116 is electrically connected to the semiconductor layer 115. The protective layer 102 is provided to cover the substrate 101, the semiconductor layer 113, the light-emitting layer 114, and the semiconductor layer 115. The protective layer 102 covers the side surfaces of the electrodes 112 and 116 and have openings overlapping with the top surfaces of the electrodes 112 and 116. In the openings, the top surfaces of the electrodes 112 and 116 are exposed.

The light-emitting layer 114 is positioned between the semiconductor layer 113 and the semiconductor layer 115. In the light-emitting layer 114, electrons and holes are combined to emit light. One of the semiconductor layers 113 and 115 is an n-type semiconductor layer, and the other is a p-type semiconductor layer.

A stacked-layer structure including the semiconductor layer 113, the light-emitting layer 114, and the semiconductor layer 115 is formed so as to emit, for example, red, yellow, green, or blue light. A compound of gallium and phosphorus, a compound of gallium and arsenic, a compound of gallium, aluminum, and arsenic, a compound of aluminum, gallium, indium, and phosphorus, gallium nitride, a compound of indium and gallium nitride, a compound of selenium and zinc, or the like can be used for the stacked-layer structure. In this embodiment, the stacked-layer structure is formed so as to emit blue light.

As the substrate 101, for example, a single crystal substrate of sapphire ($Al_2O_3$), silicon carbide (SiC), silicon (Si), or gallium nitride (GaN) can be used.

FIG. 2B is a cross-sectional view of the circuit board 150B.

The circuit board 150B includes a substrate 151, an insulating layer 152, a transistor 120a, a transistor 120b, a conductive layer 184a, a conductive layer 184b, a conductive layer 187, a conductive layer 189, an insulating layer 186, a conductive layer 190a, a conductive layer 190b, a conductive layer 190c, and a conductive layer 190d. The circuit board 150B further includes insulating layers such as insulating layers 162, 181, 182, 183, and 185. One or more of the insulating layers are sometimes considered as components of a transistor, but are not included as components of a transistor in the description in this embodiment.

An insulating substrate such as a glass substrate, a quartz substrate, a sapphire substrate, or a ceramic substrate; a single crystal semiconductor substrate or a polycrystalline semiconductor substrate including silicon, silicon carbide, or the like as a material; a compound semiconductor substrate of silicon germanium or the like; or a semiconductor substrate such as an silicon on insulator (SOI) substrate can be used as the substrate 151.

The substrate 151 preferably blocks visible light (has a non-transmitting property with respect to visible light). When the substrate 151 blocks visible light, entry of light from the outside into the transistors 120a and 120b formed over the substrate 151 can be inhibited. However, one embodiment of the present invention is not limited thereto, and the substrate 151 may have a transmitting property with respect to visible light.

The insulating layer 152 is provided over the substrate 151. The insulating layer 152 functions as a barrier layer that prevents diffusion of impurities such as water and hydrogen from the substrate 151 into the transistors 120a and 120b and release of oxygen from a metal oxide layer 165 to the insulating layer 152 side. As the insulating layer 152, for example, a film in which hydrogen and oxygen are less likely to be diffused than in a silicon oxide film can be used. Examples of such a film include an aluminum oxide film, a hafnium oxide film, and a silicon nitride film.

The transistors 120a and 120b each include a conductive layer 161, an insulating layer 163, an insulating layer 164, the metal oxide layer 165, a pair of conductive layers 166, an insulating layer 167, a conductive layer 168, and the like.

The metal oxide layer 165 includes a channel formation region. The metal oxide layer 165 includes a first region overlapping with one of the pair of conductive layers 166, a second region overlapping with the other of the pair of conductive layers 166, and a third region between the first region and the second region.

The conductive layer 161 and the insulating layer 162 are provided over the insulating layer 152, and the insulating layers 163 and 164 are provided to cover the conductive layer 161 and the insulating layer 162. The metal oxide layer 165 is provided over the insulating layer 164. The conductive layer 161 functions as a gate electrode, and the insulating layers 163 and 164 each function as a gate insulating layer. The conductive layer 161 overlaps with the metal oxide layer 165 with the insulating layers 163 and 164 therebetween. The insulating layer 163 preferably functions as a barrier layer like the insulating layer 152. As the insulating layer 164 in contact with the metal oxide layer 165, an oxide insulating film such as a silicon oxide film is preferably used.

Here, the top surface of the conductive layer 161 is level or substantially level with the top surface of the insulating layer 162. For example, an opening is provided in the insulating layer 162, the conductive layer 161 is formed to fill the opening, and planarization treatment is performed by a CMP method or the like, whereby the top surfaces of the conductive layer 161 and the insulating layer 162 can become level with each other. Accordingly, the size of the transistors 120a and 120b can be reduced.

The pair of conductive layers 166 is provided over the metal oxide layer 165 so that the conductive layers 166 are apart from each other. The pair of conductive layers 166 functions as a source and a drain. The insulating layer 181 is provided to cover the metal oxide layer 165 and the pair of conductive layers 166, and the insulating layer 182 is provided over the insulating layer 181. An opening reaching the metal oxide layer 165 is provided in the insulating layers 181 and 182, and the insulating layer 167 and the conductive layer 168 are provided to fill the opening. The opening overlaps with the third region. The insulating layer 167 overlaps with the side surfaces of the insulating layers 181 and 182. The conductive layer 168 overlaps with the side surfaces of the insulating layers 181 and 182 with the insulating layer 167 therebetween. The conductive layer 168 functions as a gate electrode, and the insulating layer 167 functions as a gate insulating layer. The conductive layer 168 overlaps with the metal oxide layer 165 with the insulating layer 167 therebetween.

Here, the top surface of the conductive layer 168 is level or substantially level with the top surface of the insulating layer 182. For example, the top surfaces of the conductive layer 168 and the insulating layer 182 can be level with each other by providing an opening in the insulating layer 182, forming the insulating layer 167 and the conductive layer 168 to embed the opening, and performing planarization treatment. Accordingly, the size of the transistors 120a and 120b can be reduced.

The insulating layers 183 and 185 are provided to cover the top surfaces of the insulating layers 182 and 167 and the conductive layer 168. The insulating layers 181 and 183 each preferably function as a barrier layer like the insulating layer 152. When the pair of conductive layers 166 is covered with the insulating layer 181, oxidation of the pair of conductive layers 166 due to oxygen contained in the insulating layer 182 can be inhibited.

A plug electrically connected to one of the pair of conductive layers 166 and the conductive layer 187 is provided to fill an opening in the insulating layers 181, 182, 183, and 185. The plug preferably includes the conductive layer 184b in contact with the side surface of the opening and the top surface of one of the pair of conductive layers 166, and the conductive layer 184a embedded inside the conductive layer 184b. Here, a conductive material in which hydrogen and oxygen are less likely to be diffused is preferably used for the conductive layer 184b.

The conductive layer 187 is provided over the insulating layer 185, and the insulating layer 186 is provided over the conductive layer 187. An opening reaching the conductive layer 187 is provided in the insulating layer 186, and the conductive layer 189 is provided to fill the opening. The conductive layer 189 functions as a plug for electrically connecting the conductive layer 187 and the conductive layer 190a or 190c.

One of the pair of conductive layers 166 of the transistor 120a is electrically connected to the conductive layer 190a through the conductive layers 184a, 184b, 187, and 189.

Similarly, one of the pair of conductive layers 166 of the transistor 120b is electrically connected to the conductive layer 190c through the conductive layers 184a, 184b, 187, and 189.

Examples of a material that can be used for the conductive layers included in the display device in this embodiment include metals such as aluminum, titanium, chromium, nickel, copper, yttrium, zirconium, molybdenum, silver, tantalum, and tungsten, or an alloy containing any of these metals as its main component. A single layer structure or stacked-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of the shape by etching is increased.

Examples of a material that can be used for the insulating layers included in the display device of this embodiment include resin such as an acrylic resin, a polyimide resin, an epoxy resin, or a silicone resin, and an inorganic insulating material such as silicon oxide, silicon oxynitride, silicon nitride oxide, silicon nitride, or aluminum oxide.

In this specification and the like, silicon oxynitride contains more oxygen than nitrogen. Silicon nitride oxide contains more nitrogen than oxygen.

Note that the circuit board 150B may include one or both of a reflective layer that reflects light of a light-emitting diode and a light-blocking layer that blocks the light.

Figure 2C:
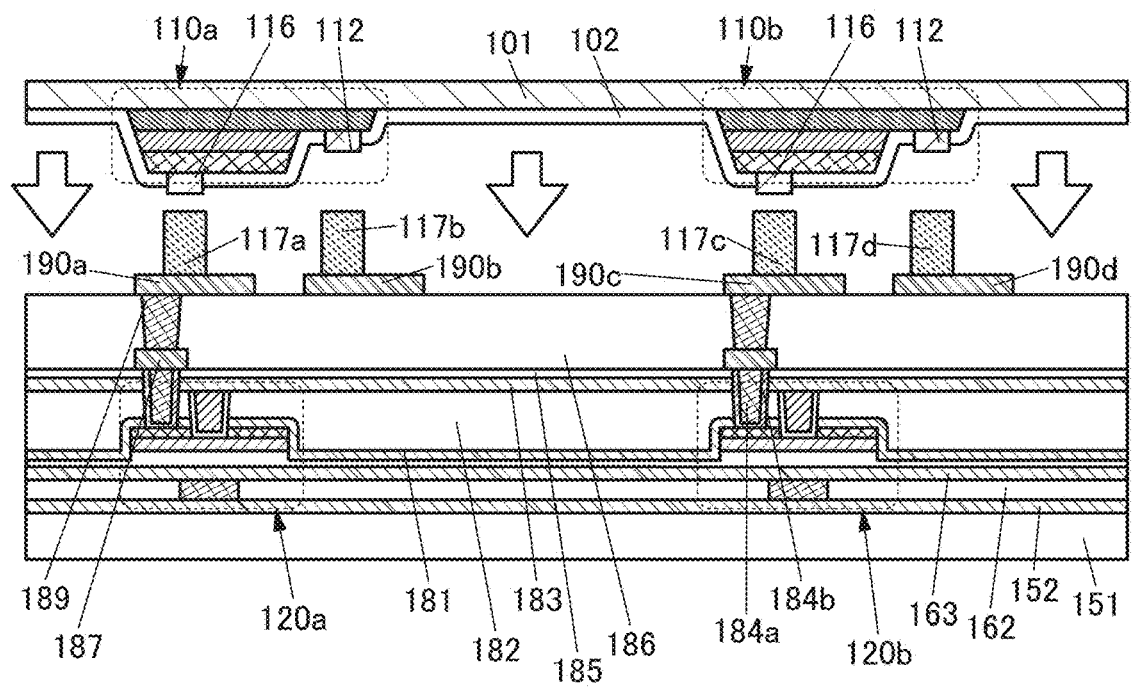

As illustrated in FIG. 2C and FIG. 3A, the electrodes 116 and 112 of the light-emitting diode 110a provided in the LED substrate 150A are electrically connected to the conductive layers 190a and 190b provided in the circuit board 150B, respectively. In a similar manner, the electrodes 116 and 112 of the light-emitting diode 110b provided in the LED substrate 150A are electrically connected to the conductive layers 190c and 190d provided in the circuit board 150B, respectively.

For example, the electrode 116 of the light-emitting diode 110a and the conductive layer 190a are electrically connected to each other through a conductor 117a. Thus, the transistor 120a and the light-emitting diode 110a can be electrically connected to each other. Similarly, the electrode 116 of the light-emitting diode 110b and the conductive layer 190c are electrically connected to each other through a conductor 117c. Thus, the transistor 120b and the light-emitting diode 110b can be electrically connected to each other. The electrode 116 functions as a pixel electrode of the light-emitting diode 110a or 110b.

The electrode 112 of the light-emitting diode 110a and the conductive layer 190b are electrically connected to each other through a conductor 117b. The electrode 112 of the light-emitting diode 110b and the conductive layer 190d are electrically connected to each other through a conductor 117d. The electrode 112 functions as a common electrode of the light-emitting diode 110a or 110b.

For the conductors 117a to 117d, for example, a conductive paste of silver, carbon, copper, or the like or a bump of gold, solder, or the like can be favorably used. Furthermore, for the electrodes 112 and 116 and the conductive layers 190a to 190d each of which is connected to any of the conductors 117a to 117d, a conductive material having a low contact resistance with the conductors 117a to 117d is preferably used. When a silver paste is used for the conductors 117a to 117d, for example, a conductive material connected to the conductors is preferably aluminum, titanium, copper, an alloy containing silver (Ag), palladium (Pd), and copper (Cu) (Ag—Pd—Cu (APC)), or the like, which has a low contact resistance with the conductors.

FIG. 2C shows an example in which the conductors 117a to 117d are provided on the circuit board 150B side, and the LED substrate 150A and the circuit board 150B are bonded to each other. Alternatively, the conductors 117a to 117d are provided on the LED substrate 150A side and the LED substrate 150A and the circuit board 150B are bonded to each other.

Note that a plurality of light-emitting diodes may be electrically connected to one transistor.

A space between the LED substrate 150A and the circuit board 150B is preferably filled with a filler layer 125. With the filler layer 125, the adhesion (bonding strength) between each light-emitting diode and the circuit board 150B can be increased. For the filler layer 125, a variety of kinds of resins such as an acrylic resin, a polyimide resin, an epoxy resin, or a silicone resin can be used.

A phenomenon in which light emitted from the light-emitting diode reaches an adjacent pixel through the filler layer 125 and is emitted to the outside of the display device may occur (this phenomenon is also referred to as crosstalk). In view of the above, a colored resin such as a black resin or a brown resin is preferably used for the filler layer 125. A resin containing carbon black can be used for the filler layer 125, for example. This can inhibit light leakage to an adjacent pixel, so that the display quality of the display device can be improved.

In the case where the substrate 101 is separated with the use of laser light in a later step, the filler layer 125 preferably absorbs the laser light. As a result, a variety of circuits and elements formed in the circuit board 150B can be inhibited from being damaged by laser light.

After bonding the LED substrate 150A and the circuit board 150B, the substrate 101 is preferably separated. There is no particular limitation on the separation method of the substrate 101.

FIG. 3B shows an example in which the entire surface of the substrate 101 is irradiated with laser light 128. In the case where a sapphire substrate is used as the substrate 101 and gallium nitride is used for the semiconductor layer 113, for example, the substrate 101 can be separated by being irradiated with ultraviolet light as the laser light 128 (FIG. 4A).

As the laser, an excimer laser, a solid laser, or the like can be used. For example, a diode-pumped solid-state laser (DPSS) may be used.

A separation layer may be provided between the substrate 101 and the light-emitting diodes 110a and 110b. After the substrate 101 is separated, the light-emitting diodes 110a and 110b may be exposed, or the separation layer may be exposed. The separation layer may be one of components of the display device 100A.

The separation layer can be formed using an organic material or an inorganic material.

Examples of an organic material that can be used for the separation layer include a polyimide resin, an acrylic resin, an epoxy resin, a polyamide resin, a polyimide-amide resin, a siloxane resin, a benzocyclobutene-based resin, and a phenol resin.

Examples of an inorganic material that can be used for the separation layer include a metal containing an element selected from tungsten, molybdenum, titanium, tantalum, niobium, nickel, cobalt, zirconium, zinc, ruthenium, rhodium, palladium, osmium, iridium, and silicon, an alloy containing the element, and a compound containing the element. A crystal structure of a layer containing silicon may be amorphous, microcrystal, or polycrystal.

Next, as illustrated in FIG. 4B, the color conversion layer CCR is formed over the light-emitting diode 110a. The red coloring layer CFR is preferably formed over the color conversion layer CCR.

The color conversion layer CCR has a function of converting blue light into red light. The color conversion layer CCR can be provided in contact with the light-emitting diode 110a. Alternatively, an insulating layer may be provided between the light-emitting diode 110a and the color conversion layer CCR.

A blue coloring layer may be formed over the light-emitting diode 110b. When a blue coloring layer is provided, the purity of blue light can be improved. In the case where a blue coloring layer is not provided, the manufacturing process can be simplified.

As the color conversion layer, a phosphor or a quantum dot (QD) is preferably used. In particular, a quantum dot has an emission spectrum with a narrow peak, so that emission with high color purity can be obtained. Accordingly, the display quality of the display device can be improved.

The color conversion layer can be formed by a droplet discharge method (e.g., an inkjet method), a coating method, an imprinting method, a variety of printing methods (screen printing or offset printing), or the like. A color conversion film such as a quantum dot film may also be used.

For processing a film to be the color conversion layer, a photolithography method is preferably employed. Examples of a photolithography method include a method in which a resist mask is formed over a thin film to be processed, the thin film is processed by etching or the like, and the resist mask is removed, and a method in which a photosensitive thin film is formed, and the photosensitive thin film is exposed to light and developed to be processed into a desired shape. For example, a thin film is formed using a material in which a quantum dot is mixed with a photoresist, and the thin film is processed by a photolithography method, whereby an island-shaped color conversion layer can be formed.

There is no limitation on a material of a quantum dot, and examples include a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used.

Examples of the quantum dot include a core-type quantum dot, a core-shell quantum dot, and a core-multishell quantum dot. Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over a wavelength range of a spectrum of an ultraviolet region, a visible light region, and an infrared region by changing the size of quantum dots. The range of size (diameter) of quantum dots is, for example, greater than or equal to 0.5 nm and less than or equal to 20 nm, preferably greater than or equal to 1 nm and less than or equal to 10 nm. The emission spectra are narrowed as the size distribution of the quantum dots gets smaller, and thus light can be obtained with high color purity. The shape of the quantum dots is not particularly limited and may be a spherical shape, a rod shape, a circular shape, or the like. A quantum rod, which is a rod-shaped quantum dot, has a function of emitting directional light.

The coloring layer is a colored layer that transmits light in a specific wavelength range. For example, a color filter for transmitting light in a red, green, blue, or yellow wavelength range can be used. Examples of a material that can be used for the coloring layer include a metal material, a resin material, and a resin material containing a pigment or a dye.

Through the above process, the display device 100A illustrated in FIG. 1 can be manufactured.

Figure 5A:
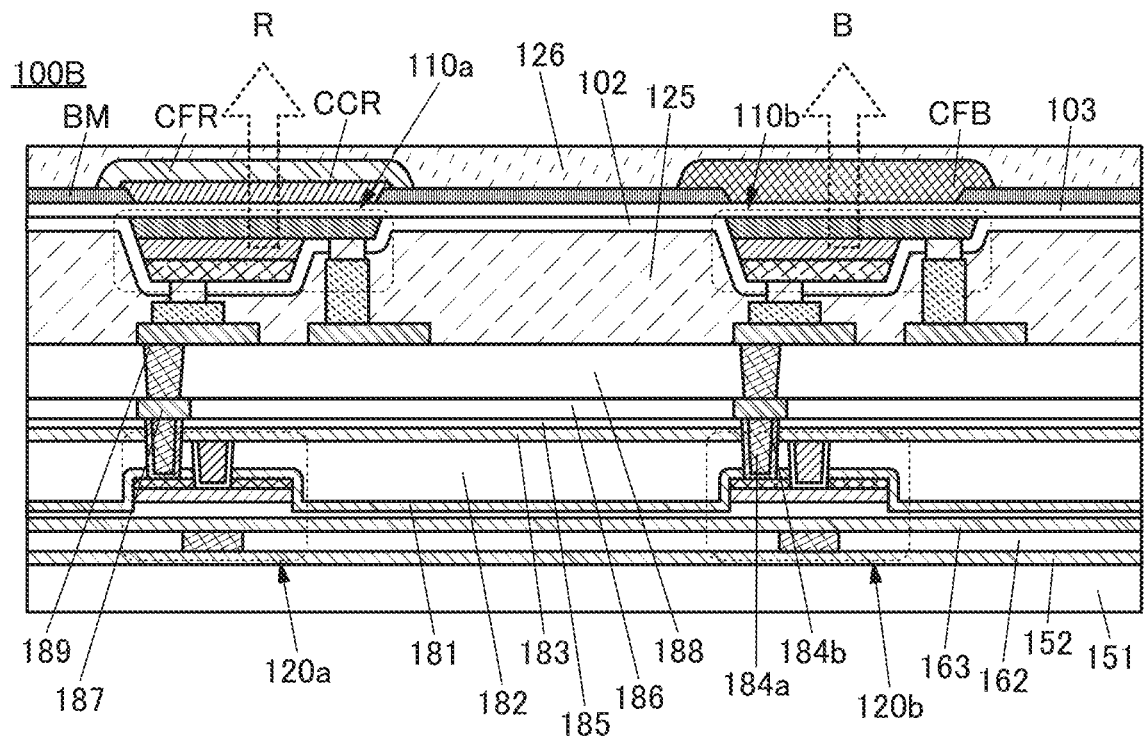
FIGS. 5A and 5B each show an example of a display device.

FIG. 5A is a cross-sectional view of a display device 100B.

The display device 100B is different from the display device 100A in that an insulating layer 188, an insulating layer 103, a light-blocking layer BM, a coloring layer CFB, and a protective layer 126 are included. Other components are similar to those of the display device 100A.

In the display device 100B, the conductive layer 187 and the insulating layer 186 are provided over the insulating layer 185, and the insulating layer 188 over the conductive layer 187. Here, the top surface of the conductive layer 187 is level or substantially level with the top surface of the insulating layer 186. For example, the top surfaces of the conductive layer 187 and the insulating layer 186 can be level with each other by providing an opening in the insulating layer 186, forming the conductive layer 187 to embed the opening, and performing planarization treatment. An opening reaching the conductive layer 187 is provided in the insulating layer 188, and the conductive layer 189 is provided to fill the opening.

The display device 100B includes the insulating layer 103 between the light-emitting diode 110a and the color conversion layer CCR. As the insulating layer 103, the above-described separation layer or a protective layer of the light-emitting diodes 110a and 110b can be used, for example.

The light-blocking layer BM is preferably provided between adjacent pixels. FIG. 5A shows an example in which the light-blocking layer BM is provided over the insulating layer 103, the color conversion layer CCR is provided in a position covering an end portion of the light-blocking layer BM and overlapping with the light-emitting diode 110a, and the coloring layer CFB is provided in a position covering an end portion of the light-blocking layer BM and overlapping with the light-emitting diode 110b. The provision of the light-blocking layer BM can inhibit a phenomenon in which light emitted from the light-emitting diode 110a is emitted to the outside of the display device 100B through the protective layer 102, the insulating layer 103, and the like without passing through the color conversion layer CCR and the coloring layer CFR.

In the display device 100B, the blue coloring layer CFB is provided over the light-emitting diode 110b. The purity of blue light emitted from the light-emitting diode 110b in a blue pixel is improved by the coloring layer CFB and the light is emitted to the outside of the display device 100B.

The protective layer 126 may be provided to cover the color conversion layer and the coloring layer. For the protective layer 126, resin such as an acrylic resin, a polyimide resin, an epoxy resin, or a silicone resin, and an inorganic insulating material such as silicon oxide, silicon oxynitride, silicon nitride oxide, silicon nitride, or aluminum oxide can be used. Furthermore, as the protective layer 126, a film such as a resin film may be used.

Figure 5B:
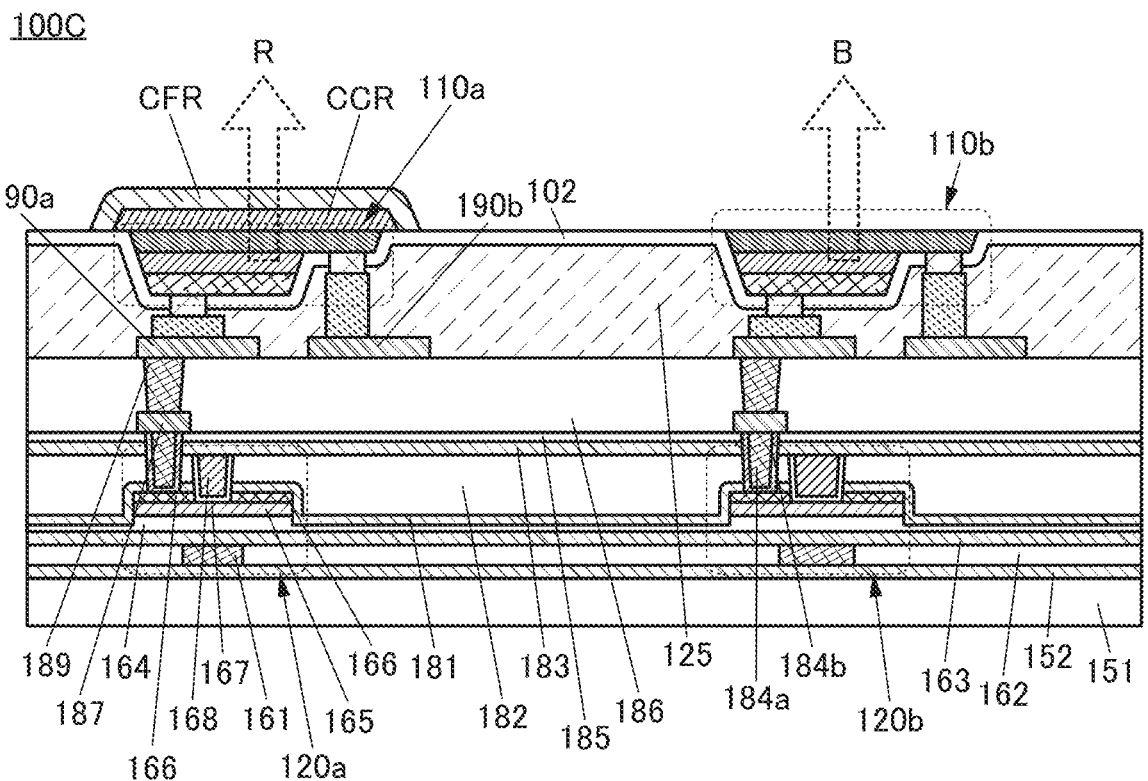

FIG. 5B is a cross-sectional view of a display device 100C.

An example is shown in which the transistor 120a and the transistor 120b of the display device 100C have different channel lengths. Other components are similar to those of the display device 100A.

The transistor 120a for driving the light-emitting diode 110a and the transistor 120b for driving the light-emitting diode 110b may be different from each other in at least one of a transistor size, a channel length, a channel width, a structure, and the like.

Depending on the amount of current required for light emission with desired luminance, one or both of the channel length and the channel width of the transistor may be changed between subpixels that emit light of different colors.

Figure 6:
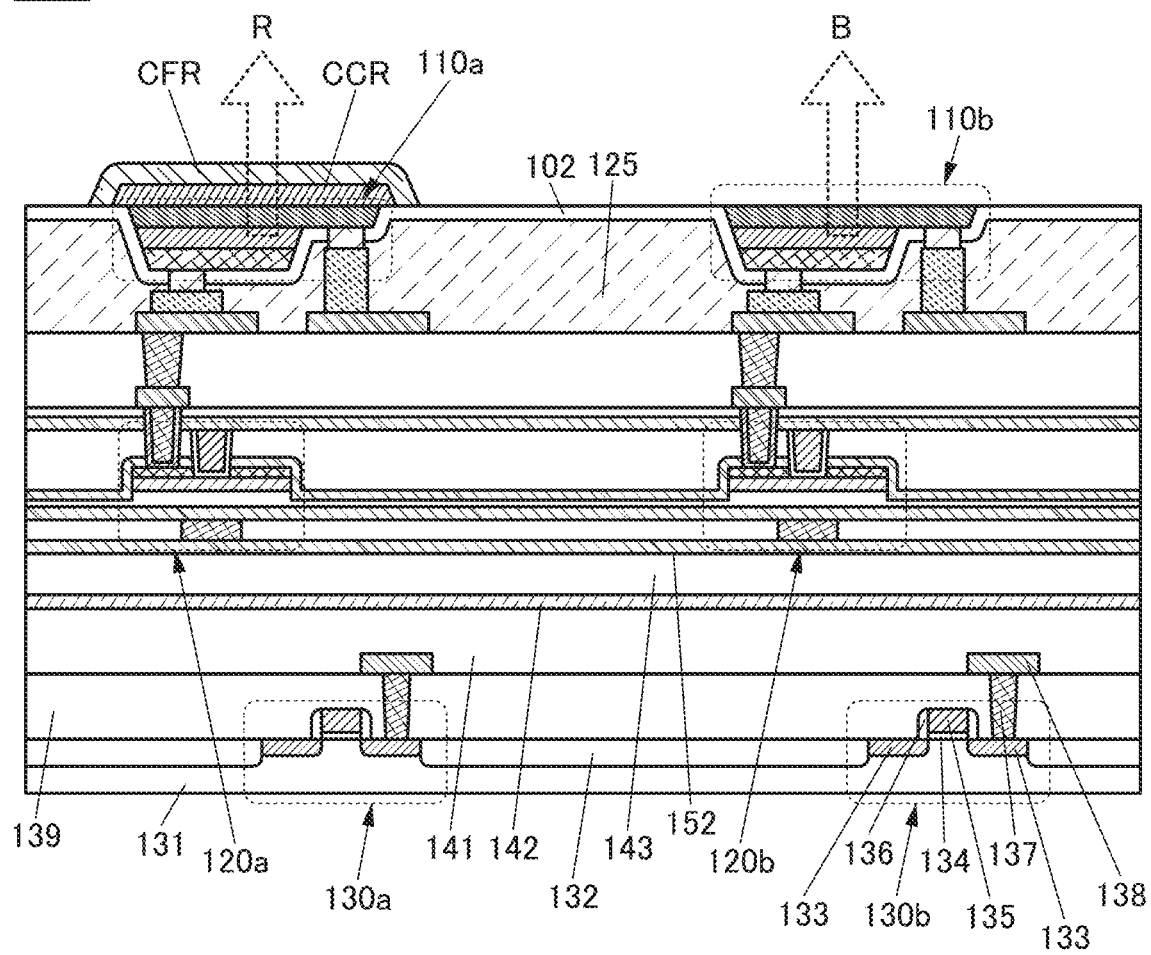
FIG. 6 shows an example of a display device.

FIG. 6 is a cross-sectional view of a display device 100D.

The display device 100D has a stacked-layer structure which includes transistors each including a channel formation region in a substrate 131 (transistors 130a and 130b) and transistors each including a channel formation region in a metal oxide (the transistors 120a and 120b).

As the substrate 131, a single crystal silicon substrate is favorably used. That is, the display device 100D preferably includes both a transistor including silicon in a channel formation region (hereinafter, also referred to as a Si transistor) and a transistor including a metal oxide in a channel formation region (hereinafter, also referred to as an OS transistor).

The transistors 130a and 130b each include a conductive layer 135, an insulating layer 134, an insulating layer 136, and a pair of low-resistance regions 133. The conductive layer 135 functions as a gate. The insulating layer 134 is positioned between the conductive layer 135 and the substrate 131 and functions as a gate insulating layer. The insulating layer 136 is provided to cover the side surface of the conductive layer 135 and functions as a sidewall. The pair of low-resistance regions 133 in the substrate 131 is doped with an impurity; one of the pair of low-resistance regions 133 functions as a source of a transistor and the other functions as a drain of the transistor.

An element isolation layer 132 is provided between two adjacent transistors to be embedded in the substrate 131.

An insulating layer 139 is provided to cover the transistors 130a and 130b, and a conductive layer 138 is provided over the insulating layer 139. The conductive layer 138 is electrically connected to one of the pair of low-resistance regions 133 through a conductive layer 137 provided to fill an opening in the insulating layer 139. That is, the conductive layer 137 functions as a plug for electrically connecting the conductive layer 138 and one of the pair of low-resistance regions 133. An insulating layer 141 is provided to cover the conductive layer 138, and a conductive layer 142 is provided over the insulating layer 141. The conductive layer 138 and the conductive layer 142 each function as a wiring. An insulating layer 143 and the insulating layer 152 are provided to cover the conductive layer 142, and the transistors 120a and 120b are provided over the insulating layer 152. A stacked-layer structure including components from the insulating layer 152 to the coloring layer CFR is the same as that of the display device 100A; thus, detailed description thereof is omitted.

The transistors 120a, 120b, 130a, and 130b can be used as transistors included in a pixel circuit or transistors included in a driver circuit (one or both of a gate driver and a source driver) for driving the pixel circuit. The transistors 120a, 120b, 130a, and 130b can also be used as transistors included in a variety of circuits such as an arithmetic circuit and a memory circuit.

For example, the transistors 120a and 120b, which are OS transistors, can be used as transistors of the pixel circuit and the gate driver, and the transistors 130a and 130b, which are Si transistors, can be used as transistors of the source driver. Alternatively, the transistors 120a and 120b, which are OS transistors, can be used as transistors of the pixel circuit and the gate driver, and the transistors 130a and 130b, which are Si transistors, can be used as transistors of the gate driver and the source driver.

With such a structure, not only the pixel circuit but also the driver circuit or the like can be formed directly under the light-emitting diode; thus, the display device can be downsized as compared with the case where the driver circuit is provided outside a display portion. In addition, the display device can have a narrow frame (narrow non-display region).

As described above, the display device of one embodiment of the present invention can be manufactured by bonding a plurality of light-emitting diodes and a plurality of transistors at a time, which leads to a reduction in manufacturing cost of the display device and an improvement in yield. Moreover, by combining a micro LED and a transistor including a metal oxide, a display device with reduced power consumption can be obtained.

Structure Example 2 of Display Device

Figure 7A:
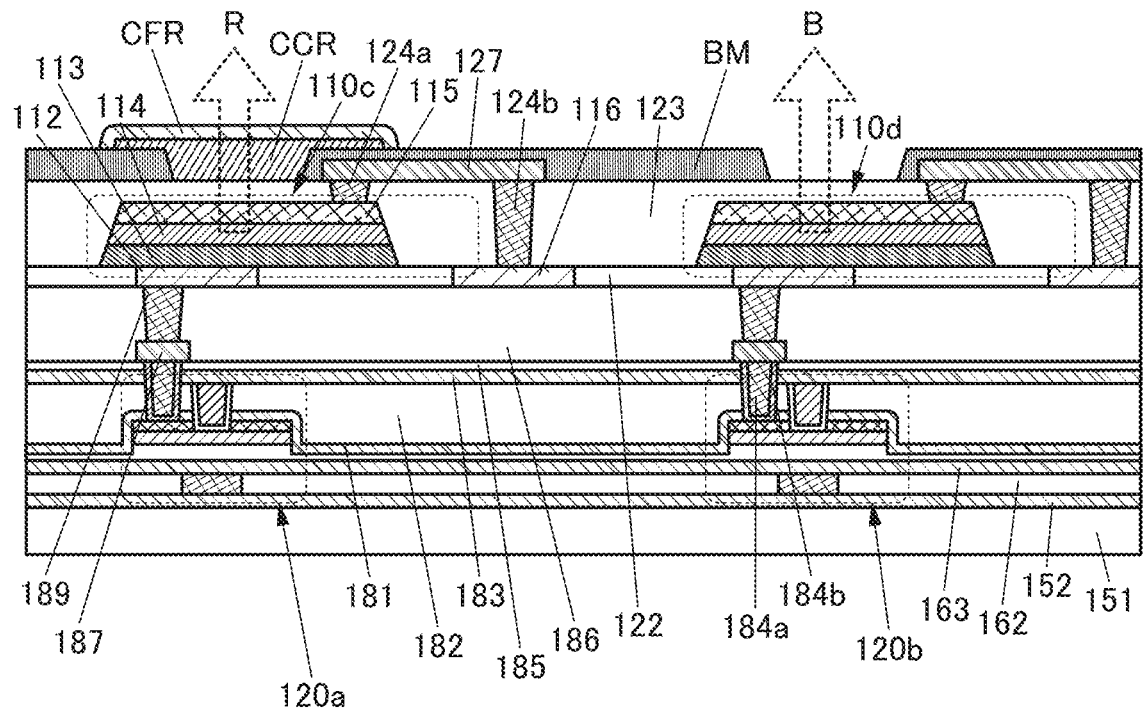
FIGS. 7A and 7B each show an example of a display device.
Figure 7B:
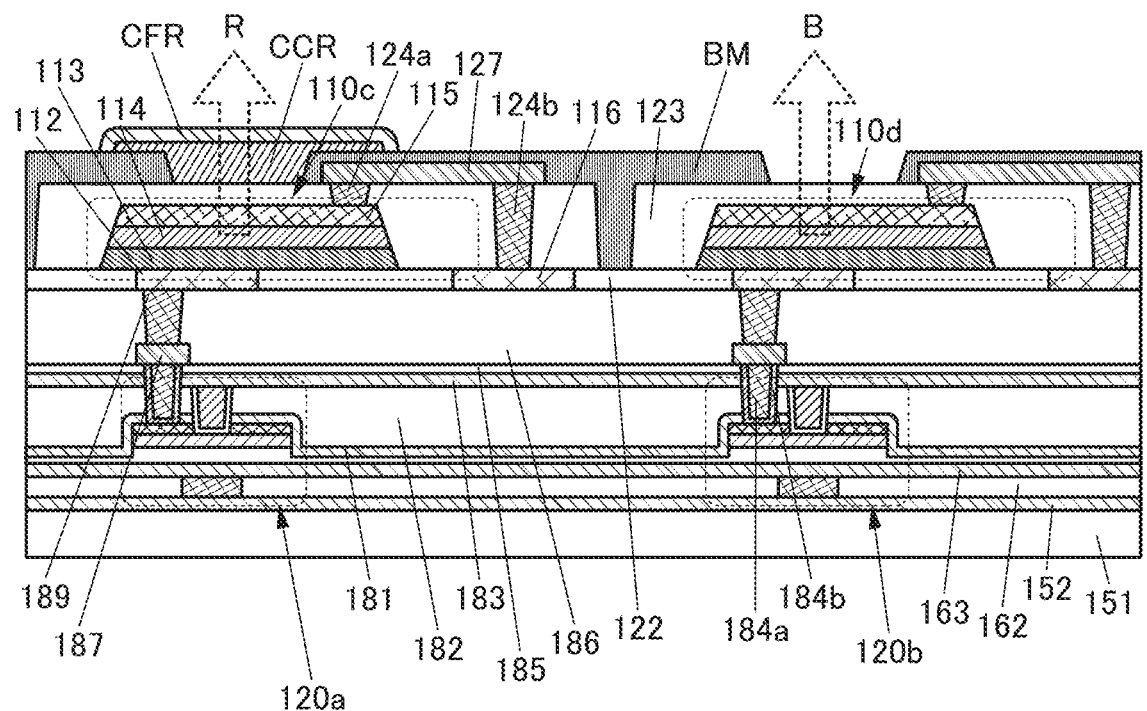

FIG. 7A is a cross-sectional view of a display device 100E, and FIG. 7B is a cross-sectional view of a display device 100F.

The display devices 100E and 100F are each manufactured by forming a light-emitting diode directly over a circuit board.

Here, it is difficult to form light-emitting diodes for different colors over the same substrate because of a difference in a lattice constant. In the display device of this embodiment, full-color display is performed by combination of light-emitting diodes of one kind and color conversion layers. Therefore, only one kind of light-emitting diodes may be formed over the substrate. Accordingly, the display device of this embodiment can be manufactured by forming a light-emitting diode directly over a circuit board.

Components from the substrate 151 to the conductive layer 189 of the display devices 100E and 100F are the same as those of the circuit board 150B illustrated in FIG. 2B; thus, detailed description thereof is omitted.

An insulating layer 122 and the electrodes 112 and 116 of a light-emitting diode are provided over the conductive layer 189 and the insulating layer 186.

For example, the electrode 112 of a light-emitting diode 110c is in contact with and electrically connected to the conductive layer 189. Thus, the transistor 120a and the light-emitting diode 110c can be electrically connected to each other. In the display devices 100E and 100F, the electrode 112 and the electrode 116 function as a pixel electrode and a common electrode of each of the light-emitting diode 110c and a light-emitting diode 110d, respectively.

Here, the top surfaces of the electrodes 112 and 116 and the insulating layer 122 are level or substantially level with each other. For example, openings are provided in the insulating layer 122, the electrodes 112 and 116 are formed to fill the openings, and planarization treatment is performed, whereby the top surfaces of the electrodes 112 and 116 and the insulating layer 122 can become level with each other. Accordingly, the semiconductor layer 113, the light-emitting layer 114, and the semiconductor layer 115 can be formed over a flat surface.

The semiconductor layer 113 is provided over the electrode 112. The semiconductor layer 113 is electrically connected to the electrode 112. The light-emitting layer 114 is provided over the semiconductor layer 113, and the semiconductor layer 115 is provided over the light-emitting layer 114.

An insulating layer 123 is provided to cover the semiconductor layer 113, the light-emitting layer 114, and the semiconductor layer 115. An opening reaching the semiconductor layer 115 and an opening reaching the electrode 116 are provided in the insulating layer 123, and conductive layers 124a and 124b are provided to fill the openings.

A conductive layer 127 is provided over the conductive layers 124a and 124b and the insulating layer 123. The conductive layer 124a functions as a plug for electrically connecting the semiconductor layer 115 and the conductive layer 127. The conductive layer 124b functions as a plug for electrically connecting the conductive layer 127 and the electrode 116. The semiconductor layer 115 is electrically connected to the electrode 116 through the conductive layers 124a, 127, and 124b.

The light-blocking layer BM is preferably provided between adjacent pixels. FIGS. 7A and 7B show examples in which the light-blocking layer BM is provided over the insulating layer 123, the color conversion layer CCR is provided in a position covering an end portion of the light-blocking layer BM and overlapping with the light-emitting diode 110c, and the red coloring layer CFR is provided over the color conversion layer CCR. The provision of the light-blocking layer BM can inhibit a phenomenon in which light emitted from the light-emitting diode 110c is emitted to the outside of each of the display devices 100E and 100F through the insulating layer 123 and the like without passing through the color conversion layer CCR and the coloring layer CFR.

Note that an opening that surrounds the light-emitting diode may be provided in the insulating layer 123 and the light-blocking layer BM may be provided to fill the opening as illustrated in FIG. 7B. Thus, light emitted from the light-emitting diode can be inhibited from reaching an adjacent pixel, which improves the display quality of the display device 100F.

Structure Example 3 of Display Device

A structure and a manufacturing method of a display device 100G will be described with reference to FIGS. 8A and 8B. Furthermore, a structure and a manufacturing method of a display device 100H will be described with reference to FIGS. 8A, 9A, and 9B.

The display devices 100G and 100H are each manufactured by forming a circuit including a transistor and the like directly over an LED substrate.

As described above, in the display device of this embodiment, one light-emitting diode and color conversion layers are combined to perform full-color display. Therefore, light-emitting diodes of all the pixels can be formed over one substrate. Thus, a circuit including a transistor and the like is further formed directly over the substrate, whereby the display device of this embodiment can be manufactured.

Figure 8A:
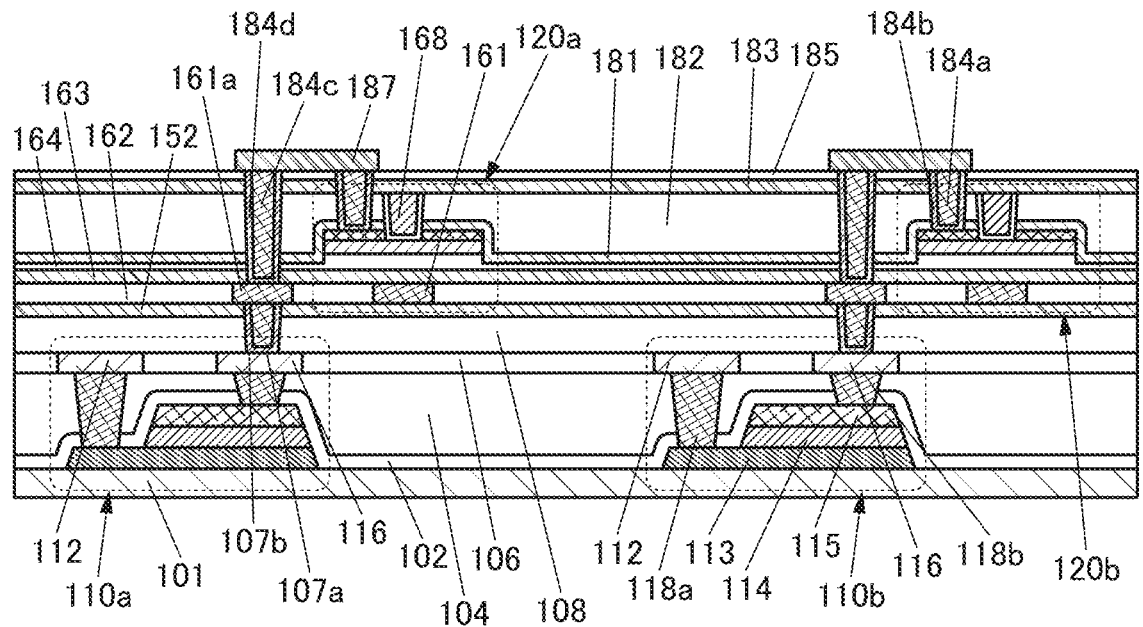
FIGS. 8A and 8B show an example of a method for manufacturing a display device.

In manufacturing the display devices 100G and 100H, first, a stacked-layer structure including components from the substrate 101 to the conductive layer 187 is formed as illustrated in FIG. 8A.

The components from the substrate 101 to the protective layer 102 of the display devices 100G and 100H are the same as those of the LED substrate 150A illustrated in FIG. 2A; thus, detailed description thereof is omitted.

An insulating layer 104 is provided over the protective layer 102. An opening reaching the semiconductor layer 113 and an opening reaching the semiconductor layer 115 are provided in the insulating layer 104, and conductive layers 118a and 118b are provided to fill the openings.

Here, the top surfaces of the conductive layers 118a and 118b and the insulating layer 104 are level or substantially level with each other. Accordingly, the electrodes 112 and 116 and also the transistors 120a and 120b and the like can be formed over a flat surface.

The electrodes 112 and 116 of the light-emitting diode and an insulating layer 106 are provided over the insulating layer 104. The conductive layer 118a functions as a plug for electrically connecting the semiconductor layer 113 and the electrode 112. The conductive layer 118b functions as a plug for electrically connecting the semiconductor layer 115 and the electrode 116.

In the display devices 100G and 100H, the electrode 116 functions as a pixel electrode of the light-emitting diodes 110a and 110b. The electrode 112 functions as a common electrode of the light-emitting diodes 110a and 110b.

The top surfaces of the electrodes 112 and 116 and the insulating layer 106 are level or substantially level with each other. Accordingly, the transistors 120a and 120b and the like can be formed over a flat surface.

An insulating layer 108 and the insulating layer 152 are provided over the insulating layer 106 and the electrodes 112 and 116. An opening reaching the electrode 116 is provided in the insulating layers 108 and 152, and a plug for electrically connecting the electrode 116 and the transistor is provided to fill the opening. The plug preferably includes a conductive layer 107b in contact with the side surface of the opening and the top surface of the electrode 116 and a conductive layer 107a embedded inside the conductive layer 107b. Here, a conductive material in which hydrogen and oxygen are less likely to be diffused is preferably used for the conductive layer 107b.

Components from the insulating layer 152 to the conductive layer 187 of the display devices 100G and 100H are the same as those of the circuit board 150B illustrated in FIG. 2B except that conductive layers 161a, 184c, and 184d are included.

The conductive layer 161a can be formed using the same material and in the same step as those of the conductive layer 161 of the transistor. The conductive layer 184c can be formed using the same material and in the same step as the conductive layer 184a. The conductive layer 184d can be formed using the same material and in the same step as the conductive layer 184b.

An opening reaching the conductive layer 161a is provided in the insulating layers 163, 164, 181, 182, 183, and 185, and a plug for electrically connecting the conductive layer 187 and the conductive layer 161a is provided to fill the opening. The plug includes the conductive layers 184c and 184d.

One of the pair of conductive layers 166 of the transistor is electrically connected to the electrode 116 through the conductive layers 184a, 184b, 187, 184c, 184d, 161a, 107a, and 107b.

Figure 8B:
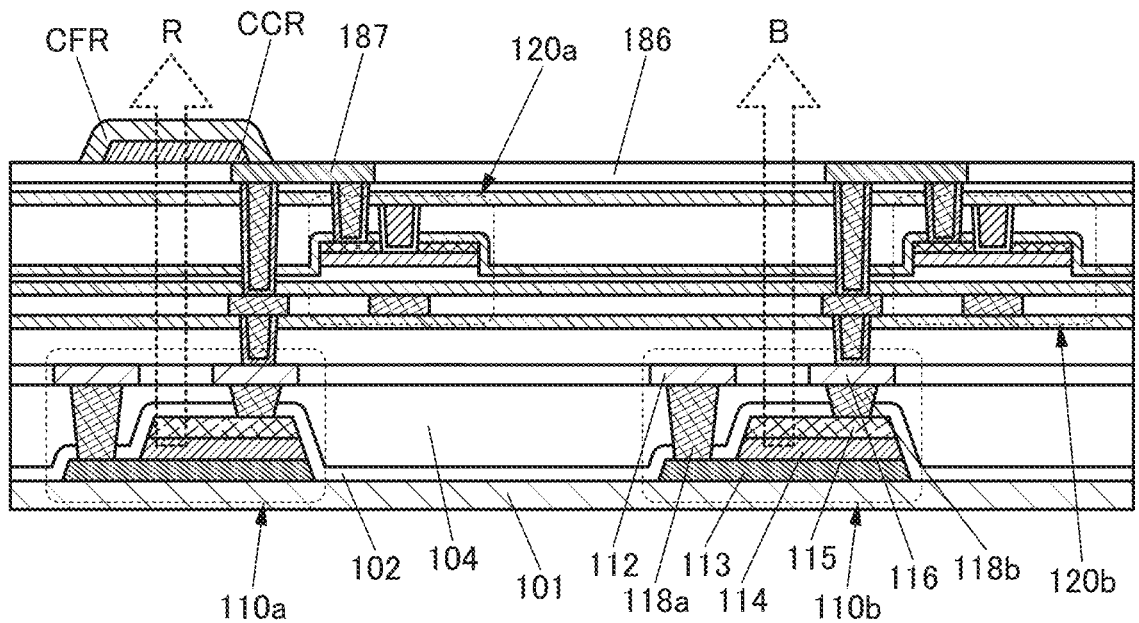

After the formation of the stacked-layer structure illustrated in FIG. 8A, the color conversion layer CCR is formed in a position overlapping with the light-emitting diode 110a and the red coloring layer CFR is formed over the color conversion layer CCR as illustrated in FIG. 8B, whereby the display device 100G is manufactured.

Note that the insulating layer 186 may be provided over the insulating layer 183, and the color conversion layer CCR may be formed over the insulating layer 186.

As illustrated in FIG. 8B, light emitted from the light-emitting diode 110a enters the color conversion layer CCR through the protective layer 102 and a plurality of insulating layers, i.e., the insulating layers 104 to 186, and is converted from blue light into red light by the color conversion layer CCR, the purity of the red light is improved by a coloring layer CFR, and the red light is emitted to the outside of the display device 100G.

As illustrated in FIG. 8B, blue light emitted from the light-emitting diode 110b is emitted to the outside of the display device 100G through the protective layer 102 and the plurality of insulating layers, i.e., the insulating layers 104 to 186.

Figure 9A:
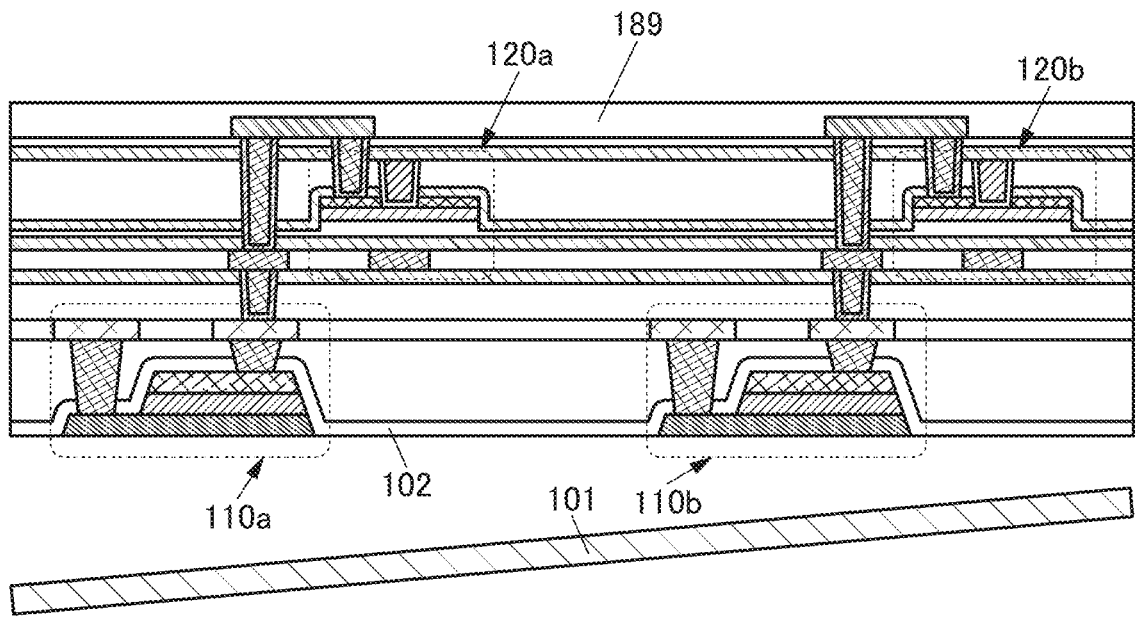
FIGS. 9A and 9B show an example of a method for manufacturing a display device.
Figure 9B:
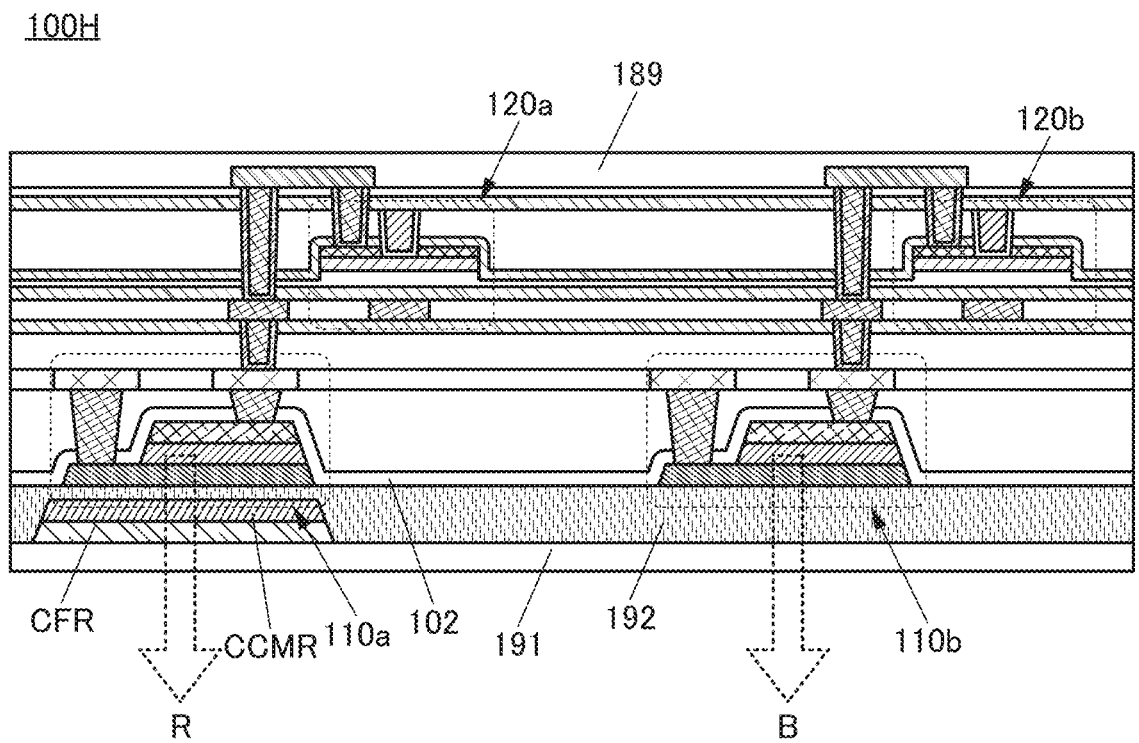

After the formation of the stacked-layer structure illustrated in FIG. 8A, the substrate 101 is separated (FIG. 9A), and a substrate 191 provided with the coloring layer CFR, a color conversion layer CCMR, and the like is bonded to a surface exposed by the separation with the use of an adhesive layer 192, whereby the display device 100H illustrated in FIG. 9B can be manufactured.

As the adhesive layer 192, any of a variety of curable adhesives such as a reactive curable adhesive, a thermosetting adhesive, an anaerobic adhesive, and a photocurable adhesive such as an ultraviolet curable adhesive can be used. Alternatively, an adhesive sheet or the like may be used.

Alternatively, the substrate 191 provided with the coloring layer CFR, the color conversion layer CCMR, and the like may be bonded to the substrate 101 with the use of the adhesive layer 192. In other words, the substrate 101 is not necessarily separated.

At this time, the substrate 101 is preferably thinned by polishing or the like. This can increase the extraction efficiency of light emitted from the light-emitting diode. In addition, the display device can be thin and lightweight.

As illustrated in FIG. 9B, light emitted from the light-emitting diode 110a enters the color conversion layer CCR through the adhesive layer 192, is converted from blue light into red light by the color conversion layer CCR, the purity of the red light is improved by a coloring layer CFR, and the red light is emitted to the outside of the display device 100H.

As illustrated in FIG. 9B, blue light emitted from the light-emitting diode 110b is emitted to the outside of the display device 100H through the adhesive layer 192.

As described above, in the display device of one embodiment of the present invention, a plurality of light-emitting diodes and a plurality of transistors can be bonded to each other at a time. Alternatively, the display device of one embodiment of the present invention can be manufactured by forming a light-emitting diode directly over a circuit board. Alternatively, the display device of one embodiment of the present invention can be manufactured by forming a transistor and the like directly over a circuit board. Therefore, manufacturing cost can be reduced and a yield can be improved.

Moreover, by combining a micro LED and a transistor including a metal oxide, a display device with reduced power consumption can be obtained.

This embodiment can be combined with the other embodiments as appropriate. In this specification, in the case where a plurality of structure examples are shown in one embodiment, the structure examples can be combined as appropriate.

Embodiment 2

In this embodiment, structure examples of transistors that can be used for the display device of one embodiment of the present invention are described with reference to FIGS. 10A to 10D and FIGS. 11A to 11D.

The transistor of this embodiment can be small, which facilitates an increase in the resolution of a display device and the application of the transistor to an electronic device having a relatively small display portion.

In this specification and the like, a transistor is an element having at least three terminals of a gate, a drain, and a source. The transistor includes a region where a channel is formed (a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Functions of a source and a drain might be switched when a transistor of opposite polarity is employed or a direction of current flow is changed in circuit operation, for example. Therefore, the terms "source" and "drain" can be interchanged in some cases in this specification and the like.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or in a channel formation region in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a channel formation region.

The channel width refers to, for example, the length of a channel formation region perpendicular to a channel length direction in a region where a semiconductor (or a portion where a current flows in a semiconductor when a transistor is on) and a gate electrode overlap with each other or in the channel formation region in a top view of the transistor. In one transistor, channel widths in all regions are not necessarily the same. In other words, the channel width of one transistor is not fixed to one value in some cases. Therefore, in this specification, the channel width is any one of values, the maximum value, the minimum value, or the average value in a channel formation region.

Note that in this specification and the like, depending on the transistor structure, a channel width in a region where a channel is actually formed (hereinafter also referred to as an effective channel width) is different from a channel width shown in a top view of a transistor (hereinafter also referred to as an apparent channel width) in some cases. For example, in a transistor having a gate electrode covering the side surface of a semiconductor, the effective channel width is larger than the apparent channel width, and its influence cannot be ignored in some cases. As another example, in a miniaturized transistor having a gate electrode covering the side surface of a semiconductor, the proportion of a channel formation region formed on the side surface of the semiconductor is sometimes increased. In that case, the effective channel width is larger than the apparent channel width.

In such cases, an effective channel width is sometimes difficult to estimate by measuring. For example, to estimate an effective channel width from a design value, it is necessary to assume that the shape of a semiconductor is known. Accordingly, in the case where the shape of a semiconductor is not known exactly, it is difficult to measure an effective channel width accurately.

In this specification, the simple term "channel width" denotes an apparent channel width in some cases. In other cases, the simple term "channel width" denotes an effective channel width. Note that the values of a channel length, a channel width, an effective channel width, an apparent channel width, and the like can be determined by analyzing a cross-sectional image obtained by a transmission electron microscope (TEM) and the like.

Note that an impurity in a semiconductor refers to, for example, elements other than the main components of the semiconductor. For example, an element with a concentration lower than 0.1 atomic % is regarded as an impurity. When a semiconductor contains an impurity, an increase in density of defect states or a reduction in crystallinity of the semiconductor may occur, for example. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor. Specific examples include hydrogen, lithium, sodium, silicon, boron, phosphorus, carbon, and nitrogen. Note that water also serves as an impurity in some cases. Entry of an impurity may cause oxygen vacancies (Vo) in an oxide semiconductor, for example.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is referred to as an oxide semiconductor in some cases. That is, an OS transistor is a transistor including a metal oxide or an oxide semiconductor.

Figure 10A:
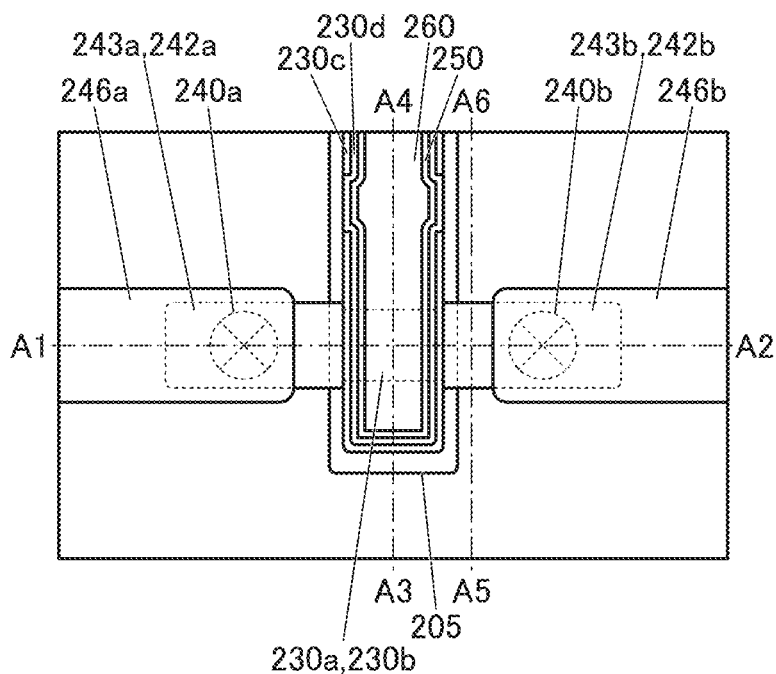
FIG. 10A is a top view showing an example of a semiconductor device.
Figure 10C:
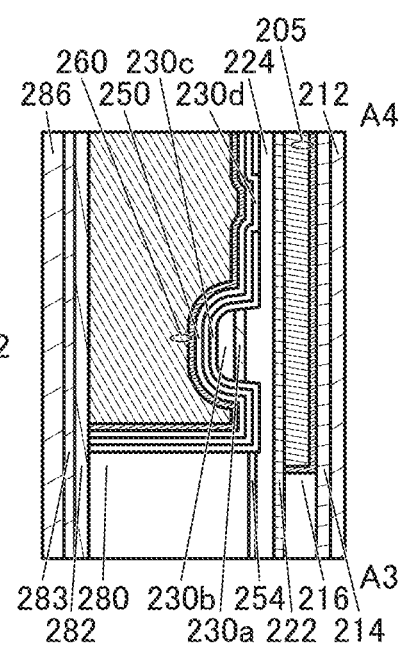
FIGS. 10B to 10D are cross-sectional views showing an example of the semiconductor device.
Figure 10B:
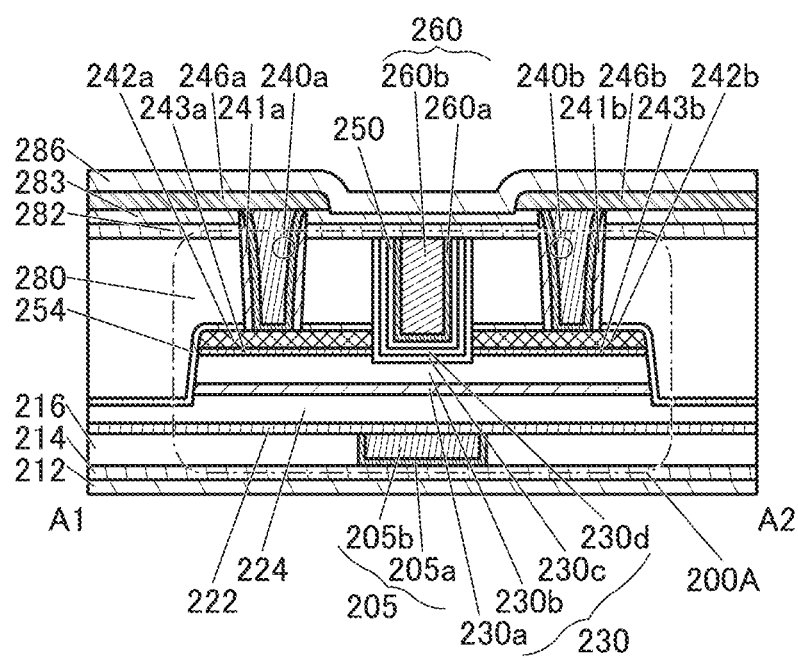
Figure 10D:
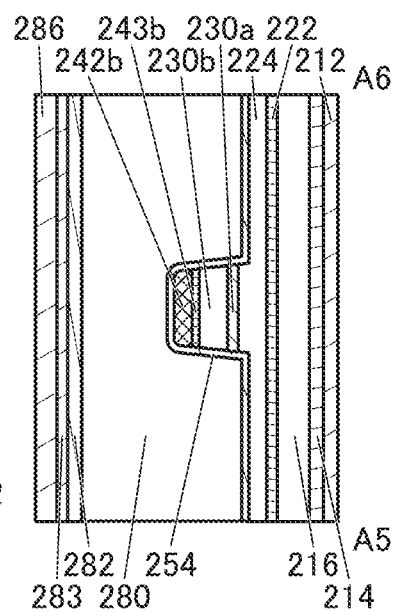

FIGS. 10A to 10D illustrate a semiconductor device including a transistor 200A. FIG. 10A is a top view of the semiconductor device, and FIGS. 10B, 10C, and 10D are cross-sectional views taken along dashed-dotted lines A1-A2, A3-A4, and A5-A6 illustrated in FIG. 10A, respectively. FIG. 10B can also be referred to as a cross-sectional view of the transistor 200A in the channel length direction. FIG. 10C can also be referred to as a cross-sectional view of the transistor 200A in the channel width direction. Note that for simplification, some components are not illustrated in FIG. 10A.

The semiconductor device illustrated in FIGS. 10A to 10D includes, an insulator 212 over a substrate (not illustrated), an insulator 214 over the insulator 212, an insulator 216 over the insulator 214, the transistor 200A over the insulators 214 and 216, an insulator 254 over the transistor 200A, an insulator 280 over the insulator 254, an insulator 282 over the insulator 280, and an insulator 283 over the insulator 282. The insulators 212, 214, 216, 254, 280, 282, and 283 each function as an interlayer film. The semiconductor device further includes a conductor 240 (a conductor 240a and a conductor 240b), an insulator 241 (an insulator 241a and an insulator 241b), a conductor 246 (a conductor 246a and a conductor 246b) over the insulator 283 and the conductor 240, and an insulator 286 over the conductor 246 and the insulator 283. The conductors 240a and 240b are electrically connected to the transistor 200A and function as plugs. The insulator 241 is provided in contact with the side surface of the conductor 240. The conductor 246a is electrically connected to the conductor 240a and functions as a wiring. Similarly, the conductor 246b is electrically connected to the conductor 240b and functions as a wiring.

The insulator 241a is provided in contact with a side wall of an opening formed in the insulators 254, 280, 282, and 283, a first conductor of the conductor 240a is provided in contact with the side surface of the insulator 241a, and a second conductor of the conductor 240a is provided inside the first conductor. The insulator 241b is provided in contact with a side wall of an opening formed in the insulators 254, 280, 282, and 283, a first conductor of the conductor 240b is provided in contact with the side surface of the insulator 241b, and a second conductor of the conductor 240b is provided inside the first conductor. The top surface of the conductor 240 can be substantially level with the top surface of the insulator 283 in a region overlapping with the conductor 246. Although FIG. 10B illustrates a structure in which the conductor 240 has a stacked-layer structure of the first and second conductors, the conductor 240 may have a single-layer structure or a stacked-layer structure. In the case where a stacked-layer structure is employed in this specification and the like, the layers may be distinguished by numbers corresponding to the formation order.

The transistor 200A includes a conductor 205 (a conductor 205a and a conductor 205b) embedded in the insulator 216, an insulator 222 over the insulator 216 and the conductor 205, an insulator 224 over the insulator 222, an oxide 230a over the insulator 224, an oxide 230b over the oxide 230a, an oxide 243 (an oxide 243a and an oxide 243b) and an oxide 230c that are over the oxide 230b, a conductor 242a over the oxide 243a, a conductor 242b over the oxide 243b, an oxide 230d over the oxide 230c, an insulator 250 over the oxide 230d, and a conductor 260 (a conductor 260a and a conductor 260b) that is over the insulator 250 and overlaps with part of the oxide 230c. The oxide 230c is in contact with the side surfaces of the oxides 243a and 243b and the conductors 242a and 242b. The insulator 282 is in contact with the top surfaces of the conductor 260, the insulator 250, the oxide 230d, the oxide 230c, and the insulator 280.

An opening reaching the oxide 230b is provided in the insulators 280 and 254. The oxide 230c, the oxide 230d, the insulator 250, and the conductor 260 are provided in the opening. In addition, in the channel length direction of the transistor 200A, the conductor 260, the insulator 250, the oxide 230d, and the oxide 230c are provided between the conductor 242a and the oxide 243a and the conductor 242b and the oxide 243b. The insulator 250 includes a region in contact with the side surface of the conductor 260 and a region in contact with the bottom surface of the conductor 260. The oxide 230c includes a region in contact with the oxide 230b, a region overlapping with the side surface of the conductor 260 with the oxide 230d and the insulator 250 therebetween, and a region overlapping with the bottom surface of the conductor 260 with the oxide 230d and the insulator 250 therebetween.

The oxide 230 preferably includes the oxide 230a over the insulator 224, the oxide 230b over the oxide 230a, the oxide 230c over and at least partly in contact with the oxide 230b, and the oxide 230d over the oxide 230c.

Although the transistor 200A includes the oxide 230 with a four-layer structure in which the oxide 230a, the oxide 230b, the oxide 230c, and the oxide 230d are stacked, the oxide 230 may have a single-layer structure or a stacked-layer structure. For example, the oxide 230 may be a single layer of the oxide 230b or has a two-layer structure of the oxide 230a and the oxide 230b, a two-layer structure of the oxide 230b and the oxide 230c, a three-layer structure of the oxide 230a, the oxide 230b, and the oxide 230c, a three-layer structure of the oxide 230a, the oxide 230b, and the oxide 230d, or a stacked-layer structure including five or more layers. Alternatively, each of the oxides 230a, 230b, 230c, and 230d may have a single-layer structure or a stacked-layer structure.

The conductor 260 functions as a first gate (top gate) electrode and the conductor 205 functions as a second gate (back gate) electrode. The insulators 250, 224, and 222 each function as a gate insulator. The conductor 242a functions as one of a source electrode and a drain electrode, and the conductor 242b functions as the other of the source electrode and the drain electrode. The oxide 230 functions as a channel formation region.

In the transistor 200A, the oxide 230 (the oxides 230a, 230b, 230c, and 230d), which includes a channel formation region, is preferably formed using a metal oxide functioning as a semiconductor (an oxide semiconductor).

The band gap of the metal oxide functioning as a semiconductor is preferably greater than or equal to 2.0 eV, further preferably greater than or equal to 2.5 eV. The use of a metal oxide having a wide band gap can reduce the off-state current of the transistor.

A transistor including an oxide semiconductor in a channel formation region has an extremely low leakage current (off-state current) in an off state; thus, a semiconductor device with low power consumption can be provided. In addition, an oxide semiconductor can be formed by a sputtering method or the like and thus can be used for a transistor included in a highly integrated semiconductor device.

For example, as the oxide 230, a metal oxide such as an In-M-Zn oxide containing indium, an element M, and zinc is used; the element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, cobalt, and the like. Alternatively, an In—Ga oxide, an In—Zn oxide, or indium oxide may be used as the oxide 230.

A transistor formed using an oxide semiconductor is likely to have its electrical characteristics changed by impurities and oxygen vacancies (Vo) in a channel formation region in the oxide semiconductor; as a result, the reliability is reduced, in some cases. Examples of impurities contained in an oxide semiconductor include hydrogen, nitrogen, alkali metal, alkaline earth metal, iron, nickel, and silicon.

In particular, hydrogen contained in an oxide semiconductor reacts with oxygen bonded to a metal atom, and thus causes $H_2O$ and an oxygen vacancy in some cases. In some cases, a defect that is an oxygen vacancy into which hydrogen enters (also referred to as VoH) generates an electron serving as a carrier. Furthermore, some hydrogen may react with oxygen bonded to a metal atom and generate an electron serving as a carrier. Therefore, a transistor including an oxide semiconductor containing hydrogen easily has normally-on characteristics (characteristics such that a channel exists without voltage application to a gate electrode and a current flows in a transistor).

A defect that is an oxygen vacancy into which hydrogen enters (VoH) can serve as a donor of the metal oxide. However, it is difficult to evaluate the defects quantitatively. Thus, in the metal oxide, the defects are evaluated by carrier concentration, not by donor concentration. Accordingly, in this specification and the like, carrier concentration is sometimes used for a parameter of a metal oxide when an electric field is not applied, instead of donor concentration. Hence, "carrier concentration" in this specification and the like can be replaced with "donor concentration" in some cases. In addition, "carrier concentration" in this specification and the like can be replaced with "carrier density".

Accordingly, it is preferable that hydrogen and oxygen vacancies in the channel formation region in the oxide semiconductor be reduced as much as possible. Specifically, the hydrogen concentration in the oxide 230, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. The oxide semiconductor preferably includes an i-type (intrinsic) or substantially i-type channel formation region with a low carrier concentration.

The oxide 230 preferably contains at least indium or zinc. In particular, indium and zinc are preferably contained. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, cobalt, and the like may be contained.

Note that in this specification and the like, a metal oxide containing nitrogen is also referred to as a metal oxide in some cases. A metal oxide containing nitrogen may be referred to as a metal oxynitride.

Metal oxides that can be used as the oxide 230 will be described in Embodiment 4 in detail.

The oxide 230 preferably has a stacked-layer structure of oxides with different chemical compositions. The oxide 230 preferably has a stacked-layer structure of oxides containing a common constituent element (element serving as a main component) besides oxygen.

Specifically, the atomic ratio of the element M to In in the metal oxide used as the oxide 230a or the oxide 230d is preferably higher than that in the metal oxide used as the oxide 230b or 230c. The greater the atomic ratio of the element M to In is, the higher the capability of inhibiting diffusion of impurities or oxygen is likely to be. Thus, when the oxide 230a is provided under the oxide 230b, impurities can be inhibited from being diffused into the oxide 230b from the components formed below the oxide 230a. Moreover, when the oxide 230d is provided over the oxide 230c, impurities can be inhibited from being diffused into the oxide 230c from the components formed above the oxide 230d.

In other words, the atomic ratio of In to the element M in the metal oxide used as the oxide 230b or 230c is preferably higher than that in the metal oxide used as the oxide 230a or the oxide 230d. In that case, a main carrier path is the oxide 230b, the oxide 230c, or the vicinity thereof, for example, the interface between the oxides 230b and 230c. The density of defect states at an interface between the oxides 230b and 230c can be made low when the oxide 230b and the oxide 230c contain a common constituent element (element serving as a main component) besides oxygen, whereby the influence of interface scattering on carrier conduction is small and a high on-state current can be obtained.

In order to make the oxide 230c serve as a main carrier path, the atomic ratio of indium to a metal element that is a main component in the oxide 230c is preferably higher than that in the oxide 230b. When a metal oxide having a high content of indium is used for a channel formation region, the on-state current of the transistor can be increased.

Furthermore, in order to make the oxide 230c serve as a main carrier path, the conduction band minimum of the oxide 230c is preferably more apart from the vacuum level than those of the oxides 230a, 230b, and 230d. In other words, the electron affinity of the oxide 230c is preferably larger than those of the oxides 230a, 230b, and 230d.

The oxides 230b and 230c preferably have crystallinity. In particular, for each of the oxides 230b and 230c, a c-axis-aligned crystalline oxide semiconductor (CAAC-OS) described later is preferably used. The oxide 230d may also have crystallinity.

The use of the CAAC-OS for each of the oxides 230b and 230c can reduce impurities and oxygen vacancies in a channel formation region in the oxide semiconductor. Thus, the transistor can have high reliability and stable electrical characteristics with a small variation.

In addition, oxygen extraction from the oxide 230b by the source or drain electrode can be inhibited. This inhibits extraction of oxygen from the oxide 230b even when heat treatment is performed; hence, the transistor 200A is stable against high temperatures in the manufacturing process (i.e., thermal budget).

The CAAC-OS facilitates oxygen transfer in the direction perpendicular to the c-axis of a CAAC structure. Accordingly, oxygen contained in the oxide 230c can be efficiently supplied to the oxide 230b.

The CAAC-OS is a metal oxide having a dense structure with high crystallinity and a low amount of impurities or defects (oxygen vacancies or the like). In particular, after a formation of a metal oxide, heat treatment is performed at a temperature at which the metal oxide does not become a polycrystal (e.g., 400° C. to 600° C.), whereby a CAAC-OS having a dense structure with higher crystallinity can be obtained. As the density of the CAAC-OS is increased in such a manner, diffusion of impurities or oxygen in the CAAC-OS can be reduced.

The oxide 230 includes a channel formation region of the transistor 200A and a pair of low-resistance regions (a source region and a drain region) provided to interpose the channel formation region. At least part of the channel formation region overlaps with the conductor 260. The conductor 242 (the conductor 242a and the conductor 242b) is provided over the oxide 230b, and a region having a lower resistance than the channel formation region is formed in the vicinity of the conductor 242.

The source and drain regions have an increased carrier concentration and a lowered resistance because of having a low oxygen concentration or containing impurities such as hydrogen, nitrogen, and a metal element, for example. In other words, the source and drain regions have a higher carrier concentration and a lower resistance than the channel formation region. The channel formation region has, for example, a higher oxygen concentration or a lower impurity concentration than the source and drain regions, and thus has a low carrier concentration and a high resistance.

In the oxide 230, the boundaries between the regions are difficult to clearly observe in some cases. The concentration of impurities such as hydrogen, nitrogen, and a metal element, which are detected in each region, may be gradually changed not only between the regions but also in each region. That is, the region closer to the channel formation region preferably has a lower concentration of impurities such as hydrogen, nitrogen, and a metal element.

In order to increase oxygen concentration in the channel formation region, an insulator containing oxygen that is released by heating (also referred to as excess oxygen) is provided in the vicinity of the oxide semiconductor so that the oxygen can be supplied from the insulator to the oxide semiconductor by heat treatment. As a result, oxygen vacancies in the channel formation region in the oxide semiconductor can be filled with the supplied oxygen. Furthermore, the supplied oxygen reacts with hydrogen remaining in the oxide semiconductor, so that the hydrogen can be removed as $H_2O$ (dehydrogenation). Thus, formation of VoH in the oxide semiconductor can be inhibited.

However, when an excess amount of oxygen is supplied to the source region or the drain region, the carrier concentration in the source region or the drain region is reduced, so that the on-state current or field-effect mobility of the transistor 200A might be decreased. Furthermore, the distribution of oxygen supplied to the source region or the drain region is uneven in the substrate plane, which leads to variation in the characteristics of the semiconductor device including the transistor.

Therefore, the oxide semiconductor preferably includes an i-type (intrinsic) or substantially i-type channel formation region with a low carrier concentration and n-type source and drain regions with a high carrier concentration. That is, it is preferable that oxygen be supplied to the channel formation region in the oxide semiconductor and the source and drain regions be not supplied with an excess amount of oxygen.

The insulator 254 is formed by a sputtering method, whereby oxygen can be implanted into the insulator 224, for example. Then, the oxygen implanted into the insulator 224 is supplied to the oxide 230b through the oxide 230c. Accordingly, oxygen can be selectively supplied to the oxide 230c and a region of the oxide 230b that is in contact with the oxide 230c, which account for a large portion of the channel formation region.

Moreover, when the above CAAC-OS having a dense structure is used as the oxide 230b, diffusion of impurities and oxygen in the oxide 230b can be reduced. Accordingly, the oxygen supplied to the channel formation region in the oxide 230b can be inhibited from being diffused into the source region and the drain region in the oxide 230b.

In such a manner, oxygen is selectively supplied to the channel formation region, so that the channel formation region can become i-type, and oxygen is inhibited from being diffused into the source region and the drain region, so that the source region and the drain region can remain n-type. As a result, a change in the electrical characteristics of the transistor 200A can be inhibited, and thus variation in the electrical characteristics of the transistors 200A in the substrate plane can be inhibited.

The oxide 230d preferably contains at least one of the metal elements contained in the metal oxide used as the oxide 230c, further preferably contains all of these metal elements. For example, an In-M-Zn oxide, an In—Zn oxide, or indium oxide is preferably used as the oxide 230c, and an In-M-Zn oxide, an M-Zn oxide, or an oxide of the element M is preferably used as the oxide 230d. Accordingly, the density of defect states at the interface of the oxide 230c and the oxide 230d can be reduced.

The oxide 230d is preferably a metal oxide that inhibits diffusion or transmission of much oxygen compared to the oxide 230c. When the oxide 230d is provided between the insulator 250 and the oxide 230c, diffusion of oxygen contained in the oxide 230c or the insulator 280 into the insulator 250 can be inhibited. Accordingly, the oxygen can be efficiently supplied to the oxide 230b through the oxide 230c. Furthermore, the conductor 260 can be prevented from being oxidized by the oxygen supplied through the insulator 250.

When the atomic ratio of In to the metal element that is a main component in the metal oxide used as the oxide 230d is lower than that in the metal oxide used as the oxide 230c, diffusion of In toward the insulator 250 can be inhibited. Since the insulator 250 functions as a gate insulator, the transistor shows poor characteristics when In enters the insulator 250 and the like. Thus, the oxide 230d provided between the oxide 230c and the insulator 250 allows the semiconductor device to have high reliability.

Here, the conduction band minimum is gradually varied at a junction portion of each of the oxides 230a, 230b, 230c, and 230d. In other words, the conduction band minimum at the junction portion of each of the oxides 230a, 230b, 230c, and 230d is continuously varied or continuously connected. To achieve this, the density of defect states in a mixed layer formed at the interface between the oxides 230a and 230b, the interface between the oxides 230b and 230c, and the interface between the oxides 230c and 230d is decreased.

When the oxides 230a and 230b, the oxides 230b and 230c, or the oxides 230c and 230d contain the same element as a main component in addition to oxygen, for example, a mixed layer with a low density of defect states can be formed. For example, in the case where the oxide 230b is an In-M-Zn oxide, an In-M-Zn oxide, an M-Zn oxide, an oxide of the element M, an In—Zn oxide, indium oxide, or the like may be used as each of the oxides 230a, 230c, and 230d.

Specifically, as the oxide 230a, a metal oxide having an atomic ratio of In:M:Zn=1:3:4 or in the vicinity thereof, or In:M:Zn=1:1:0.5 or in the vicinity thereof may be used. As the oxide 230b, a metal oxide having an atomic ratio of In:M:Zn=1:1:1 or in the vicinity thereof or In:M:Zn=4:2:3 or in the vicinity thereof may be used. As the oxide 230c, a metal oxide having an atomic ratio of In:M:Zn=4:2:3 or in the vicinity thereof, In:M:Zn=5:1:3 or in the vicinity thereof, or In:M:Zn=10:1:3 or in the vicinity thereof or indium oxide may be used. As the oxide 230d, a metal oxide having an atomic ratio of In:M:Zn=1:3:4 or in the vicinity thereof, M:Zn=2:1 or in the vicinity thereof, or M:Zn=2:5 or in the vicinity thereof or an oxide of the element M may be used. Note that the vicinity of the atomic ratio includes ±30% of an intended atomic ratio. Gallium is preferably used as the element M.

When the oxides 230a to 230d have the above composition, the density of defect states at the interface between the oxides 230a and 230b, the interface between the oxides 230b and 230c, and the interface between the oxides 230c and 230d can be made low. This reduces the influence of interface scattering on carrier conduction, and the transistor 200A can have a high on-state current and high frequency characteristics.

Furthermore, it is preferable that a groove be provided in the oxide 230b and the oxide 230c including the CAAC-OS be embedded therein. At this time, the oxide 230c is provided to cover an inner wall (a side wall and the bottom surface) of the groove.

The depth of the groove of the oxide 230b is preferably the same or substantially the same as the thickness of the oxide 230c. In other words, the top surface of the oxide 230c in a region overlapping with the oxide 230b is preferably level or substantially level with the interface between the oxides 230b and 243. For example, when the bottom surface of the insulator 222 is a reference, a difference between the height of the interface between the oxides 230b and 243 and the height of the interface between the oxides 230c and 230d is preferably smaller than or equal to the thickness of the oxide 230c, further preferably smaller than or equal to half of the thickness of the oxide 230c.

Such a structure reduces the effect of defects such as VoH and impurities in the transistor, whereby a channel can be formed in the oxide 230c. As a result, the transistor can obtain favorable electrical characteristics. Furthermore, a semiconductor device with less variation in transistor characteristics and high reliability can be provided.

Moreover, impurities at the interface between the oxides 230b and 230c and in the vicinity thereof are preferably reduced or removed. In the case where the element M is not aluminum, it is particularly preferable that impurities such as aluminum and silicon be reduced or removed because the impurities hinder an increase in the crystallinity or c-axis alignment of the oxides 230c and 230b. The concentration of aluminum atoms at the interface between the oxides 230b and 230c and in the vicinity thereof is preferably lower than or equal to 2.0 atomic %, further preferably lower than or equal to 1.5 atomic %, still further preferably lower than or equal to 1.0 atomic %, for example.

Note that in a metal oxide, a region having become an amorphous-like oxide semiconductor (a-like OS) where an increase in crystallinity or c-axis alignment is hindered by impurities such as aluminum and silicon is referred to as a non-CAAC region in some cases. In the non-CAAC region, a large amount of VoH is generated, so that it is highly possible that the transistor is easily become normally on. Accordingly, the non-CAAC region is preferably reduced or removed.

In contrast, since a dense crystal structure is formed in the oxides 230b and 230c having a CAAC structure, it is difficult for VoH to exist stably. Furthermore, in oxygen adding treatment described later, excess oxygen is supplied to the oxides 230b and 230c, whereby VoH and Vo in the oxides 230b and 230c can be reduced. When the oxides 230b and 230c have a CAAC structure as described above, the transistor can be inhibited from becoming normally on.

As illustrated in FIG. 10C, a curved surface may be provided between the side and top surfaces of the oxide 230b in a cross-sectional view in the channel width direction of the transistor 200A. That is, an end portion of the side surface and an end portion of the top surface may be curved.

The radius of curvature of the curved surface is preferably greater than 0 nm and less than the thickness of the oxide 230b in a region overlapping with the conductor 242, or less than half of the length of a region of the top surface of the oxide 230b that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the groove with the insulator 250 and the conductor 260, which are formed in a later step. Furthermore, reduction in the length of the region of the top surface of the oxide 230b that does not have the curved surface can be prevented, and decrease in the on-state current and mobility of the transistor 200A can be inhibited. Therefore, a semiconductor device having favorable electrical characteristics can be provided.

Note that the oxide 230c may be provided for each of the transistors 200A. The oxides 230c of two adjacent transistors 200A are not necessarily in contact with each other. When the oxide 230c is provided for each of the transistors 200A, generation of a parasitic transistor between two transistors can be inhibited, which inhibits generation of a leakage path along the conductor 260. Thus, a semiconductor device that has favorable electrical characteristics and can be miniaturized or highly integrated can be provided.

Note that each of the conductor 260 and the insulator 250 may be shared by adjacent transistors 200A. In other words, the conductor 260 of the transistor 200A includes a region continuous with the conductor 260 of the adjacent transistor 200A. In addition, the insulator 250 of the transistor 200A includes a region continuous with the insulator 250 of the adjacent transistor 200A.

In the above structure, the oxide 230d includes a region in contact with the insulator 224 between adjacent transistors 200A. Note that the oxide 230d of the transistor 200A may be apart from the oxide 230d of the adjacent transistor 200A. In that case, the insulator 250 includes a region in contact with the insulator 224 between the transistor 200A and the adjacent transistor 200A At least one of the insulators 212, 214, 254, 282, 283, and 286 preferably functions as a barrier insulating film that inhibits diffusion of impurities such as water and hydrogen into the transistor 200A from a portion above the transistor 200A. Thus, the insulators 212, 214, 254, 282, 283, and 286 are each preferably formed using an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms, that is, an insulating material through which the impurities are less likely to pass. Alternatively, the insulators 212, 214, 254, 282, 283, and 286 are each preferably formed using an insulating material having a function of inhibiting diffusion of oxygen (e.g., at least one of oxygen atoms and oxygen molecules), that is, an insulating material through which oxygen is less likely to pass.

Note that in this specification, a barrier insulating film refers to an insulating film having a barrier property. In this specification, a barrier property means a function of inhibiting diffusion of a particular substance (or low permeability) or a function of capturing or fixing (also referred to as gettering) a particular substance.

For example, it is preferable that the insulators 212 and 283 be formed using silicon nitride or the like, and the insulators 214, 254, and 282 be formed using aluminum oxide or the like. Accordingly, impurities such as water and hydrogen can be inhibited from diffusing to the transistor 200A side from the substrate side through the insulators 212 and 214. In addition, oxygen contained in the insulator 224 and the like can be inhibited from diffusing to the substrate side through the insulators 212 and 214. In this manner, the transistor 200A is preferably surrounded by the insulators 212, 214, 254, 282, and 283 having a function of inhibiting diffusion of oxygen and impurities such as water and hydrogen.

The resistivity of the insulators 212, 283, and 286 is preferably low in some cases. For example, the insulators 212, 283, and 286 with a resistivity of approximately $1\times10^{13}$ Ωcm can sometimes relieve charge buildup of the conductor 205, the conductor 242, the conductor 260, or the conductor 246 in the treatment using plasma or the like in the manufacturing process of a semiconductor device. The resistivity of the insulators 212, 283, and 286 is preferably higher than or equal to $1\times10^{10}$ Ωcm and lower than or equal to $1\times10^{15}$ Ωcm.

The insulators 216 and 280 preferably have a lower permittivity than the insulator 214. The use of a material having a low dielectric constant for the interlayer film can reduce the parasitic capacitance between wirings. For example, for the insulators 216 and 280, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate. Silicon oxide and silicon oxynitride are particularly preferable in terms of high thermal stability. Silicon oxide, silicon oxynitride, and porous silicon oxide are particularly preferable because a region containing oxygen that is released by heating can be easily formed in these materials.

The conductor 205 functions as a second gate electrode in some cases. In that case, by changing a potential applied to the conductor 205 independently of a potential applied to the conductor 260, the threshold voltage (Vth) of the transistor 200A can be controlled. In particular, by applying a negative potential to the conductor 205, Vth of the transistor 200A can be higher, and its off-state current can be reduced. This means that the conductor 205 with a negative potential can reduce drain current when 0 V is applied to the conductor 260, compared to the conductor 205 without a negative potential.

The conductor 205 is provided to overlap with the oxide 230 and the conductor 260.

As illustrated in FIG. 10A, the size of the conductor 205 is preferably larger than the size of a region of the oxide 230 that does not overlap with the conductors 242a and 242b. As illustrated in FIG. 10C, it is particularly preferable that the conductor 205 extend beyond the end portions of the oxides 230a and 230b that intersect with the channel width direction. That is, the conductor 205 and the conductor 260 preferably overlap with each other with the insulator positioned therebetween, in a region beyond the side surface of the oxide 230 in the channel width direction. With this structure, the channel formation region in the oxide 230 can be electrically surrounded by electric fields of the conductor 260 functioning as the first gate electrode and electric fields of the conductor 205 functioning as the second gate electrode. In this specification, a transistor structure in which the channel formation region is electrically surrounded by the electric fields of the first gate electrode and the second gate electrode is referred to as a surrounded channel (S-channel) structure.

In this specification and the like, the S-channel structure refers to a transistor structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

As illustrated in FIG. 10C, the conductor 205 is extended to have a function of a wiring. However, without limitation to this structure, a conductor functioning as a wiring may be provided under the conductor 205. In addition, the conductor 205 is not necessarily provided in each transistor. For example, the conductor 205 may be shared by a plurality of transistors.

Here, the conductor 205a is preferably formed using a conductive material which has a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms. Alternatively, the conductor 205a is preferably formed using a conductive material having a function of inhibiting diffusion of oxygen (e.g., at least one of oxygen atoms and oxygen molecules).

When a conductive material having a function of inhibiting oxygen diffusion is used for the conductor 205a, a reduction in conductivity of the conductor 205b due to oxidation of the conductor 205b can be inhibited. As a conductive material having a function of inhibiting oxygen diffusion, tantalum, tantalum nitride, ruthenium, or ruthenium oxide is preferably used, for example. The conductor 205a can therefore be a single layer or a stack of the above conductive materials. For example, the conductor 205a may be a stack of tantalum, tantalum nitride, ruthenium, or ruthenium oxide and titanium or titanium nitride.

A conductive material containing tungsten, copper, or aluminum as its main component is preferably used for the conductor 205b. Note that the conductor 205b is shown as a single layer but may have a stacked-layer structure, for example, a stack of titanium or titanium nitride and the above conductive material.

Although the transistor 200A in which the conductor 205 has a stacked-layer structure of the conductors 205a and 205b is illustrated, the conductor 205 may have a single-layer structure or a stacked-layer structure.

The insulator 222 preferably has a function of inhibiting diffusion of hydrogen (e.g., at least one of hydrogen atoms, hydrogen molecules, and the like). Moreover, the insulator 222 preferably has a function of inhibiting diffusion of oxygen (e.g., at least one of oxygen atoms, oxygen molecules, and the like). For example, the insulator 222 preferably has a function of inhibiting diffusion of much hydrogen and/or oxygen compared to the insulator 224.

As the insulator 222, an insulator containing an oxide of one or both of aluminum and hafnium, which are insulating materials, is preferably used. The insulator containing an oxide of one or both of aluminum and hafnium has a barrier property against oxygen, hydrogen, and water. As the insulator, aluminum oxide, hafnium oxide, an oxide containing aluminum and hafnium (hafnium aluminate), or the like is preferably used. The insulator 222 formed of such a material functions as a layer that inhibits release of oxygen from the oxide 230 to the substrate side and diffusion of impurities such as hydrogen from the periphery of the transistor 200A into the oxide 230. Thus, providing the insulator 222 can inhibit diffusion of impurities such as hydrogen into the transistor 200A and inhibit generation of oxygen vacancies in the oxide 230. The insulator 222 can also inhibit oxidization of the conductor 205 with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. The insulator 222 may have a stacked-layer structure including silicon oxide, silicon oxynitride, or silicon nitride over any of these insulators.

The insulator 222 may have, for example, a single-layer structure or a stacked-layer structure using an insulator containing a so-called high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST). With miniaturization and high integration of transistors, a problem such as generation of leakage current may arise because of a thinner gate insulator. When a high-k material is used for an insulator functioning as the gate insulator, a gate potential at the time of operating the transistor can be reduced while the physical thickness of the gate insulator is kept.

The insulator 224 in contact with the oxide 230 preferably releases oxygen by heating. For example, silicon oxide or silicon oxynitride can be used as appropriate for the insulator 224. When an insulator containing oxygen is provided in contact with the oxide 230, oxygen vacancies in the oxide 230 can be reduced, leading to an improvement in reliability of the transistor 200A.

For the insulator 224, it is preferable to use an insulating material having a region containing oxygen in excess of that in the stoichiometric composition (hereinafter also referred to as an excess-oxygen region). An oxide film including an excess oxygen region or excess oxygen is an oxide film in which the amount of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 400° C.

One or more of heat treatment, microwave treatment, and RF treatment may be performed in a state in which the insulator including an excess-oxygen region and the oxide 230 are in contact with each other. By the treatment, water or hydrogen in the oxide 230 can be removed. Some hydrogen is diffused in or trapped (also referred to as gettering) by the conductor 242 in some cases.

For the microwave treatment, for example, an apparatus having a power supply that generates high-density plasma or an apparatus having a power supply that applies RF to the substrate side is suitably used. For example, high-density oxygen radicals can be generated with the use of an oxygen-containing gas and high-density plasma, and by applying RF to the substrate side, the oxygen radicals generated by high-density plasma can be introduced into the oxide 230 or the insulator near the oxide 230 efficiently. The pressure in the microwave treatment is higher than or equal to 133 Pa, preferably higher than or equal to 200 Pa, further preferably higher than or equal to 400 Pa. As a gas introduced into an apparatus in which the microwave treatment is performed, for example, oxygen and argon are used and the oxygen flow rate ($O_2/(O2+Ar)$) is less than or equal to 50%, preferably greater than or equal to 10% and less than or equal to 30%. Note that the oxygen adding treatment performed on the oxide 230 can promote a reaction in which oxygen vacancies in the oxide 230 are filled with supplied oxygen. Furthermore, hydrogen remaining in the oxide 230 reacts with supplied oxygen, so that the hydrogen can be removed as $H_2O$ (dehydrogenation). This can inhibit recombination of hydrogen remaining in the oxide 230 with oxygen vacancies and formation of VoH.

Note that the insulators 222 and 224 may each have a stacked-layer structure of two or more layers. In that case, the stacked layers are not necessarily formed of the same material and may be formed of different materials.

The oxide 243 preferably has a function of inhibiting oxygen transmission. When the oxide 243, which has a function of inhibiting oxygen transmission, is provided between the conductor 242, functioning as the source electrode or the drain electrode, and the oxide 230b, the electrical resistance between the conductor 242 and the oxide 230b can be reduced, which is preferable. Such a structure improves the electrical characteristics and reliability of the transistor 200A. In the case where the electrical resistance between the conductor 242 and the oxide 230b can be sufficiently reduced, the oxide 243 is not necessarily provided.

A metal oxide containing the element M may be used as the oxide 243. In particular, aluminum, gallium, yttrium, or tin is preferably used as the element M. The concentration of the element M in the oxide 243 is preferably higher than that in the oxide 230b. Alternatively, gallium oxide may be used as the oxide 243. A metal oxide such as an In-M-Zn oxide may be used as the oxide 243. Specifically, the atomic ratio of the element M to In in the metal oxide used as the oxide 243 is preferably higher than that in the metal oxide used as the oxide 230b. The thickness of the oxide 243 ranges preferably from 0.5 nm to 5 nm, further preferably from 1 nm to 3 nm, still further preferably from 1 nm to 2 nm. The oxide 243 preferably has crystallinity. The oxide 243 with crystallinity efficiently inhibits release of oxygen from the oxide 230. When the oxide 243 has a hexagonal crystal structure, for example, release of oxygen from the oxide 230 can sometimes be inhibited.

For the conductor 242, for example, a nitride containing tantalum, a nitride containing titanium, a nitride containing molybdenum, a nitride containing tungsten, a nitride containing tantalum and aluminum, a nitride containing titanium and aluminum, or the like is preferably used. In this embodiment, a nitride containing tantalum is particularly preferable. As another example, ruthenium oxide, ruthenium nitride, oxide containing strontium and ruthenium, or oxide containing lanthanum and nickel may be used. These materials are preferable because they are a conductive material that is not easily oxidized or a material that maintains the conductivity even when absorbing oxygen.

There is a curved surface between the side and top surfaces of the conductor 242 in some cases. That is, the end portion of the side surface and the end portion of the top surface are curved in some cases. A radius of curvature of the curved surface at the end portion of the conductor 242 is greater than or equal to 3 nm and less than or equal to 10 nm, preferably greater than or equal to 5 nm and less than or equal to 6 nm. When the end portion is not angular, the coverage with films formed in the following film formation steps is improved.

When the oxide 243 is not provided, contact between the conductor 242 and the oxide 230b or 230c may make oxygen in the oxide 230b or 230c diffuse into the conductor 242, resulting in oxidation of the conductor 242. It is highly possible that oxidation of the conductor 242 lowers the conductivity of the conductor 242. Note that diffusion of oxygen from the oxide 230b or 230c into the conductor 242 can be interpreted as absorption of oxygen in the oxide 230b or 230c by the conductor 242.

When oxygen in the oxide 230b or 230c is diffused into the conductors 242a and 242b, layers are sometimes formed between the conductor 242a and the oxide 230b and between the conductor 242b and the oxide 230b or between the conductor 242a and the oxide 230c and between the conductor 242b and the oxide 230c. The layers contain more oxygen than the conductor 242a or 242b, so that the layers presumably have an insulating property. The three-layer structure of the conductor 242a or 242b, the layer, and the oxide 230b or 230c can be the structure with a metal, an insulator, and a semiconductor, which can be regarded as a metal-insulator-semiconductor (MIS) structure or a diode junction structure having an MIS structure as its main part.

Note that hydrogen contained in the oxide 230b, the oxide 230c, or the like is diffused into the conductor 242a or 242b in some cases. In particular, when a nitride containing tantalum is used for the conductors 242a and 242b, hydrogen contained in the oxide 230b, the oxide 230c, or the like is likely to be diffused into the conductor 242a or 242b, and the diffused hydrogen is bonded to nitrogen contained in the conductor 242a or 242b in some cases. That is, hydrogen contained in the oxide 230b, the oxide 230c, or the like is sometimes absorbed by the conductor 242a or 242b in some cases.

The insulator 254 is provided to cover the side surfaces of the oxides 230a, 230b, and 243 and the top and side surfaces of the conductor 242.

Thus, the insulator 254 preferably has a function of inhibiting oxygen diffusion. For example, it is preferable that the insulator 254 be more likely to inhibit diffusion of oxygen than the insulator 280. As the insulator 254, an insulator containing an oxide of one or both of aluminum and hafnium is formed, for example.

As the insulator 254, aluminum oxide or hafnium oxide is preferably formed in an oxygen-containing atmosphere by a bias sputtering method. The bias sputtering method is a method in which sputtering is performed while RF power is applied to a substrate. The potential of the substrate applied with the RF power becomes a negative potential (bias potential) with respect to a plasma potential, and cations in plasma are accelerated by the bias potential and implanted into the substrate. The bias potential can be controlled by the amount of RF power applied to the substrate. Therefore, aluminum oxide or hafnium oxide is formed by the bias sputtering method in an oxygen-containing atmosphere, whereby oxygen can be implanted into the insulator 224.

In the bias sputtering method, the amount of oxygen implanted into the insulator 224 serving as a base of the insulator 254 can be controlled by the amount RF power applied to the substrate. For example, as the RF power, a bias with the power density of 0.31 W/cm$^2$ or more, preferably 0.62 W/cm$^2$ or more, further preferably 1.86 W/cm$^2$ or more is applied to the substrate. In other words, an appropriate amount of oxygen for the transistor characteristics can be implanted by changing the amount of RF power used for the formation of the insulator 254. Moreover, an appropriate amount of oxygen for improving the reliability of the transistor can be implanted. The RF frequency is preferably 10 MHz or higher, typically 13.56 MHz. The higher the RF frequency is, the less damage to the substrate can be. Therefore, the amount of oxygen to be implanted into the insulator 224 can be controlled by adjusting the amount of RF power applied to the substrate, so that the optimal amount of oxygen can be implanted into the insulator 224.

Note that a bias applied to the substrate in the bias sputtering method is not limited to the RF power and may be a DC voltage.

As described above, although oxygen is implanted into the film serving as a base in the formation process of the insulator 254, the insulator 254 itself has a function of inhibiting oxygen transmission. Accordingly, when the insulator 280 is formed over the insulator 254 and oxygen is diffused from the insulator 280 in a later step, the oxygen can be prevented from being directly diffused from the insulator 280 into the oxides 230a, 230b, and 243 and the conductor 242.

With such an insulator 254, the oxides 230a, 230b, and 243 and the conductor 242 can be spaced from the insulator 280. Thus, oxygen can be prevented from being directly diffused from the insulator 280 into the oxides 230a, 230b, and 243 and the conductor 242. Accordingly, a reduction in the carrier concentration in the source and drain regions of the oxide 230 due to supply of excess oxygen to the source and drain regions can be prevented. Furthermore, the conductor 242 can be inhibited from being excessively oxidized to have a high resistivity, and thus a reduction in an on-state current can be inhibited.

The insulator 250 is preferably in contact with at least part of the oxide 230d. For example, for the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. Silicon oxide and silicon oxynitride are particularly preferable in terms of high thermal stability.

Like the insulator 224, the insulator 250 is preferably formed using an insulator from which oxygen is released by heating. When the insulator from which oxygen is released by heating is provided as the insulator 250 to be in contact with at least part of the oxide 230d, oxygen can be effectively supplied to the channel formation region in the oxide 230 and oxygen vacancies in the channel formation region in the oxide 230 can be reduced. Thus, the transistor can have high reliability and stable electrical characteristics with a small variation. Furthermore, as in the insulator 224, the concentration of impurities such as water and hydrogen in the insulator 250 is preferably lowered. The thickness of the insulator 250 is preferably greater than or equal to 1 nm and less than or equal to 20 nm.

Although the insulator 250 is a single layer in FIGS. 10B and 10C, a stacked-layer structure of two or more layers may be employed. In the case where the insulator 250 has a stacked-layer structure including two layers, it is preferable that a lower layer of the insulator 250 be formed using an insulator from which oxygen is released by heating and an upper layer of the insulator 250 be formed using an insulator having a function of inhibiting diffusion of oxygen. Owing to this structure, diffusion of oxygen contained in the lower layer of the insulator 250 into the conductor 260 can be inhibited. That is, a reduction in the amount of oxygen supplied to the oxide 230 can be inhibited. Moreover, oxidation of the conductor 260 due to oxygen contained in the lower layer of the insulator 250 can be inhibited. For example, the lower layer of the insulator 250 can be formed using the above-described material that can be used for the insulator 250, and the upper layer of the insulator 250 can be formed using a material similar to that for the insulator 222.

In the case where silicon oxide, silicon oxynitride, or the like is used for the lower layer of the insulator 250, the upper layer of the insulator 250 may be formed using an insulating material that is a high-k material having a high relative dielectric constant. The gate insulator having a stacked-layer structure of the lower layer of the insulator 250 and the upper layer of the insulator 250 can be thermally stable and can have a high dielectric constant. Accordingly, a gate potential applied during operation of the transistor can be reduced while the physical thickness of the gate insulator is kept. In addition, the equivalent oxide thickness (EOT) of the insulator functioning as the gate insulator can be reduced.

Specifically, for the upper layer of the insulator 250, a metal oxide containing one or more of hafnium, aluminum, gallium, yttrium, zirconium, tungsten, titanium, tantalum, nickel, germanium, magnesium, and the like or a metal oxide that can be used as the oxide 230 can be used. In particular, an insulator containing an oxide of one or both of aluminum and hafnium is preferably used.

Since the distance between the conductor 260 and the oxide 230 is kept by the physical thickness of the insulator 250 having a stacked-layer structure including two layers, leakage current between the conductor 260 and the oxide 230 can be reduced. Moreover, with the stacked-layer structure of the insulator 250, the physical distance between the conductor 260 and the oxide 230 and the intensity of electric fields applied from the conductor 260 to the oxide 230 can be easily adjusted as appropriate.

A metal oxide may be provided between the insulator 250 and the conductor 260. The metal oxide preferably prevents oxygen diffusion from the insulator 250 into the conductor 260. Providing the metal oxide that inhibits oxygen diffusion inhibits diffusion of oxygen from the insulator 250 into the conductor 260. That is, a reduction in the amount of oxygen supplied to the oxide 230 can be inhibited. Moreover, oxidation of the conductor 260 due to oxygen in the insulator 250 can be inhibited.

Note that the metal oxide preferably has a function of part of the first gate electrode. With the metal oxide, the on-state current of the transistor 200A can be increased without a reduction in the influence of the electric field applied from the conductor 260. For example, a metal oxide that can be used as the oxide 230 can be used as the metal oxide. In that case, when the conductor 260a is formed by a sputtering method, the metal oxide can have a reduced electrical resistance and become a conductor. Such a conductor can be referred to as an oxide conductor (OC) electrode.

The conductor 260 preferably includes the conductor 260a and the conductor 260b over the conductor 260a. For example, the conductor 260a is preferably positioned so as to cover the bottom and side surfaces of the conductor 260b. Note that as illustrated in FIGS. 10B and 10C, the top surface of the conductor 260 is substantially level with the top surfaces of the insulator 250, the oxide 230d, and the oxide 230c. Although FIGS. 10B and 10C show that the conductor 260 has a two-layer structure of the conductor 260a and the conductor 260b, the conductor 260 may have a single-layer structure or a stacked-layer structure of three or more layers.

Like the conductor 205a, the conductor 260a is preferably formed using a conductive material having a function of inhibiting diffusion of impurities. Alternatively, the conductor 260a is preferably formed using a conductive material having a function of inhibiting diffusion of oxygen.

When the conductor 260a has a function of inhibiting diffusion of oxygen, the conductivity of the conductor 260b can be prevented from being lowered because of oxidization of the conductor 260b due to oxygen in the insulator 250. As a conductive material having a function of inhibiting oxygen diffusion, tantalum, tantalum nitride, ruthenium, or ruthenium oxide is preferably used, for example.

The conductor 260 also functions as a wiring and thus is preferably a conductor having high conductivity. For example, a conductive material containing tungsten, copper, or aluminum as its main component can be used for the conductor 260b. The conductor 260b may have a stacked-layer structure, for example, a stacked-layer structure of titanium or titanium nitride and the above conductive material.

In the transistor 200A, the conductor 260 is formed in a self-aligned manner so as to fill an opening formed in the insulator 280 and the like. In this manner, the conductor 260 can surely be provided in a region between the conductor 242a and the conductor 242b without alignment.

As illustrated in FIG. 10C, in the channel width direction of the transistor 200A, the bottom surface of the conductor 260 in a region that does not overlap with the oxide 230b is preferably lower in level than the bottom surface of the oxide 230b. When the conductor 260 functioning as the gate electrode covers the side and top surfaces of the channel formation region in the oxide 230b with the insulator 250 and the like therebetween, the electric field of the conductor 260 is likely to affect the entire channel formation region in the oxide 230b. Hence, the transistor 200A can have a higher on-state current and higher frequency characteristics. With the level of the bottom surface of the insulator 222 as a reference, a distance between the bottom surface of the conductor 260 and the bottom surfaces of the oxide 230b in a region where the conductor 260 does not overlap with the oxides 230a and 230b is greater than or equal to 0 nm and less than or equal to 100 nm, preferably greater than or equal to 3 nm and less than or equal to 50 nm, and further preferably greater than or equal to 5 nm and less than or equal to 20 nm.

The insulator 280 is provided over the insulator 254. The top surface of the insulator 280 may be planarized.

The concentration of impurities such as water and hydrogen in the insulator 280 is preferably reduced. Moreover, the insulator 280 preferably has a low hydrogen concentration and includes an excess-oxygen region or excess oxygen, and may be formed using a material similar to that for the insulator 216, for example. The insulator 280 may have a stacked-layer structure of the above materials; silicon oxide formed by a sputtering method and silicon oxynitride formed by a chemical vapor deposition (CVD) method thereover. Silicon nitride can be stacked over the above stacked structure.

The conductor 240 is preferably formed using a conductive material containing tungsten, copper, or aluminum as its main component. The conductor 240 may have a stacked-layer structure. In the case where the conductor 240 has a stacked-layer structure, a conductive material having a function of inhibiting transmission of impurities such as water and hydrogen is preferably used as a conductor in contact with the insulators 283, 282, 280, and 254. For example, tantalum, tantalum nitride, titanium, titanium nitride, ruthenium, or ruthenium oxide is preferably used. The conductive material having a function of inhibiting transmission of impurities such as water and hydrogen can be used as a single layer or stacked layers. Furthermore, impurities such as water and hydrogen contained in the components above the insulator 283 can be prevented from entering the oxide 230 through the conductors 240a and 240b.

An insulator such as silicon nitride, aluminum oxide, or silicon nitride oxide may be used as the insulators 241a and 241b, for example. Since the insulators 241a and 241b are provided in contact with the insulator 254, impurities such as water and hydrogen contained in the insulator 280 or the like can be prevented from entering the oxide 230 through the conductors 240a and 240b. Silicon nitride is particularly preferable because of its high blocking property against hydrogen. Furthermore, oxygen contained in the insulator 280 can be prevented from being absorbed by the conductors 240a and 240b.

The conductor 246 (the conductors 246a and 246b) functioning as a wiring may be provided in contact with the top surfaces of the conductors 240a and 240b. The conductor 246 is preferably formed using a conductive material containing tungsten, copper, or aluminum as its main component. The conductor may have a stacked-layer structure, for example, a stack of titanium or titanium nitride and the above conductive material. Note that the conductor may be formed to be provided to fill an opening in an insulator.

The insulator 286 is provided over the conductor 246 and the insulator 283. Accordingly, the top and side surfaces of the conductor 246 are in contact with the insulator 286, and the bottom surface of the conductor 246 is in contact with the insulator 283. In other words, the conductor 246 can be surrounded by the insulators 283 and 286. The structure can inhibit transmission of oxygen from the outside and oxidation of the conductor 246. Furthermore, this can inhibit diffusion of impurities such as water and hydrogen from the conductor 246 to the outside, which is preferable.

As a substrate where the transistor 200A is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, or gallium oxide. Other examples include a semiconductor substrate in which an insulator region is provided in the above semiconductor substrate such as an SOI substrate. Examples of the conductor substrate include a graphite substrate, a metal substrate, an alloy substrate, and a conductive resin substrate. A substrate containing a nitride of a metal, a substrate including an oxide of a metal, or the like can also be used. Moreover, an insulator substrate provided with a conductor or a semiconductor, a semiconductor substrate provided with a conductor or an insulator, a conductor substrate provided with a semiconductor or an insulator, or the like may be used. Alternatively, any of these substrates provided with an element may be used. Examples of the element provided over the substrate include a capacitor, a resistor, a switching element, a light-emitting element, and a memory element.

Examples of an insulator included in the semiconductor device include an insulating oxide, an insulating nitride, an insulating oxynitride, an insulating nitride oxide, an insulating metal oxide, an insulating metal oxynitride, and an insulating metal nitride oxide.

With miniaturization and high integration of transistors, for example, a problem such as generation of leakage current or the like may arise because of a thinner gate insulator. When a high-k material is used for an insulator functioning as a gate insulator, the driving voltage of the transistor can be reduced while the physical thickness of the gate insulator is kept. On the other hand, when a material having a low dielectric constant is used for an insulator functioning as an interlayer film, the parasitic capacitance between wirings can be reduced. A material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

A transistor including a metal oxide can have stable electrical characteristics when surrounded by an insulator having a function of inhibiting transmission of oxygen and impurities such as hydrogen. The insulator having a function of inhibiting transmission of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, silicon nitride oxide, or silicon nitride can be used.

An insulator functioning as a gate insulator preferably includes a region containing oxygen that is released by heating. For example, silicon oxide or silicon oxynitride that includes a region containing oxygen that is released by heating is provided in contact with the oxide 230 to compensate for the oxygen vacancies in the oxide 230.

For the conductor included in the semiconductor device, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electric conductivity, typified by polycrystalline silicon containing an impurity element such as phosphorus, or silicide such as nickel silicide may be used.

Conductive layers formed using any of the above materials may be stacked. For example, a stacked-layer structure combining a material containing any of the above metal elements and a conductive material containing oxygen may be used. Alternatively, a stacked-layer structure combining a material containing any of the above metal elements and a conductive material containing nitrogen may be used. Further alternatively, a stacked-layer structure combining a material containing any of the above metal elements, a conductive material containing oxygen, and a conductive material containing nitrogen may be used.

When an oxide is used for the channel formation region of the transistor, the conductor functioning as the gate electrode preferably employs a stacked-layer structure using a material containing any of the above metal elements and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide in which the channel is formed. A conductive material containing any of the above metal elements and nitrogen may be used. For example, a conductive material containing nitrogen, such as titanium nitride or tantalum nitride, can be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide in which the channel is formed can be captured in some cases. Hydrogen entering from a surrounding insulator or the like can also be captured in some cases.

Figure 11A:
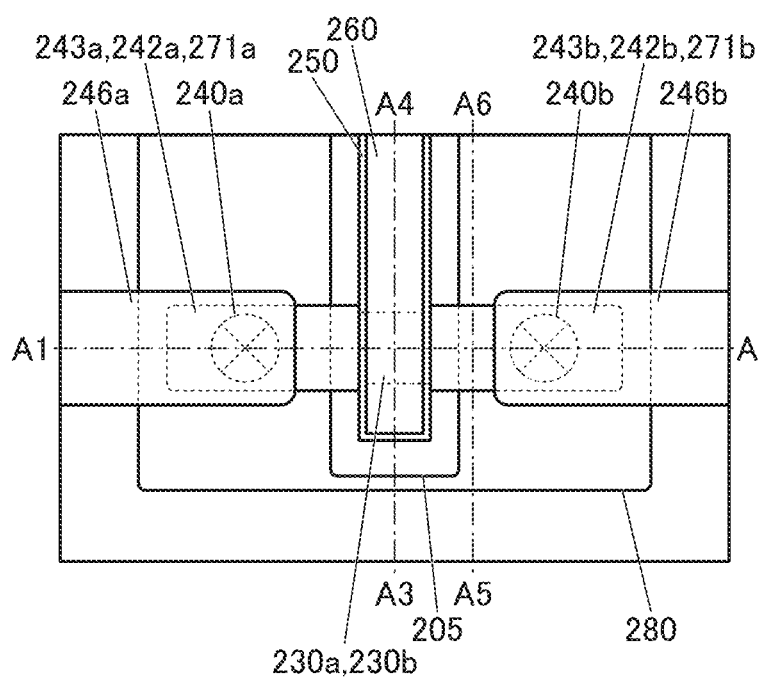
FIG. 11A is a top view showing an example of a semiconductor device.
Figure 11C:
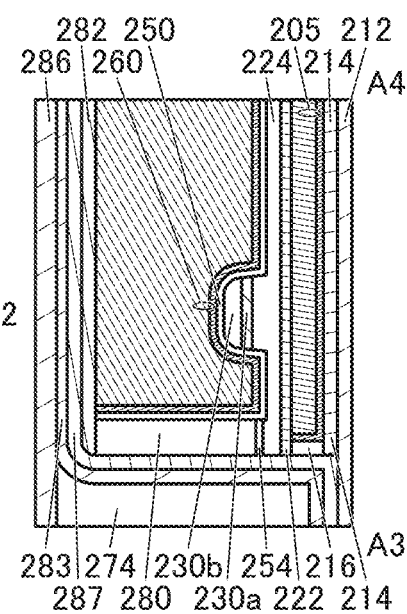
FIGS. 11B to 11D are cross-sectional views showing an example of the semiconductor device.
Figure 11B:
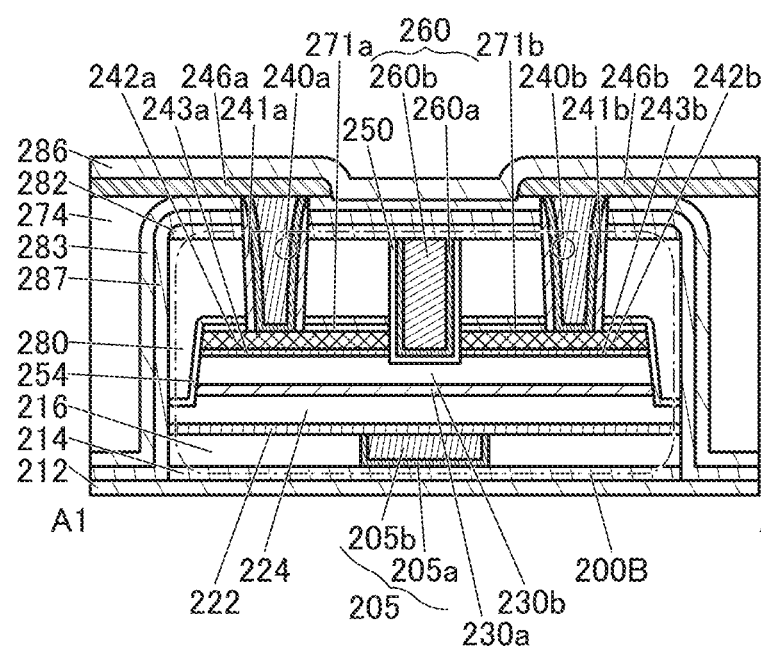
Figure 11D:
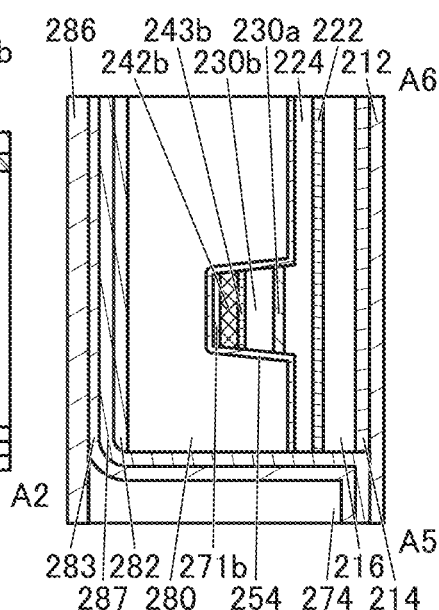

FIGS. 11A to 11D illustrate a semiconductor device including a transistor 200B. FIG. 11A is a top view of the semiconductor device, and FIGS. 11B, 11C, and 11D are cross-sectional views taken along dashed-dotted lines A1-A2, A3-A4, and A5-A6 illustrated in FIG. 11A, respectively. FIG. 11B can also be referred to as a cross-sectional view of the transistor 200B in the channel length direction. FIG. 11C can also be referred to as a cross-sectional view of the transistor 200B in the channel width direction. Note that for simplification, some components are not illustrated in FIG. 11A.

The transistor 200B is different from the transistor 200A in that the shape of the insulator 283 is different from that in the transistor 200A, insulators 287, 274, 271a, and 271b are included, and the oxides 230c and 230d are not included.

In the semiconductor device illustrated in FIGS. 11A to 11D, the insulators 214, 216, 222, 224, 254, 280, and 282 are patterned. The insulators 287 and 283 cover the insulators 214, 216, 222, 224, 254, 280, and 282. That is, the insulator 287 is in contact with the top surface of the insulator 212, the side surfaces of the insulators 214, 216, 222, 224, 254, 280, and 282, and the top surface of the insulator 282, and the insulator 283 is in contact with the top and side surfaces of the insulator 287. Accordingly, the oxide 230, the insulators 214, 216, 222, 224, 254, 280, and 282, and the like are separated from the outside by the insulators 287, 283, and 212. In other words, the transistor 200B is placed in a region sealed by the insulators 287, 283, and 212.

The insulators 214, 282, and 287 are preferably formed using a material having a function of capturing and fixing hydrogen, and the insulators 212 and 283 are preferably formed using a material having a function of inhibiting diffusion of hydrogen and oxygen. Typically, aluminum oxide can be used for the insulators 214, 282, and 287, and silicon nitride can be used for the insulators 212 and 283.

With the above structure, entry of hydrogen contained in the region outside the sealed region into the sealed region can be inhibited. Thus, the hydrogen concentration in the transistor can kept low.

Note that although the insulators 212, 287, and 283 are each a single layer in the transistor 200B illustrated in FIGS. 11A to 11D, the insulators 212, 287, and 283 may each shave a single-layer structure or a stacked-layer structure.

The insulator 287 is not necessarily provided. When the insulator 287 is not provided, the transistor 200B is provided in a region sealed by the insulators 212 and 283. With the above structure, entry of hydrogen contained in the region outside the sealed region into the sealed region can be inhibited. Thus, the hydrogen concentration in the transistor can be kept low.

The insulator 274 functions as an interlayer film. The insulator 274 preferably has a lower permittivity than the insulator 214. The use of a material having a low dielectric constant for the interlayer film can reduce the parasitic capacitance between wirings. The insulator 274 can be formed using a material similar to that for the insulator 280, for example.

The insulating film to be the insulator 274 is preferably formed by a sputtering method. A film formed by a sputtering method is preferable because of its low hydrogen concentration. Therefore, an increase in the hydrogen concentration in the transistor in the step of forming the insulating film can be inhibited.

Note that it is preferable to form the insulators 287 and 283 and the above-described insulating film successively without exposure to the air. Film formation without exposure to the air can prevent attachment of impurities or moisture from the air onto the insulators 287 and 283, so that an interface between the insulators 287 and 283 and the vicinity of thereof and an interface between the insulator 283 and the above-described insulating film and the vicinity of thereof can be kept clean. Moreover, the manufacturing process of the semiconductor device can be simplified.

In the semiconductor device illustrated in FIG. 11, the insulator 271a is provided between the conductor 242a and the insulator 254, and the insulator 271b is provided between the conductor 242b and the insulator 254.

Here, the insulators 271a and 271b preferably have a function of inhibiting oxygen diffusion. The structure enables less absorption of excess oxygen in the insulator 280 into the conductors 242a and 242b functioning as the source electrode and the drain electrode. Furthermore, by inhibiting oxidation of the conductors 242a and 242b, an increase in the contact resistance between the transistor 200B and a wiring can be inhibited. Consequently, the transistor 200B can have favorable electrical characteristics and reliability. The insulators 271a and 271b can be formed using a material similar to that for forming the insulator 254, for example.

In the manufacturing method of the semiconductor device illustrated in FIGS. 11A to 11D, an insulating film to be the insulators 271a and 271b and a conductive layer provided over the insulating film can each function as a mask when the conductor 242 is formed. Thus, an end portion at the intersection of the side surface and the top surface of the conductor 242 (the conductor 242a and the conductor 242b) is angular. The cross-sectional area of the conductor 242 is larger in the case where an end portion at the intersection of the side surface and the top surface of the conductor 242 is angular than in the case where the end portion is rounded. Accordingly, the resistance of the conductor 242 is reduced, so that the on-state current of the transistor 200B can be increased.

When the oxides 230c and 230d are not provided, generation of a parasitic transistor between two adjacent transistors 200B can be inhibited, which inhibits generation of a leakage path along the conductor 260. Thus, a semiconductor device that has favorable electrical characteristics and can be miniaturized or highly integrated can be provided.

This embodiment can be combined with the other embodiments as appropriate.

Embodiment 3

In this embodiment, a pixel of a display device of one embodiment of the present invention will be described with reference to FIG. 12.

[Pixel]

A display device of this embodiment includes a plurality of pixels arranged in a matrix of m rows and n columns (m and n are each an integer of 1 or more). FIG. 12 shows an example of a circuit diagram of a pixel 200($i,j$) (i is an integer of 1 or more and m or less, and j is an integer of 1 or more and n or less).

Figure 12:
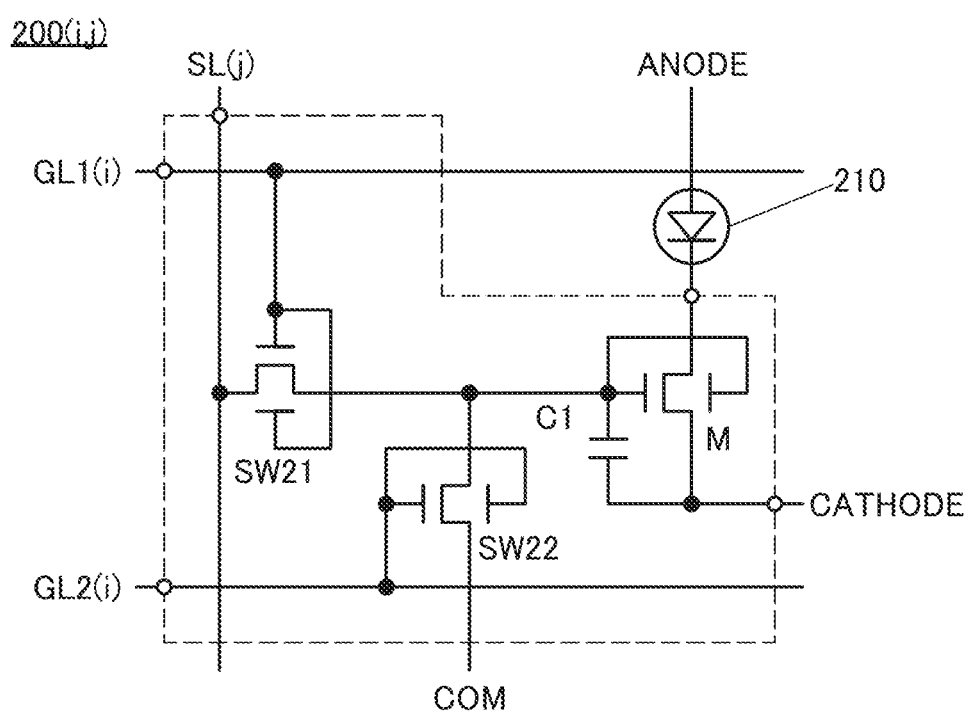
FIG. 12 is a circuit diagram showing an example of a pixel of a display device.

The pixel 200($i,j$) illustrated in FIG. 12 includes a light-emitting element 210, a switch SW21, a switch SW22, a transistor M, and a capacitor C1.

In this embodiment, a transistor is used as the switch SW21. A gate of the switch SW21 is electrically connected to a scan line GL1($i$). One of a source and a drain of the switch SW21 is electrically connected to a signal line SL(j) and the other of the source and the drain is electrically connected to a gate of the transistor M.

In this embodiment, a transistor is used as the switch SW22. A gate of the switch SW22 is electrically connected to a scan line GL2($i$). One of a source and a drain of the switch SW22 is electrically connected to a wiring COM and the other of the source and the drain is electrically connected to the gate of the transistor M.

The gate of the transistor M is electrically connected to one electrode of the capacitor C1, the other of the source and the drain of the switch SW21, and the other of the source and the drain of the switch SW22. One of a source and a drain of the transistor M is electrically connected to a wiring CATHODE and the other of the source and the drain is electrically connected to a cathode of the light-emitting element 210.

The other electrode of the capacitor C1 is electrically connected to the wiring CATHODE.

An anode of the light-emitting element 210 is electrically connected to a wiring ANODE.

The scan line GL1($i$) has a function of supplying a selection signal. The scan line GL2($i$) has a function of supplying a control signal. The signal line SL(j) has a function of supplying an image signal. A constant potential is supplied to each of the wiring COM, the wiring CATHODE, and the wiring ANODE. In the light-emitting element 210, the anode side can have a high potential and the cathode side can have a lower potential than the anode side.

The switch SW21 is controlled by a selection signal and functions as a selection transistor for controlling the selection state of the pixel 200($i,j$).

The transistor M functions as a driving transistor that controls a current flowing through the light-emitting element 210 in accordance with a potential supplied to the gate. When the switch SW21 is on, an image signal supplied to the signal line SL(j) is supplied to the gate of the transistor M, and the luminance of the light-emitting element 210 can be controlled in accordance with the potential of the image signal.

The switch SW22 has a function of controlling the gate potential of the transistor M on the basis of a control signal. Specifically, the switch SW22 can supply a potential for turning off the transistor M to the gate of the transistor M.

The switch SW22 can be used to control the pulse width, for example. During a period based on a control signal, a current can be supplied from the transistor M to the light-emitting element 210. The light-emitting element 210 can express gray levels on the basis of an image signal and a control signal.

Here, as each of the transistors included in the pixel 200(0, it is preferable to use a transistor including a metal oxide (an oxide semiconductor) for a semiconductor layer where a channel is formed.

A transistor including a metal oxide which has a wider bandgap and a lower carrier density than silicon has an extremely low off-state current. Therefore, owing to the low off-state current, a charge accumulated in a capacitor that is series-connected to the transistor can be retained for a long time. Thus, in particular, a transistor including an oxide semiconductor is preferably used as each of the switches SW21 and SW22 series-connected to the capacitor C1. When each of the other transistors also includes an oxide semiconductor, manufacturing cost can be reduced.

Alternatively, a transistor including silicon as a semiconductor in which a channel is formed can be used as the transistor included in the pixel 200(i,j). It is particularly preferable to use silicon with high crystallinity such as single crystal silicon or polycrystalline silicon because high field-effect mobility can be achieved and higher-speed operation can be performed.

Alternatively, a structure may be employed in which a transistor including an oxide semiconductor is used as one or more of the transistors included in the pixel 200(i,j), and a transistor including silicon is used as the other transistor(s).

Note that although the transistor is an n-channel transistor in FIG. 12, a p-channel transistor can also be used.

There is no particular limitation on the structure of the transistor in the display device. For example, a planar transistor, a staggered transistor, or an inverted staggered transistor may be used. A top-gate transistor or a bottom-gate transistor may be used. Gate electrodes may be provided above and below a channel.

As the transistor included in the display device, an OS transistor can be used, for example. Therefore, a transistor with an extremely low off-state current can be provided.

Furthermore, a Si transistor may be used as the transistor included in the display device. Examples of the transistor include a transistor containing amorphous silicon, a transistor containing crystalline silicon (typically, low-temperature polysilicon), and a transistor containing single crystal silicon.

This embodiment can be combined with the other embodiments as appropriate.

Embodiment 4

Described in this embodiment is a metal oxide (also referred to as an oxide semiconductor) applicable to an OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor will be explained with FIG. 13A. FIG. 13A is a diagram showing the classification of crystal structures of an oxide semiconductor, typically IGZO (a metal oxide containing In, Ga, and Zn).

The oxide semiconductor is classified into "amorphous", "crystalline", and "crystal", as shown in FIG. 13A. "Amorphous" includes a completely amorphous structure. "Crystalline" includes c-axis-aligned crystalline (CAAC), nanocrystalline (nc), and cloud-aligned composite (CAC) structures. Note that "crystalline" excludes single crystal, poly crystal, and completely amorphous structures. "Crystal" includes single crystal and poly crystal structures.

The structure shown in the thick frame in FIG. 13A is a new crystalline phase, which is an intermediate state between "amorphous" and "crystal". That is, this structure is completely different from "amorphous" and "crystal", which are energetically unstable.

A crystal structure of a film or a substrate can be analyzed with an X-ray diffraction (XRD) spectrum. Here, XRD spectra of a quartz glass substrate and an IGZO film having a crystal structure classified into "Crystalline" (also referred to as Crystalline IGZO), which are obtained by grazing-incidence XRD (GIXD) measurement, are shown in FIGS. 13(B) and 13(C), respectively. Note that a GIXD method is also referred to as a thin film method or a Seemann-Bohlin method. Hereinafter, the XRD spectra shown in FIGS. 13B and 13C, which are obtained by the GIXD measurement, are simply referred to as XRD spectra. FIG. 13B shows the XRD spectrum of the quartz glass substrate and FIG. 13C shows the XRD spectrum of the crystalline IGZO film. Note that the crystalline IGZO film of FIG. 13C has an atomic ratio of approximately In:Ga:Zn=4:2:3. The crystalline IGZO film of FIG. 13C has a thickness of 500 nm.

The peak of the XRD spectrum of the quartz glass substrate has a bilaterally symmetrical shape, as shown by the arrows in FIG. 13B. On the other hand, the peak of the XRD spectrum of the crystalline IGZO film has a bilaterally asymmetrical shape, as shown by arrows in FIG. 13C. The bilaterally asymmetrical peak shows the existence of crystal in the film or the substrate. In other words, the crystal structure of the film or the substrate cannot be regarded as "amorphous" unless it has a bilaterally symmetrical peak in the XRD spectrum. Note that in FIG. 13C, an IGZO crystal phase is explicitly denoted at 2θ of 31° or in the vicinity thereof. The bilaterally asymmetrical peak of the XRD spectrum is probably attributed to a diffraction peak derived from such a crystal phase (a fine crystal).

Specifically, interference of an X-ray scattered by atoms contained in IGZO probably contributes to a peak at 2θ=34° or in the vicinity thereof. In addition, the fine crystal probably contributes to the peak at 2θ=31° or in the vicinity thereof. In the XRD spectrum of the crystalline IGZO film shown in FIG. 13C, the peak at 2θ of 34° or in the vicinity thereof is wide on the lower angle side. This indicates that the crystalline IGZO film includes a fine crystal attributed to the peak at 2θ of 31° or in the vicinity thereof.

A crystal structure of a film or a substrate can be analyzed with a diffraction pattern obtained by nanobeam electron diffraction (NBED) (also referred to as a nanobeam electron diffraction pattern). Diffraction patterns of the quartz glass substrate and the IGZO film formed with a substrate temperature set at room temperature are shown in FIGS. 13D and 13E, respectively. FIG. 13D shows the diffraction pattern of the quartz glass substrate and FIG. 13E shows the diffraction pattern of the IGZO film. Note that the IGZO film of FIG. 13E is formed by a sputtering method using an In—Ga—Zn oxide target having an atomic ratio of In:Ga:Zn=1:1:1. The nanobeam electron diffraction is performed with an electron beam with a probe diameter of 1 nm.

Note that as shown in FIG. 13D, a halo pattern is observed in the diffraction pattern of the quartz glass substrate, which indicates that the quartz glass substrate is in an amorphous state. As shown in FIG. 13E, not a halo pattern but a spot-like pattern is observed in the diffraction pattern of the IGZO film formed at room temperature. Thus, it is presumed that the IGZO film formed at room temperature is in an intermediate state, which is neither a crystal state nor an amorphous state, and it cannot be concluded that the IGZO film is in an amorphous state.

<<Oxide Semiconductor Structure>>

Oxide semiconductors might be classified in a manner different from the above-described one shown in FIG. 13A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. A polycrystalline oxide semiconductor, an amorphous-like oxide semiconductor (a-like OS), and an amorphous oxide semiconductor are also given as examples of the non-single-crystal oxide semiconductors.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

Furthermore, in an In-M-Zn oxide (the element M is one or more of aluminum, gallium, yttrium, tin, titanium, and the like), the CAAC-OS tends to have a layered crystal structure (also referred to as a layered structure) in which a layer containing indium (In) and oxygen (hereinafter, In layer) and a layer containing the element M, zinc (Zn), and oxygen (hereinafter, (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using a θ/2θ scan, for example, a peak indicating c-axis alignment is detected at 2θ=31° or in the vicinity thereof. Note that the position of the peak indicating c-axis alignment (the value of 2θ) may change depending on the kind, composition, or the like of the metal element contained in the CAAC-OS.

Moreover, in the electron diffraction pattern of the CAAC-OS film, a plurality of bright spots appear, for example. Note that one spot and another spot are symmetric with respect to a spot of the incident electron beam which passes through a sample (also referred to as a direct spot).

In the case where the crystal region is observed from the above-described specific direction, the shape of the lattice alignment in the crystal region is basically a hexagon but is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is a so-called poly crystal structure. It is highly possible that the grain boundary serves as a recombination center and traps a carrier, and thus the on-state current and field-effect mobility of a transistor are decreased, for example. Thus, the CAAC-OS in which no clear grain boundary is observed is one of oxides with crystallinity having a favorable crystal structure for a semiconductor layer of a transistor. Note that the CAAC-OS preferably contains Zn. For example, an In—Zn oxide and an In—Ga—Zn oxide are suitable because generation of grain boundaries can be better prevented than in an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Thus, an oxide semiconductor including the CAAC-OS is physically stable. Accordingly, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is greater than or equal to 1 nm and less than or equal to 10 nm, in particular, greater than or equal to 1 nm and less than or equal to 3 nm, and thus the fine crystal is also referred to as a nanocrystal. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method. For example, when the nc-OS film is subjected to structural analysis by out-of-plane XRD measurement with an XRD apparatus using a θ/2θ scan, no peak indicating crystallinity is detected. Furthermore, a halo pattern is found in a selected-area electron diffraction pattern of the nc-OS film obtained by using an electron beam having a probe diameter larger than the diameter of a nanocrystal (e.g., larger than or equal to 50 nm). Meanwhile, in some cases, a plurality of spots are observed in a ring-like region whose center is a direct spot in an electron diffraction pattern (also referred to as nanobeam electron diffraction pattern) of the nc-OS film, which is obtained using an electron beam with a probe diameter close to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Oxide Semiconductor Structure>>

Next, the above-described CAC-OS will be described in detail. Note that the CAC-OS relates to the material composition.

[CAC-OS]

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 3 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

The CAC-OS has a composition in which materials are separated into a first region and a second region, and a mosaic pattern is formed. The first regions are distributed in the film. Hereinafter, this composition is also referred to as a cloud-like composition. In other words, the CAC-OS is a composite metal oxide having a composition in which the first regions and the second regions are mixed.

Here, the atomic ratios of In, Ga, and Zn to a metal element included in a CAC-OS in an In—Ga—Zn oxide are expressed as [In], [Ga], and [Zn], respectively. For example, the first region of the CAC-OS in the In—Ga—Zn oxide has [In], which is greater than that in the composition of a CAC-OS film. In addition, the second region of the CAC-OS in the In—Ga—Zn oxide has [Ga], which is greater than that in the composition of the CAC-OS film. Alternatively, for example, [In] of the first region is greater than that in the second region, and [Ga] of the first region is less than that in the second region. In addition, [Ga] of the second region is greater than that in the first region, and [In] of the second region is less than that in the first region.

Specifically, the first region includes indium oxide, indium zinc oxide, or the like as a main component. The second region includes gallium oxide, gallium zinc oxide, or the like as a main component. That is, the first region can also be referred to as a region containing In as a main component. The second region can also be referred to as a region containing Ga as a main component.

Note that a boundary between the first region and the second region is not clearly observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is intentionally not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of film formation is preferably as low as possible, and for example, the flow ratio of an oxygen gas is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a composition in which the regions containing In as a main component (the first regions) and the regions containing Ga as a main component (the second regions) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (on/off function). That is, a CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, a high on-state current (Ion), a high field-effect mobility (4 and favorable switching operation can be achieved.

A transistor including a CAC-OS is highly reliable. Thus, the CAC-OS is suitably used in a variety of semiconductor devices typified by a display device.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

The transistor preferably has an oxide semiconductor with a low carrier concentration. For example, the carrier density of a metal oxide is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier density of an oxide semiconductor film, the impurity concentration in the oxide semiconductor film is reduced so that the density of defect states can be reduced. In this specification and the like, a state with a low concentration of impurities and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce impurity concentrations in the oxide semiconductor. In order to reduce the concentration of impurities in the oxide semiconductor, impurity concentrations in a film that is adjacent to the oxide semiconductor is preferably reduced. Examples of impurities include hydrogen, nitrogen, alkali metal, alkaline earth metal, iron, nickel, and silicon.

<Impurities>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated, in some cases. Accordingly, a transistor including an oxide semiconductor that contains alkali metal or alkaline earth metal tends to have normally-on characteristics. Thus, the concentration of alkali metal or alkaline earth metal in the oxide semiconductor measured by SIMS is set lower than or equal to $1\times10^{18}$ atoms/cm$^3$, and preferably lower than or equal to $2\times10^{16}$ atoms/cm$^3$.

An oxide semiconductor containing nitrogen easily becomes n-type by generation of electrons serving as carriers and an increase in carrier concentration. A transistor including an oxide semiconductor that contains nitrogen as the semiconductor tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, can be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Hydrogen contained in an oxide semiconductor reacts with oxygen, which reacts with metal atoms, to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. Accordingly, hydrogen in the oxide semiconductor is preferably reduced as much as possible. Specifically, the hydrogen concentration in the oxide semiconductor measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

An oxide semiconductor with sufficiently reduced impurities is used for a channel formation region of a transistor, so that the transistor can have stable electrical characteristics.

This embodiment can be combined with the other embodiments as appropriate.

Embodiment 5

In this embodiment, electronic devices of embodiments of the present invention will be described with reference to FIGS. 14A and 14B, FIGS. 15A and 15B, FIGS. 16A and 16B, FIGS. 17A to 17D, and FIGS. 18A to 18F.

Electronic devices of this embodiment are each provided with a display device of one embodiment of the present invention in a display portion. A display device of one embodiment of the present invention has high display quality and low power consumption. In addition, the display device of one embodiment of the present invention can be easily increased in resolution and size. Thus, the display device of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, a display device of one embodiment of the present invention can have a high resolution, and thus can be favorably used for an electronic device having a relatively small display portion. The display device can be favorably used for, for example, an electronic device include a watch-type or bracelet-type information terminal device (wearable device) and a wearable device worn on a head, such as a VR device such as a head mounted display, a glasses-type AR device, and an MR device.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 14A:
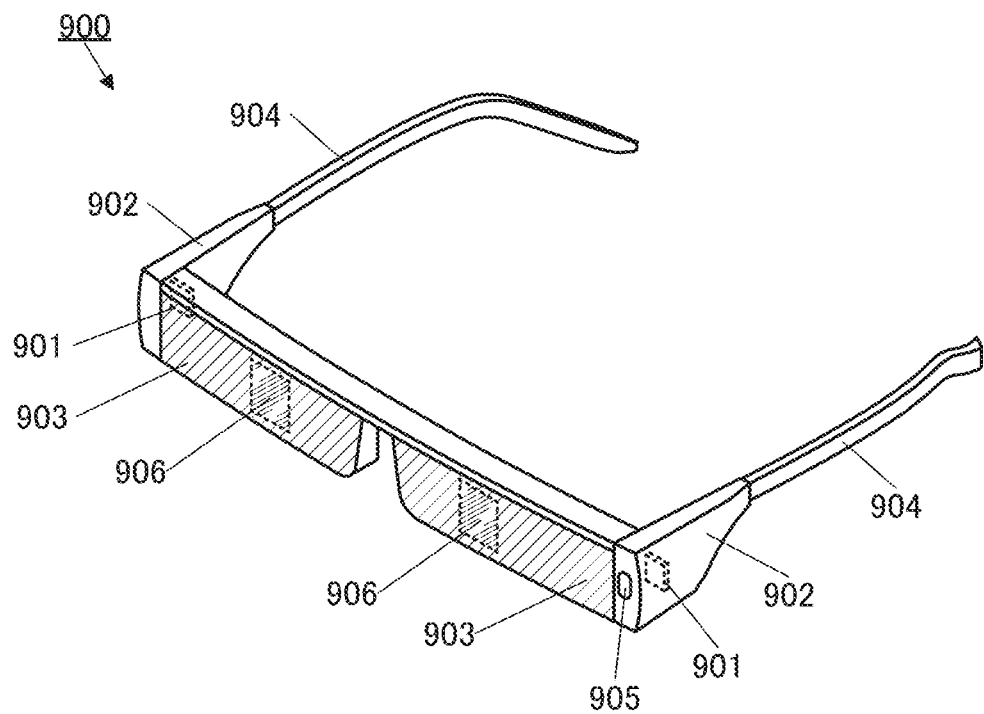
FIGS. 14A and 14B show an example of an electronic device.

FIG. 14A is a perspective view of a glasses-type electronic device 900. The electronic device 900 includes a pair of display panels 901, a pair of housings 902, a pair of optical members 903, a pair of temples 904, and the like.

The electronic device 900 can project an image displayed on the display panel 901 onto a display region 906 of the optical member 903. Since the optical members 903 have a light-transmitting property, a user can see images displayed on the display regions 906, which are superimposed on transmission images seen through the optical members 903. Thus, the electronic device 900 is an electronic device capable of AR display.

The display panel 901 included in the electronic device 900 preferably has a function of taking an image in addition to a function of displaying an image. In that case, the electronic device 900 can receive light incident on the display panel 901 through the optical member 903, convert the light into an electric signal, and output the electric signal. Therefore, an image of the user's eye or the user's eye and the vicinity thereof can be taken and the image can be output to the outside or an arithmetic portion included in the electronic device 900 as image information.

The housings 902 each include a camera 905 capable of taking an image of what lies in front thereof. Although not illustrated, one of the housings 902 is provided with a wireless receiver or a connector to which a cable can be connected, whereby a video signal or the like can be supplied to the housing 902. Furthermore, when the housing 902 is provided with an acceleration sensor such as a gyroscope sensor, the orientation of the user's head can be detected and an image corresponding to the orientation can be displayed on the display region 906. Moreover, the housing 902 is preferably provided with a battery capable of being charged with or without a wire.

Next, a method for projecting an image on the display region 906 of the electronic device 900 is described with reference to FIG. 14B. The display panel 901, a lens 911, and a reflective plate 912 are provided in the housing 902. A reflective surface 913 functioning as a half mirror is provided as a portion corresponding to the display region 906 of the optical member 903.

Light 915 emitted from the display panel 901 passes through the lens 911 and is reflected by the reflective plate 912 toward the optical member 903. In the optical member 903, the light 915 is fully reflected repeatedly by surfaces of an edge portion of the optical member 903 and reaches the reflective surface 913, whereby an image is projected on the reflective surface 913. Accordingly, the user can see both the light 915 reflected by the reflective surface 913 and transmitted light 916 that passes through the optical member 903 (including the reflective surface 913).

Figure 14B:
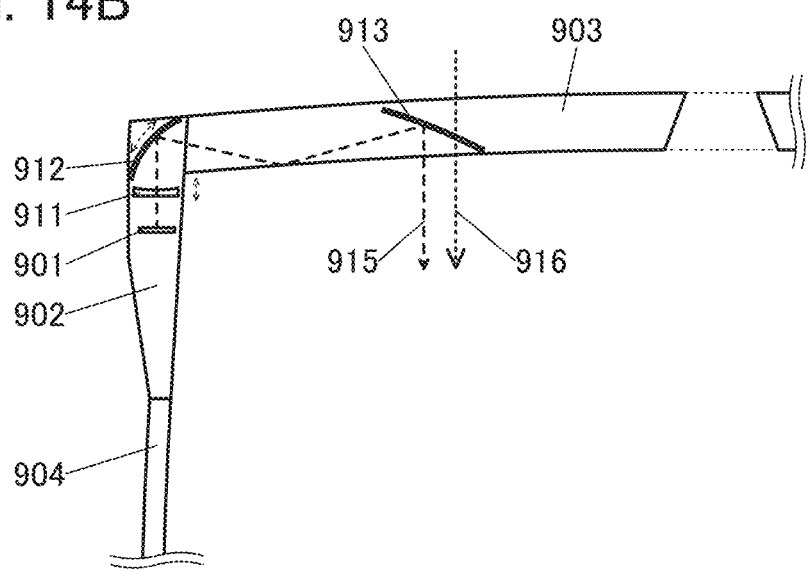

FIGS. 14A and 14B show an example in which the reflective plate 912 and the reflective surface 913 each have a curved surface. This structure can increase optical design flexibility and reduce the thickness of the optical member 903, compared to the case where the reflective plate 912 and the reflective surface 913 are flat. Note that the reflective plate 912 and the reflective surface 913 may be flat.

The reflective plate 912 can be a component having a mirror surface and preferably has high reflectivity. As the reflective surface 913, a half mirror utilizing reflection of a metal film may be used, but the use of a total-reflection prism or the like can increase the transmittance of the transmitted light 916.

Here, the electronic device 900 preferably includes a mechanism for adjusting the distance and angle between the lens 911 and the display panel 901, in which case the focus can be adjusted and images can be zoomed in and out, for example. At least one of the lens 911 and the display panel 901 is preferably configured to be movable in the optical-axis direction, for example.

The electronic device 900 preferably includes a mechanism capable of adjusting the angle of the reflective plate 912. The position of the display region 906 where images are displayed can be changed by changing the angle of the reflective plate 912. Thus, the display region 906 can be placed at the most appropriate position in accordance with the position of the user's eye.

The display device of one embodiment of the present invention can be used for the display panel 901. Thus, the electronic device 900 capable of extremely-high-resolution display can be provided.

Figure 15A:
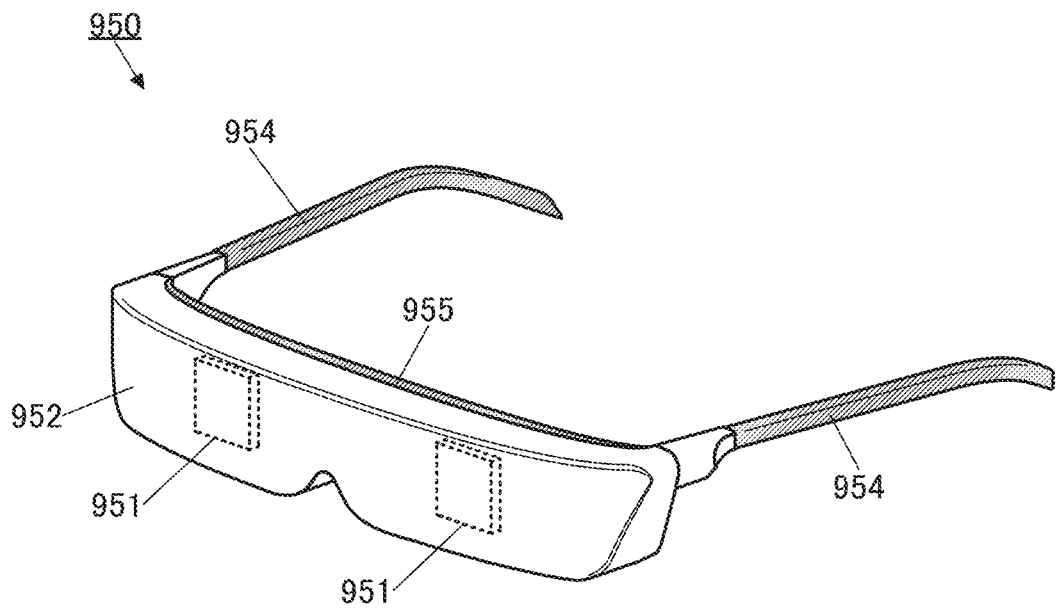
FIGS. 15A and 15B show an example of an electronic device.
Figure 15B:
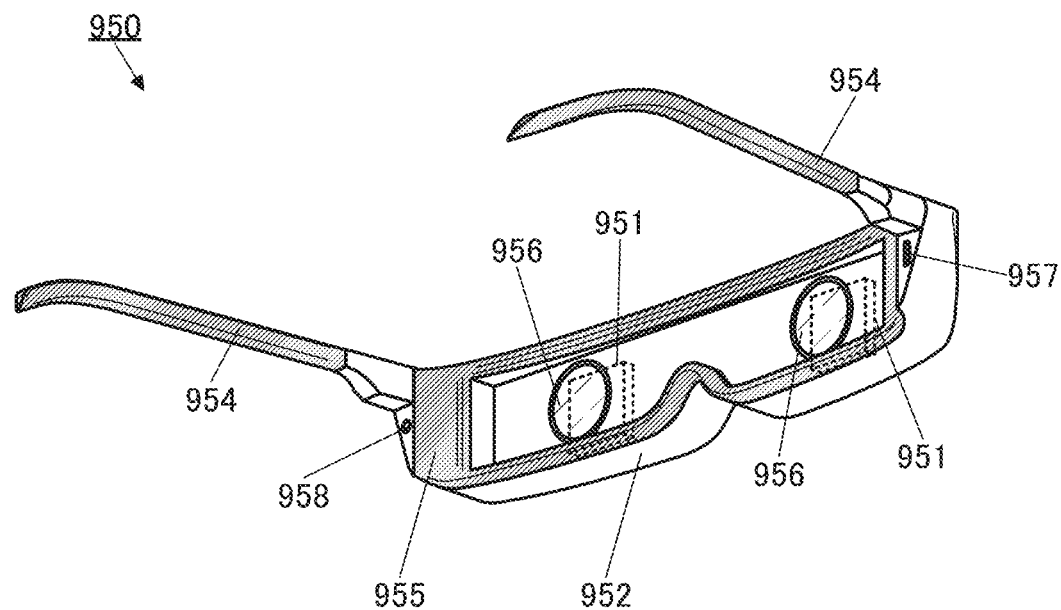

FIGS. 15A and 15B are perspective views of a goggle-type electronic device 950. FIG. 15A is a perspective view illustrating the front surface, the top surface, and the left side surface of the electronic device 950, and FIG. 15B is a perspective view illustrating the back surface, the bottom surface, and the right side surface of the electronic device 950.

The electronic device 950 includes a pair of display panels 951, a housing 952, a pair of temples 954, a cushion 955, a pair of lenses 956, and the like. The pair of display panels 951 is positioned to be seen through the lenses 956 inside the housing 952.

The electronic device 950 is a VR electronic device. A user wearing the electronic device 950 can see an image displayed on the display panel 951 through the lens 956. Furthermore, the pair of display panels 951 may display different images, whereby three-dimensional display using parallax can be performed.

An input terminal 957 and an output terminal 958 are provided on the back side of the housing 952. To the input terminal 957, a cable for supplying a video signal from a video output device or the like, power for charging a battery provided in the housing 952, or the like can be connected. The output terminal 958 can function as, for example, an audio output terminal to which earphones, headphones, or the like can be connected. Note that in the case where audio data can be output by wireless communication or sound is output from an external video output device, the audio output terminal is not necessarily provided.

The electronic device 950 preferably includes a mechanism by which the left and right positions of the lens 956 and the display panel 951 can be adjusted to the optimal positions in accordance with the position of the user's eye. In addition, the electronic device 950 preferably includes a mechanism for adjusting the focal point by changing the distance between the lens 956 and the display panel 951.

The display device of one embodiment of the present invention can be used for the display panel 951. Thus, the electronic device 950 capable of extremely-high-resolution display can be provided. As a result, a user can obtain a high sense of immersion.

The cushion 955 is in contact with the user's face (forehead, cheek, or the like). The cushion 955 is in close contact with the user's face, so that light leakage can be prevented, which increases the sense of immersion. It is preferable that a soft material be used for the cushion 955 so that the cushion 955 is in close contact with the face of the user wearing the electronic device 950. For example, a material such as silicone rubber, urethane, or sponge can be used.

Furthermore, when a sponge or the like whose surface is covered with cloth, leather (natural leather or synthetic leather), or the like is used as the cushion 955, a gap is less likely to be generated between the user's face and the cushion 955, whereby light leakage can be suitably prevented. The member in contact with user's skin, such as the cushion 955 or the temple 954, is preferably detachable, in which case cleaning or replacement can be easily performed.

Figure 16A:
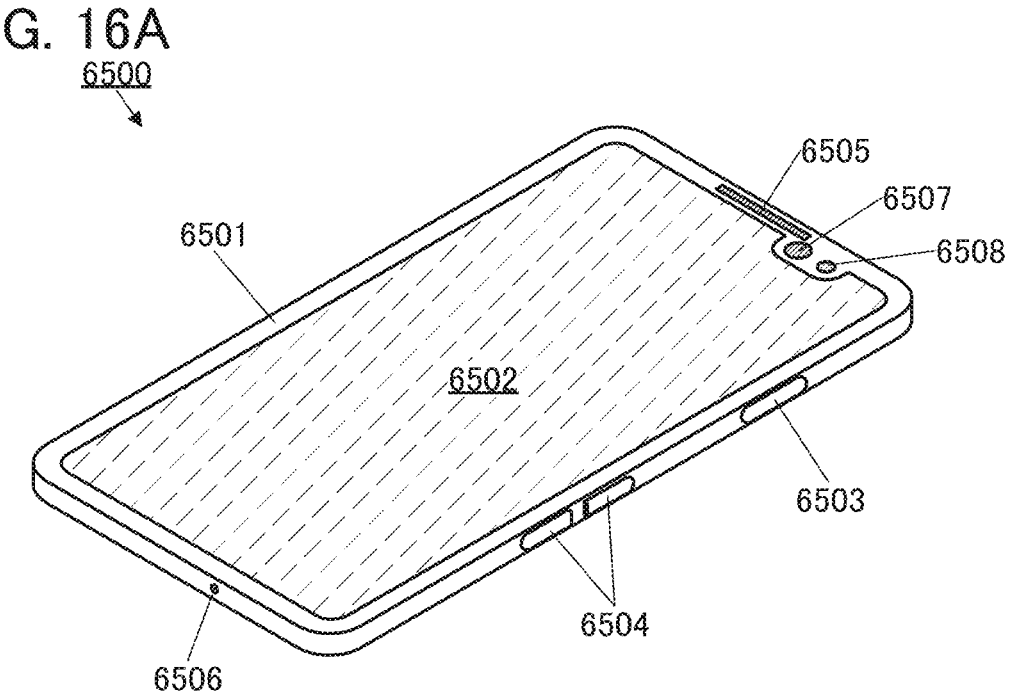
FIGS. 16A and 16B show an example of an electronic device.

An electronic device 6500 illustrated in FIG. 16A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display portion 6502 can use a display device of one embodiment of the present invention.

Figure 16B:
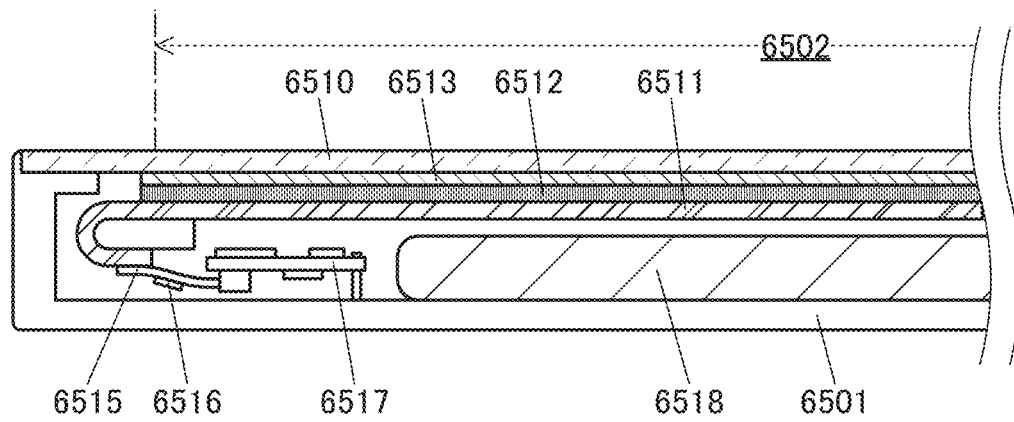

FIG. 16B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not shown).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 17A:
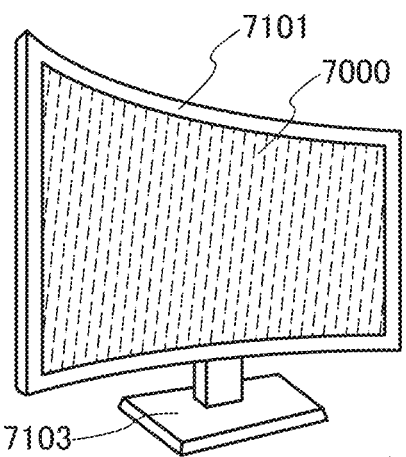
FIGS. 17A to 17D each show an example of an electronic device.

FIG. 17A shows an example of a television device. In a television device 7100, a display portion 7000 is incorporated in a housing 7101. Here, a structure in which the housing 7101 is supported by a stand 7103 is illustrated.

The display portion 7000 can use a display device of one embodiment of the present invention.

Operation of the television device 7100 illustrated in FIG. 17A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 17B:
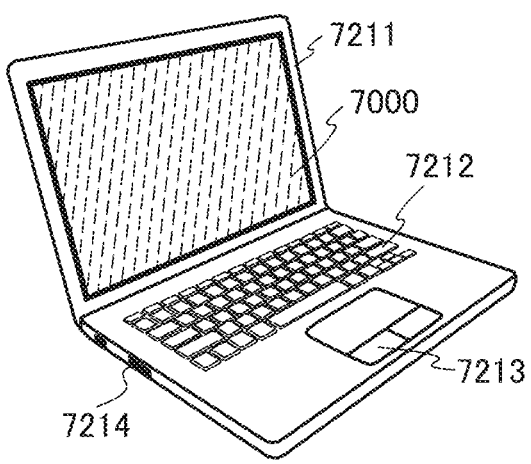

FIG. 17B shows an example of a laptop personal computer. A laptop personal computer 7200 includes a housing 7211, a keyboard 7212, a pointing device 7213, an external connection port 7214, and the like. In the housing 7211, the display portion 7000 is incorporated.

The display portion 7000 can use a display device of one embodiment of the present invention.

Figure 17C:
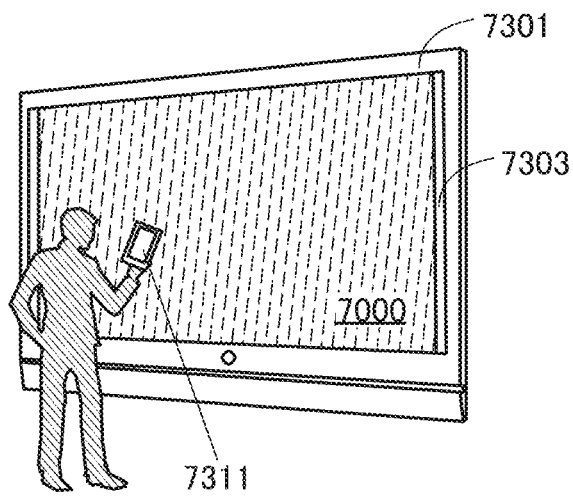
Figure 17D:
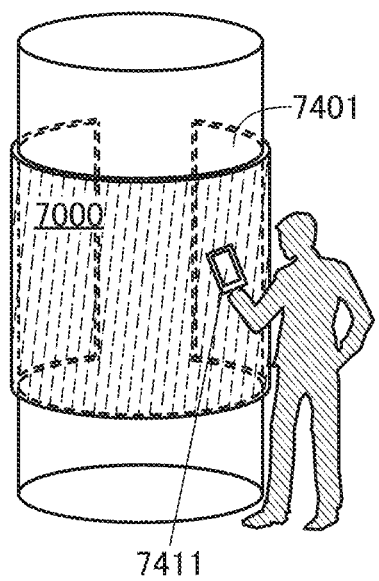

FIGS. 17C and 17D show examples of digital signage.

Digital signage 7300 illustrated in FIG. 17C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 17D is digital signage 7400 attached to a cylindrical pillar 7401. The digital signage 7400 includes the display portion 7000 provided along a curved surface of the pillar 7401.

In FIGS. 17C and 17D, the display portion 7000 can use a display device of one embodiment of the present invention.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 17C and 17D, it is preferable that the digital signage 7300 or the digital signage 7400 can work with an information terminal 7311 or an information terminal 7411 such as a smartphone that a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices shown in FIGS. 18A to 18F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices shown in FIGS. 18A to 18F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices shown in FIGS. 18A to 18F will be described below.

Figure 18A:
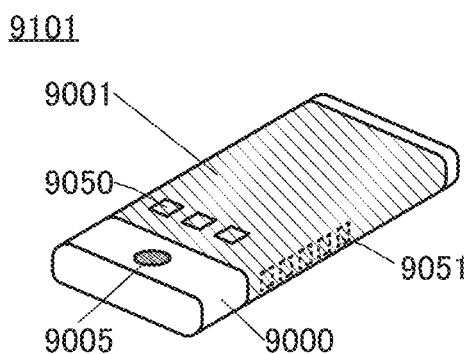
FIGS. 18A to 18F show examples of electronic devices.

FIG. 18A is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 18A shows an example in which three icons 9050 are displayed. Information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed in the position where the information 9051 is displayed.

Figure 18B:
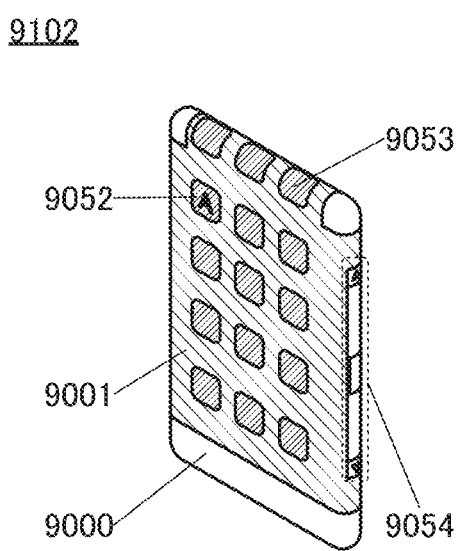

FIG. 18B is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 18C:
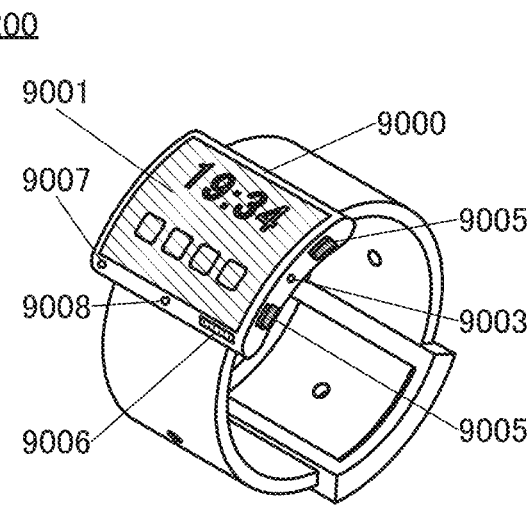

FIG. 18C is a perspective view showing a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 18D:
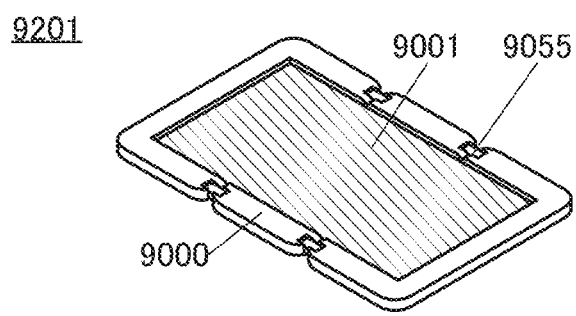
Figure 18E:
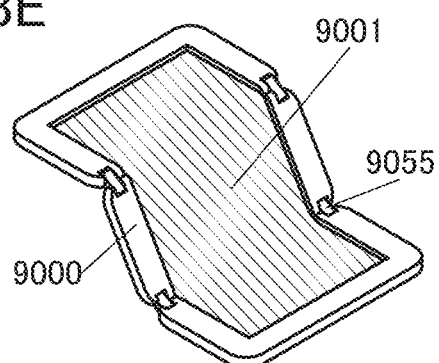
Figure 18F:
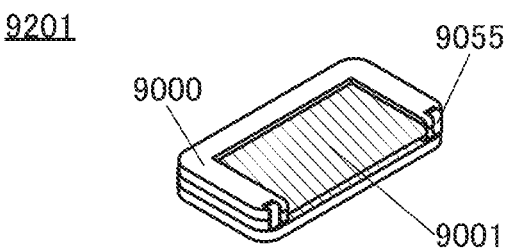

FIGS. 18D, 18E, and 18F are perspective views showing a foldable portable information terminal 9201. FIG. 18D is a perspective view of an opened state of the portable information terminal 9201, FIG. 18F is a perspective view of a folded state thereof, and FIG. 18E is a perspective view of a state in the middle of change from one of FIG. 18D and FIG. 18F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 0.1 mm and less than or equal to 150 mm.

This embodiment can be combined with the other embodiments as appropriate.

This application is based on Japanese Patent Application Serial No. 2019-115298 filed with Japan Patent Office on Jun. 21, 2019, the entire contents of which are hereby incorporated by reference.

What is claimed is:

1. A display device comprising:
a first transistor;
a second transistor;
a first light-emitting diode comprising a first semiconductor layer over the first transistor, the first light-emitting diode electrically connected to the first transistor;
a second light-emitting diode comprising a second semiconductor layer over the second transistor, the second light-emitting diode electrically connected to the second transistor;
an insulating layer over and in contact with the first semiconductor layer and the second semiconductor layer;
a light-blocking layer over the insulating layer; and
a color conversion layer over the insulating layer and one of the first light-emitting diode and the second light-emitting diode,
wherein the color conversion layer is in contact with a side surface and a top surface of the light-blocking layer.

2. The display device according to claim 1,
wherein the first transistor and the first light-emitting diode overlap with each other, and
wherein the second transistor, the second light-emitting diode, and the color conversion layer overlap with each other.

3. The display device according to claim 1,
wherein each of the first transistor and the second transistor comprises a metal oxide layer in a channel formation region.

4. The display device according to claim 1,
wherein each of the first light-emitting diode and the second light-emitting diode is configured to emit blue light.

5. The display device according to claim 1,
wherein each of the first light-emitting diode and the second light-emitting diode is a micro light-emitting diode.

6. The display device according to claim 1, wherein the light-blocking layer and the color conversion layer are over and in contact with the insulating layer.

7. The display device according to claim 1, further comprising a coloring layer overlapping with the other of the first light-emitting diode and the second light-emitting diode,
wherein the coloring layer does not overlap with the one of the first light-emitting diode and the second light-emitting diode.

8. A display device comprising:
a first transistor;
a second transistor;

a first light-emitting diode comprising a first semiconductor layer over the first transistor, the first light-emitting diode electrically connected to the first transistor;

a second light-emitting diode comprising a second semiconductor layer over the second transistor, the second light-emitting diode electrically connected to the second transistor;

an insulating layer over and in contact with the first semiconductor layer and the second semiconductor layer;

a light-blocking layer over the insulating layer; and a color conversion layer over the insulating layer and one of the first light-emitting diode and the second light-emitting diode.

9. The display device according to claim 8, wherein the first transistor and the first light-emitting diode overlap with each other, and wherein the second transistor, the second light-emitting diode, and the color conversion layer overlap with each other.

10. The display device according to claim 8, wherein the light-blocking layer and the color conversion layer are over and in contact with the insulating layer.

11. The display device according to claim 8, further comprising a coloring layer overlapping with the other of the first light-emitting diode and the second light-emitting diode, wherein the coloring layer does not overlap with the one of the first light-emitting diode and the second light-emitting diode.

* * * * *